United States Patent
Haeberli et al.

(10) Patent No.: US 6,760,262 B2
(45) Date of Patent: Jul. 6, 2004

(54) CHARGE PUMP CIRCUIT ADJUSTABLE IN RESPONSE TO AN EXTERNAL VOLTAGE SOURCE

(75) Inventors: Andreas M. Haeberli, Campbell, CA (US); Sau C. Wong, Hillsborough, CA (US); Hock C. So, Redwood City, CA (US); Carl W. Werner, San Jose, CA (US); Cheng-Yuan Michael Wang, San Jose, CA (US); Leon Sea Jiunn Wong, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/382,333

(22) Filed: Mar. 4, 2003

(65) Prior Publication Data

US 2003/0161171 A1 Aug. 28, 2003

Related U.S. Application Data

(63) Continuation of application No. 10/109,353, filed on Mar. 27, 2002, now Pat. No. 6,556,465, which is a continuation of application No. 09/343,206, filed on Jun. 29, 1999, now Pat. No. 6,370,075.
(60) Provisional application No. 60/116,760, filed on Jan. 22, 1999, and provisional application No. 60/091,326, filed on Jun. 30, 1998.

(51) Int. Cl.[7] .............................................. G11C 7/00
(52) U.S. Cl. .................... 365/189.09; 365/189.07; 365/226; 327/536
(58) Field of Search ................. 365/189.09, 189.07, 365/189.11, 226, 230.06; 327/536, 537, 540, 140

(56) References Cited

U.S. PATENT DOCUMENTS

| 4,271,488 A | 6/1981 | Saxe |
| 4,742,549 A | 5/1988 | Roschier |
| 4,952,821 A | 8/1990 | Kokubun |
| 5,008,799 A | 4/1991 | Montalvo |
| 5,036,229 A | 7/1991 | Tran |
| 5,059,815 A | 10/1991 | Bill et al. |
| 5,103,191 A | 4/1992 | Werker |

(List continued on next page.)

FOREIGN PATENT DOCUMENTS

| EP | 0633576 A2 | 1/1995 |
| EP | 0756220 A1 | 1/1997 |
| EP | 0860945 A2 | 8/1998 |
| EP | 0902525 A2 | 3/1999 |
| WO | WO 96/26523 | 8/1996 |
| WO | WO 97/05620 | 2/1997 |

OTHER PUBLICATIONS

Ogden, Frank, (Nov. 1993) "Charge Pumped OP–AMP Supplies the Missing Rail," *Electronics World*, pp. 902–903.
Rabl, H., (1989) Ladungspumpe fur SIMPOS—Transistoren (trans: The Charge Pump for SIMPOS Transistors), *Elektronik Industrie* 20(6):36–41—English language Abstract provided.

(List continued on next page.)

*Primary Examiner*—Gene Auduong
(74) *Attorney, Agent, or Firm*—Parsons Hsue & de Runtz LLP

(57) ABSTRACT

An integrated circuit detects the voltage level of the supply voltage to the integrated circuit. Circuitry on the integrated circuit including the charge pump circuity adjusts to operate more effectively or efficiently at the voltage level of the supply voltage.

10 Claims, 47 Drawing Sheets

U.S. PATENT DOCUMENTS

| | | | |
|---|---|---|---|
| 5,220,531 A | | 6/1993 | Blyth et al. |
| 5,241,494 A | * | 8/1993 | Blyth et al. ............ 365/185.03 |
| 5,301,097 A | | 4/1994 | McDaniel |
| 5,363,333 A | | 11/1994 | Tsujimoto |
| 5,388,064 A | | 2/1995 | Khan |
| 5,483,486 A | * | 1/1996 | Javanifard et al. ...... 365/185.17 |
| 5,493,249 A | | 2/1996 | Manning |
| 5,602,794 A | | 2/1997 | Javanifard et al. |
| 5,623,436 A | | 4/1997 | Sowards et al. |
| 5,629,646 A | * | 5/1997 | Menezes et al. ............ 327/536 |
| 5,629,890 A | | 5/1997 | Engh |
| 5,638,320 A | | 6/1997 | Wong et al. |
| 5,680,341 A | | 10/1997 | Wong et al. |
| 5,687,115 A | | 11/1997 | Wong et al. |
| 5,689,201 A | | 11/1997 | Temes et al. |
| 5,694,356 A | | 12/1997 | Wong et al. |
| 5,699,312 A | | 12/1997 | Wong |
| 5,732,039 A | | 3/1998 | Javanifard et al. |
| 5,745,409 A | | 4/1998 | Wong et al. |
| 5,748,533 A | | 5/1998 | Dunlap et al. |
| 5,748,534 A | | 5/1998 | Dunlap et al. |
| 5,767,735 A | | 6/1998 | Javanifard et al. |
| 5,781,473 A | | 7/1998 | Javanifard et al. |
| 5,790,469 A | | 8/1998 | Wong |
| 5,796,293 A | | 8/1998 | Yoon et al. |
| 5,801,980 A | | 9/1998 | Wong et al. |
| 5,801,987 A | | 9/1998 | Dinh |
| 5,818,757 A | | 10/1998 | So et al. |
| 5,828,592 A | | 10/1998 | Tran et al. |
| 5,828,596 A | | 10/1998 | Takata et al. |
| 5,864,247 A | * | 1/1999 | Hirano et al. ................ 327/143 |
| 5,977,803 A | | 11/1999 | Tsugai |
| 5,999,040 A | | 12/1999 | Do et al. |
| 6,031,399 A | | 2/2000 | Vu et al. |
| 6,184,726 B1 | | 2/2001 | Haeberli et al. |
| 6,185,119 B1 | | 2/2001 | Haeberli et al. |
| 6,208,542 B1 | * | 3/2001 | Wang et al. .................. 365/45 |
| 6,320,428 B1 | * | 11/2001 | Atsumi et al. ................ 327/78 |
| 6,370,075 B1 | * | 4/2002 | Haeberli et al. ............ 365/226 |

OTHER PUBLICATIONS

Takahashi, K., (1997) "Complementary Charge Pump Voltage Booster," Transactions of the Institute of Electronics, Information and Communication Engineers C–II J80C–11(8):253–260—English language Abstract provided.

User's Manual "ISD–T266SA CompactSPEECH™ Digital Speech Processor with Serial Flash Interface," ISD, San Jose, CA, Jul. 1997, 88 pages.

Data Sheet "IVS1530," Invox Technology, Campbell, CA, Oct. 1997, 8 pages.

Data Sheet "IVSI560," Invox Technology, Campbell, CA, Feb. 1998, 14 pages.

Data Sheet "ISD1520," San Jose, CA, Apr. 1998, 18 pages.

Data Sheet "ISD33060/075/090/120–4 Products," ISD, San Jose, CA, Apr. 1998, 31 pages.

Data Sheet "ISD4003 Series," ISD, San Jose, CA, Apr. 1998, 27 pages.

Data Sheet "ISD4004 Series," ISD, San Jose, CA, Sep. 1998, 28 pages.

Advanced Information "ISD5008," ISD, San Jose, CA, Nov. 1998, 2 pages.

Press Release "ISD Announces the Only Fully–Integrated Voice Storage Microchip Designed for Every Digital Cellular Handset," ISD, San Jose, CA, Nov. 16, 1998, 2 pages.

Haeberli et al., "Compensation and Calibration of IC Microsensors," Thesis submitted to Swiss Federal Institute of Technology, Zurich, 1997, DISS. ETH No. 12090, title page, copyright page, and pp. 48–51, 54–55.

* cited by examiner

CHARGE PUMP CIRCUIT ADJUSTABLE IN RESPONSE TO AN EXTERNAL VOLTAGE SOURCE

CROSS-REFERENCE TO RELATED APPLICATIONS

This is a continuation of U.S. patent application Ser. No. 10/109,353, filed Mar. 27, 2002, now U.S. Pat. No. 6,556,465, which is a continuation of U.S. patent application Ser. No. 09/343,206, filed Jun. 29, 1999, now U.S. Pat. No. 6,370,075, and claims the benefit of U.S. provisional application No. 60/091,326, filed Jun. 30, 1998, and U.S. provisional application No. 60/116,760, filed Jan. 22, 1999, all of which are hereby incorporated by reference.

BACKGROUND OF THE INVENTION

The present invention relates to the field of information storage and retrieval using integrated circuit technology. More specifically, the present invention relates to techniques for storing (and retrieving) analog or digital data, or both, within an integrated circuit using multilevel nonvolatile cells.

Among the most important and pioneering innovations in history are devices, techniques, and mediums that have been devised to record and playback sights, sounds, actions, and other information. Many of these innovations have led to the rise and growth of the media and entertainment industries, and also the personal and consumer electronics industries.

For example, among the most notable inventions are Thomas Alva Edison's phonograph and record with which Edison recorded and played his first recording "Mary Had a Little Lamb." Other achievements in this field are the audio tape recorder, cassette tape recorder, motion picture, talking motion picture ("talkies"), video cassette recorder (VCR), compact disc (CD and CD-ROM), video disc, digital video disc (DVD), and many, many more of such innovations. In the present day, full-length motion pictures with stereo sound may be contained on a single optical disk.

Although these technologies have met with substantial success, there is a continuing desire to improve on the techniques, devices, mediums used to record information. For example, there is a need to provide techniques that provide dense storage of information. Denser storage facilitates storing information in a compact area, and provides a relatively long recording time.

There is a need to provide reliable and robust techniques. The stored reproduction should be a faithful reproduction of the original information. Despite repeated use, the stored reproduction should retain its original form, and also not degrade over time. Furthermore, the techniques should be compatible with and interface easily with present and emerging technologies in electronics and with devices facilitating electronic commerce (such as the Internet and World Wide Web).

Integrated circuit technology has been used to implement many electronic devices including computers, video recorders, digital cameras, microprocessors, DRAMs, SRAMs, Flash memory, and many others. As integrated technology continues to improve, it becomes practical to use this technology to record and playback sights, sounds, actions, and other information.

Data has typically been stored within integrated circuits using a digital or binary format. For applications where the input is analog, however, this requires conversion of signals to digital format, generally by an analog-to-digital (A/D) converter or similar means. And playback of analog signal from a digital storage format may require a digital-to-analog (D/A) converter or similar means. As can be appreciated, these conversions add complexity and extra expense to the entire procedure. Further, a conversion of the signal to digital form quantizes the signal and will lead to quantization noise in the reproduced signal.

Information such as sounds and voices, stereo and multichannel sounds, pictures, video, and others requires many bits of data storage. Storage of data in digital format may be inefficient because one bit (i.e., two different levels) of data is stored in a single memory cell. Further, it may be desirable to store an input signal using a sampling rate the user selects.

Therefore, techniques are needed for compactly storing (and retrieving) analog and digital information including sights, sounds, and actions using integrated circuit technology.

SUMMARY OF THE INVENTION

The present invention provides techniques for storing and retrieving analog or digital information from memory cells. In a specific embodiment, the memory cells are nonvolatile cells capable of analog or multilevel storage. Analog data and analog voltage levels are stored in the cells directly without the need for a conversion to digital form. Analog data is stored by altering a threshold voltage (VT) level of a memory cell to have a unique value representative of the analog data. A memory cell can also be used to store digital data. One or more digital bits can be stored in a single memory cell using a scheme consistent with the analog data storage.

Various different voltage levels are used to configure the memory cells. These voltage levels include high voltages, some of which may be at a level above the highest supply voltage for the integrated circuit. Some of these programming voltages are generated by a charge pump. These voltages are also shifted to a desired voltage level as needed to configure the memory cell to have a particular stored VT representative of the input data. The precision with which these programming voltages is obtained is important. Precise programming voltages are needed to ensure the memory cells are properly written, enhance the reliability and service life of the memory cells, and improve the yield of good die.

Changes in supply voltage or other parameters may affect the programming circuits and the voltage levels that are generated. In an embodiment of the present invention, the integrated circuit detects the voltage level of the supply voltage to the integrated circuit. Circuity on the integrated circuit such as the charge pump circuity adjusts to operate more effectively or efficiently at the voltage level of the supply voltage.

In an embodiment, a technique of the present invention includes detecting an external voltage to the integrated circuit to determine whether the external voltage is above or below a threshold value. When the external voltage is below the threshold value, a programming voltage is generated using a first number of charge pump stages. When the external voltage is above the threshold value, the programming voltage is generated using a second number of charge pump stages, where the second number of charge pump stages is less than the first number of charge pump stages.

In another embodiment, a technique of the present invention includes detecting an external voltage to the integrated circuit to determine whether the external voltage is above or below a first threshold level and above or below a second threshold level, where the second threshold level is above the first threshold level. When the external voltage is below the first threshold level, a programming voltage is generated using a first number of charge pump stages. When the external voltage is above the first threshold level and below the second threshold level, the programming voltage is generated using a second number of charge pump stages. When the external voltage is above the second threshold level, the programming voltage is generated using a third number of charge pump stages, where the first number of charge pump stages is greater than the second number of charge pump stages, and the second number of charge pump stages is greater than the third number of charge pump stages.

The present invention includes an integrated circuit with a first voltage detect circuit of a first threshold level, a second voltage detect circuit of a second threshold level, and a third voltage detect circuit of a third threshold level. A logic circuit, connected to outputs of the first, second, and third voltage detect circuits, generates a number of enable outputs. A charge pump circuit includes a number of stages, and based on the enable outputs, a number of stages of the charge pump are enabled.

In a specific embodiment, a voltage detect circuit includes a first transistor connected between a first voltage detect output node and first terminals of a first and a second capacitor. A control electrode of the first transistor is connected to a clock signal. A second transistor is connected between the first voltage detect output node and the first terminals of the first and second capacitors. A control electrode of the second transistor is connected to the clock signal. A first switch circuit connected between an external voltage input and a second terminal of the first capacitor. A second switch circuit is connected between a reference voltage input and a second terminal of the second capacitor.

Other objects, features, and advantages of the present invention will become apparent upon consideration of the following detailed description and the accompanying drawings, in which like reference designations represent like features throughout the figures.

DETAILED DESCRIPTION

Figure 1:
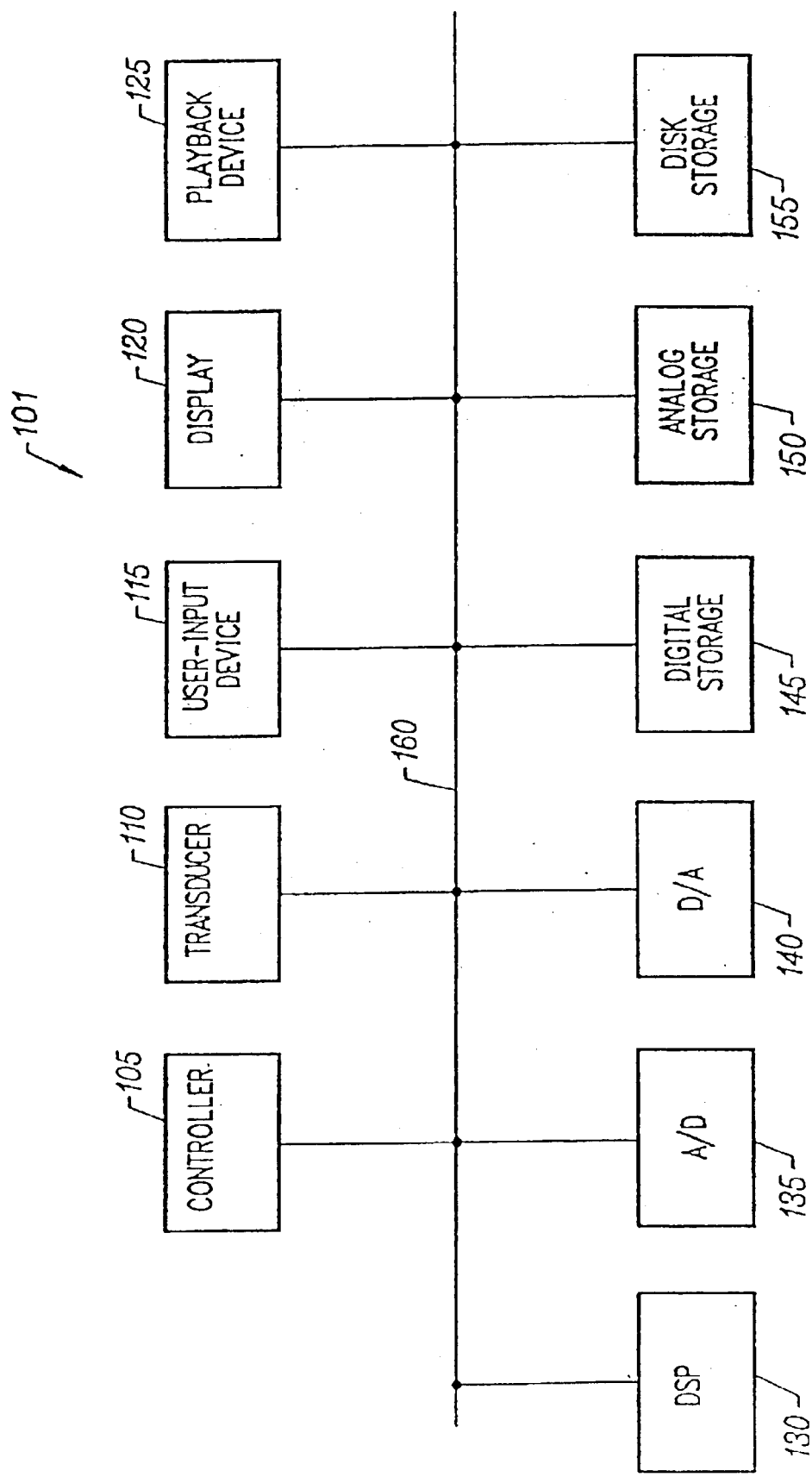
FIG. 1 shows an electronic system in which techniques according to the present invention may be used.

FIG. 1 shows an electronic system in which techniques according to the present invention may be used. An integrated circuit according to the present invention may be used in many market segments including, to name a few, the communications market, medical market, consumer market, and industrial market. Some applications of such devices include cellular phones, telephone answer machines, mobile radios, telephone announcement systems, pagers and voice pagers, medical monitoring equipment, cash registers, bar code readers, vending machines, security systems, instrumentations, automobiles, interactive media, cameras, calculators, pocket recorders, recordable postcards and greeting cards, toys and games, watches and clocks, consumer recording media, video players and recorders, imaging, personal digital assistants (PDAs), palm-sized PC, desktop and notebook computers, portable electronic commerce devices, internet appliances, electronic information storage media, and many other applications.

Figure 2:
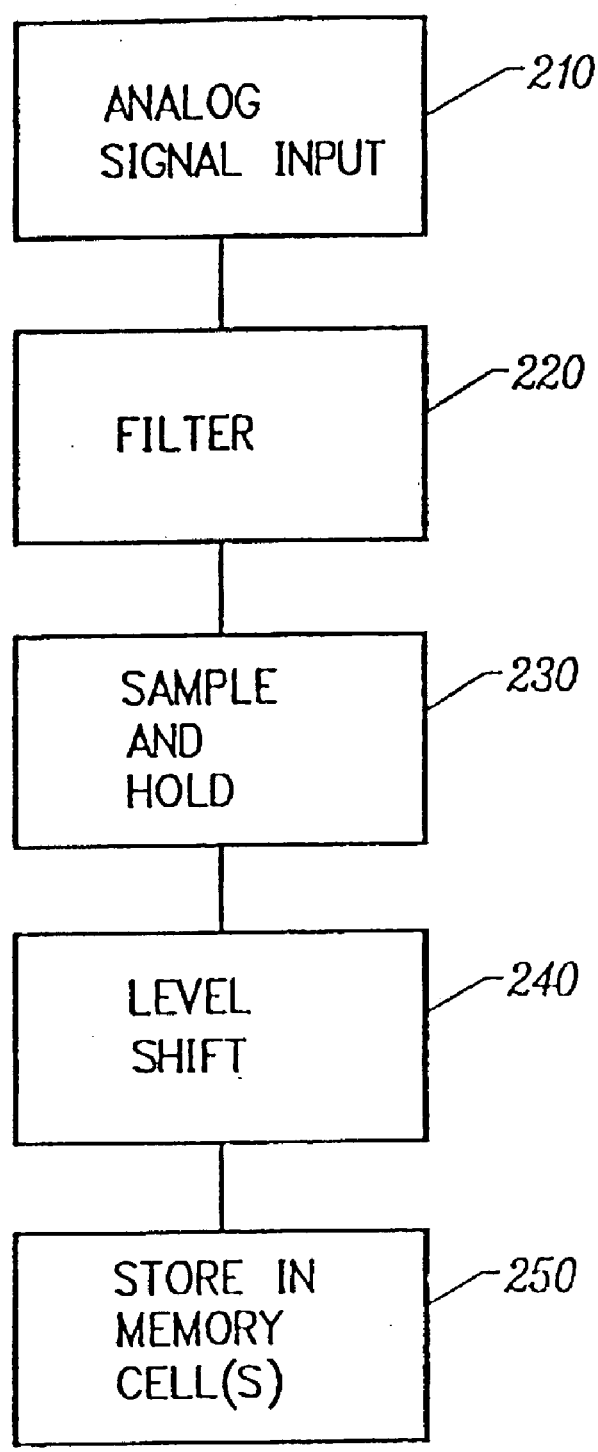
FIG. 2 shows an overall flow diagram of a technique for storing or "recording" an analog signal input into a memory cell.

FIG. 2 shows an overall flow diagram of a technique for storing or "recording" an analog signal input into a memory cell. An analog signal input 210 is provided. This analog signal may be amplified or otherwise processed, if desired or needed. In step 220, the signal is filtered using a low pass or bandpass filter to filter out or eliminate components of the signal which are not of interest. This can help prevent aliasing. Multiple stages of filtering can be used.

In step 230, the signal is sampled. Sampling the signal breaks the signal into a series of discrete analog values or samples. In order to prevent aliasing, the signal should be sampled at a rate sufficient to prevent aliasing errors. According to Nyquist's Sampling Theorem, the signal should be sampled at a rate at least twice the highest frequency component of the signal output from the filter to allow for a faithful reproduction of the original signal. Further, it is desirable to sample the signal at a much higher rate in order to obtain better bandwidth, and hence, a better quality reproduction.

A sampled data point is "held" for sufficient time to process this data point. The sampled data point may also be held while determining the next sampled data point. In a step 240 for each sampled data point, the analog value is level shifted into a voltage range suitable to facilitate storage of the information in a memory cell. For example, an analog input in the range from about 0 volts to about 2.5 volts may be shifted to a range from about 3 volts to about 5.5 volts.

In a step 250, the sampled data point is stored into a memory cell.

Figure 3:
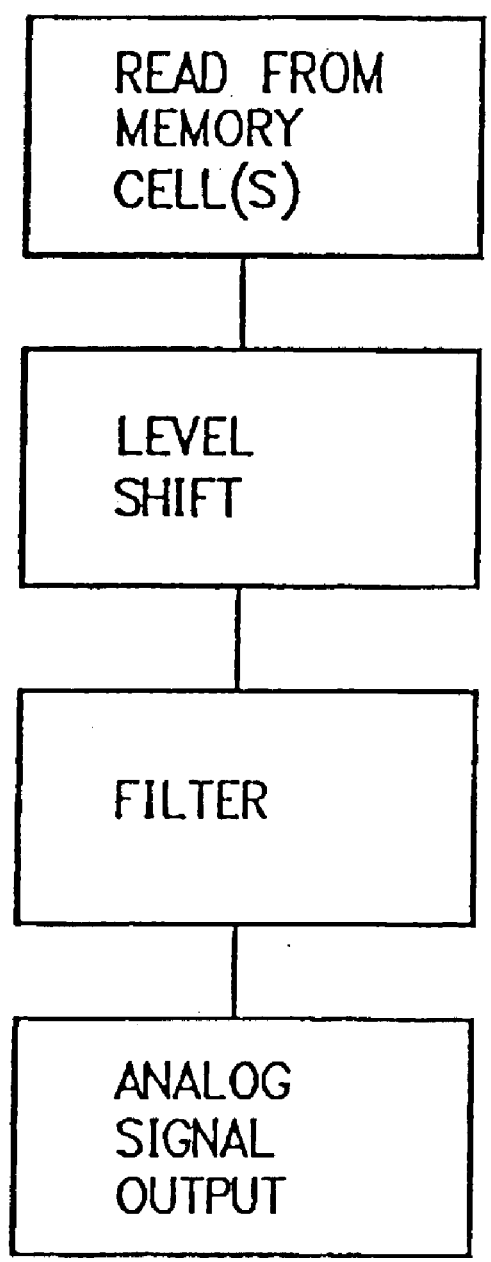
FIG. 3 shows a flow diagram of a technique for reproducing or "playing back" an analog signal stored in a memory cell.

FIG. 3 shows a flow diagram of a technique for reproducing or "playing back" an analog signal stored in a memory cell. The playback process is essentially an inverse of the recording process. There may also be amplification or other processing of the output signal.

FIG. 4A shows a diagram of an overall block diagram of an integrated circuit 400 of the present invention. This integrated circuit stores information in the analog or multilevel memory cells of the integrated circuit. The information may be provided in analog or digital form. An analog signal 402 to be stored is differentially input at ANAIN+ and ANAIN− inputs. Other embodiments may have a single-ended input instead of a differential input. A differential input provides greater accuracy when recording the signal. The input signal is amplified using a preamplifier 405. For example, in one implementation, the preamplifier has a gain of about 25 decibels. The gain can be user-selected so the user can match the preamplification needed or desired for a particular input signal.

An output 408 of preamplifier 405 is also fully differential. A single-ended output can also be provided in addition or instead of the differential output. Output 408 is passed to a low pass filter 411. Low pass filter 411 can be implemented using a sampled data filter, where the output of filter 411 will be the samples of the input signal.

Using a write circuit 414, each sampled data point is stored in a memory cell 412. Memory cells such as DRAM, SRAM, EEPROM, EPROM, and Flash cells typically only store or can represent two possible logic levels. In a digital system, these levels would represent a logic low or a logic high. To store a sampled data point in a digital memory cell, the sampled data point is converted into a binary or digital representation. For example, if the sampled data point were converted to a value having 256 different discrete levels, then 8 binary memory cells (i.e., $2^8$) are required. However, storing a sampled data signal is inefficient because numerous memory cells are used to store only one sample.

In the present invention, however, the sampled data point is stored in a single analog or multilevel memory cell. This permits much greater density of storage compared to the binary memory cell. Using the memory cell techniques of the present invention, integrated circuits can be designed to store data more compactly than integrated circuits using binary memory cells Techniques of the present invention are also applicable to allow a single digital memory cell to store multiple digital bits by using multilevel storage.

The memory cell of the present invention may be referred as an analog or multilevel memory cell since the memory cell can store a relatively large range of analog and digital values. The analog values can be thought of as having discrete steps such as, for example, 10 millivolt steps. In other embodiments, the analog values are essentially continuous. Although an analog memory cell can store an analog (or digital value), a degree of precision for such a memory cell can be quantified by the number of discrete steps the memory cell can store. Higher resolutions for an individual memory cell are limited by the process technology. Such factors including memory cell's charge, the charge on an electron, leakage to and from the memory cell, and accuracy of other support circuitry are important considerations.

Analog and digital storage of data is described in U.S. Pat. Nos. 5,694,356, 5,680,341, 5,745,409, 5,748,534, 5,748,533, 5,818,757, and U.S. patent application Ser. No. 09/324,902, filed Jun. 2, 1999, which are all incorporated by reference.

In a specific embodiment of the present invention, the analog or multilevel memory cells are implemented using Flash or EEPROM cells. Flash or EEPROM cells are memory transistors with a floating gate, and may be referred to as a floating gate device. Flash and EEPROM cells are nonvolatile. Once programmed or configured, these floating gate devices will hold their data even when power is removed. The Flash or EEPROM transistor can be n-channel or p-channel; n-channel floating gate devices are presently more widely available.

Flash and EEPROM cells are configured or programmed by altering a threshold voltage or VT of the device. Floating gate devices can have a range of stored VTs. This range of stored VTs is used to provide analog or multilevel storage. Flash and EEPROM cells can also be erased; the VTs are returned to an initialized state.

In an embodiment of the invention, the degree of precision for storing information in a memory cell is selected by the design to be appropriate for a particular application. The degree of precision can be a user-selectable option. For example, when storing voice signals, relatively less precision is needed since the human voice is understandable and recognizable when less resolution is employed. For human voice, the memory cell can be designed to store about $2^8$ or 256 levels. For some applications, such as high-resolution color images, photographs, and video, greater precision is typically needed for an accurate reproduction. The memory cell or multiple memory cells used in conjunction with another can be designed to store effectively $2^{24}$ or 16,777, 216 levels in order to produce the colors accurately. The memory cell or cells will effectively store $2^{16}$ or 65,536 levels if less color accuracy is acceptable.

In short, the memory cell or multiple memory cells of the present invention can be designed to store any number of data levels, for example, $2^8$, $2^{10}$, and $2^{12}$ or more levels. Other numbers of levels are also possible. A greater number of levels permits greater compression of data into a fewer number of memory cells. The greater number of levels each memory cell is capable of storing, the more data that can be stored in an array of these memory cells. The ultimate precision of the memory cell available with the analog memory cell depends on many factors such as the process technology used and stability and speed of the circuitry used to store and resolve the different levels.

Using present technology, it is practical to implement an integrated circuit according to the present invention having memory cells, each capable of storing about $2^8$ levels. A memory cell with 8 bits of resolution is readily manufacturable and can be easily interfaced with and processed using the circuitry of the present invention. Further, a memory cell with 8-bit resolution provides adequate resolution for recording and playback of voice data with a relatively high fidelity. As technology further improves, the present invention may be used to provide an interface with memory cells having greater than 8-bit resolution.

Furthermore, instead of storing a data sample of the input signal into a single cell, multiple cells of the present invention can be combined to increase the resolution. Additional cells are added until the desired resolution is achieved. Generally the relationship for providing greater resolution by using multiple cells is given by $2^{n*m}$, where n is the number of memory cells and m is the bit resolution per cell. For example, three cells each having 10-bit resolution each can be combined to have an effective resolution of 30 bits. The number of bits resolution for multiple 10-bit cells is given by the following relationship, $2^{n*10}$, where n is the number of cells. As a further example, for three cells each having 8-bit resolution, the combined effective resolution is 24 bits (i.e., $2^{n*8}$ where n is 3). This particular implementation may be useful for imaging applications, where each cell corresponds to the intensity of one of the red (R), green (G), and blue (B) parameters.

Although sometimes referred to as an analog memory cell, the memory cell of the present invention can also be used for applications other than analog applications. For analog applications, analog values are stored into the memory cell without the need for an analog-to-digital converter. The memory cell can also be used in digital applications. The analog memory cell capable of storing multiple or continuous levels is equally well suited for digital and analog applications. For digital applications, the techniques of the present invention will permit much more compact storage of digital data. For example, the present invention can be used to implement nonvolatile mass storage PCMCIA or PC Cards. This permits an analog memory integrated circuit to be relatively compact. For digital applications, discrete levels may be stored, and an A/D and D/A converter may be utilized. Other techniques for storing and retrieving data from analog memory cells are described in U.S. Pat. Nos. 5,638,320, 5,687,115, 5,694,356, and 5,748,533, which are incorporated by reference.

Figure 4:
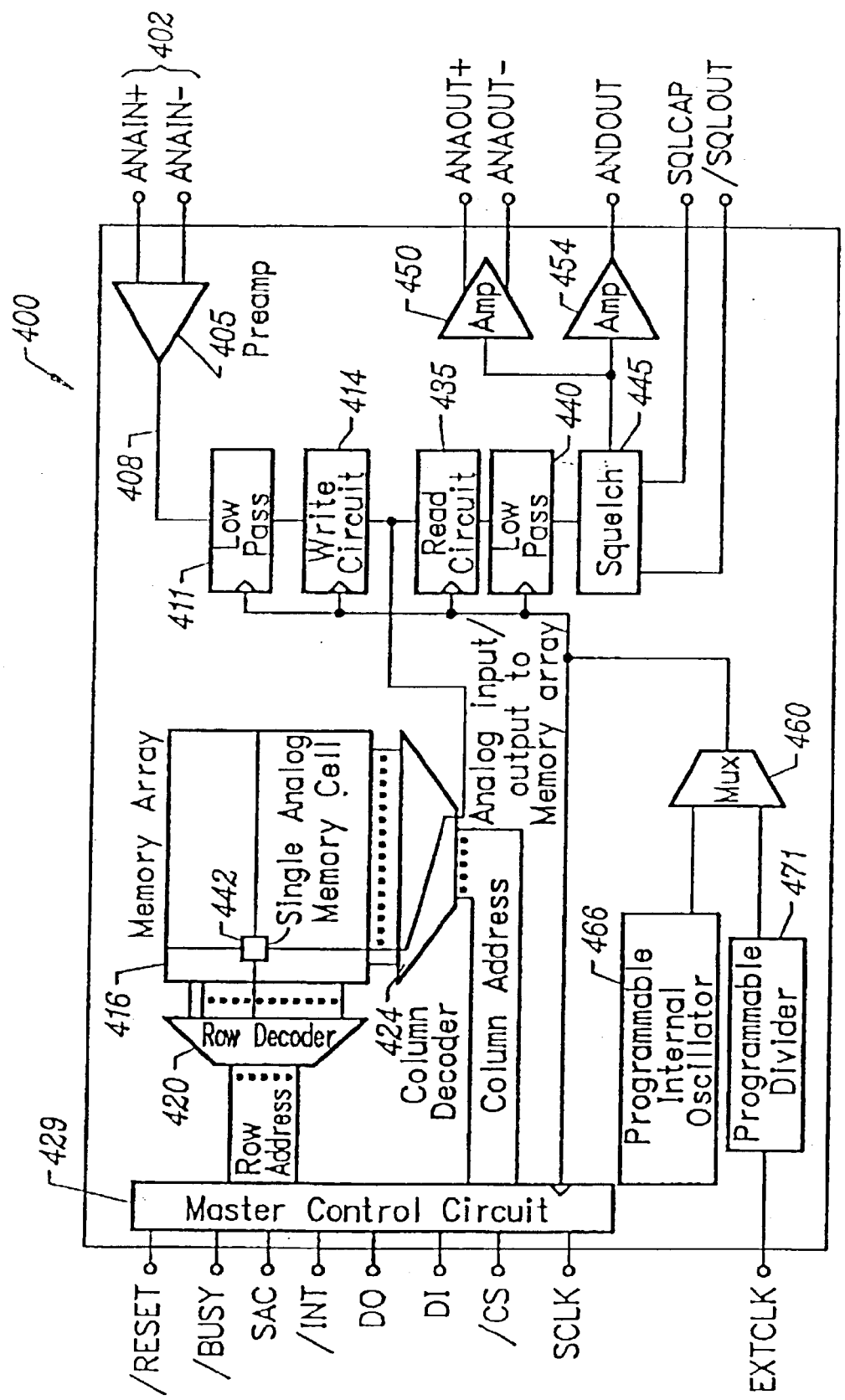
FIG. 4 shows a diagram of an overall block diagram of an integrated circuit of the present invention.
Figure 5:
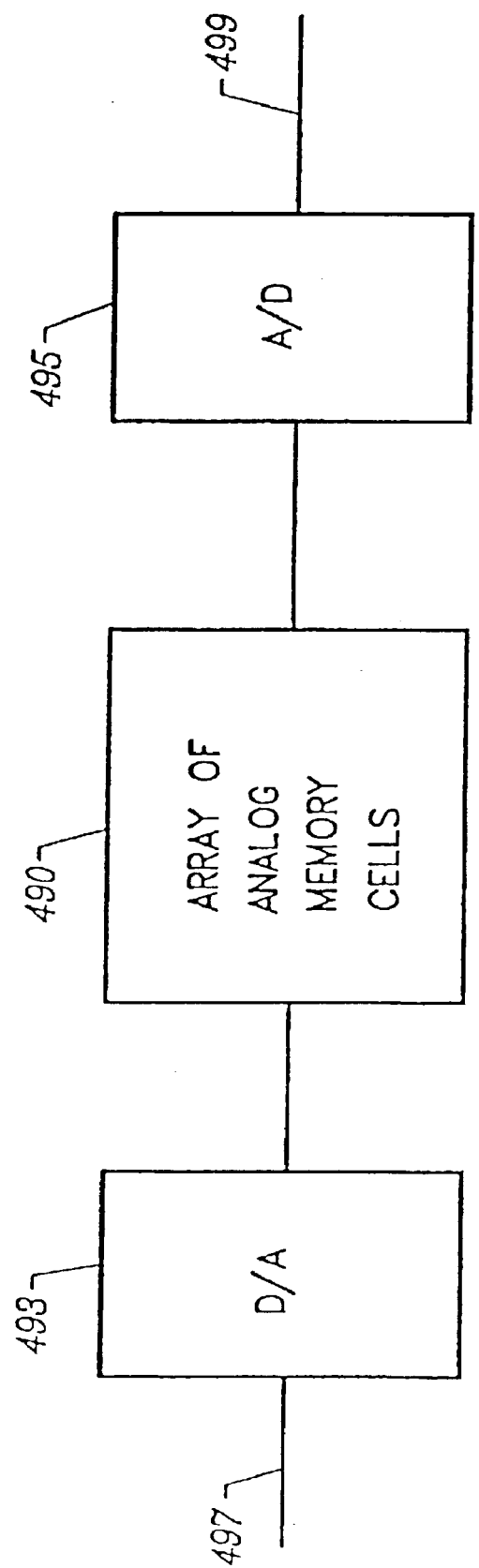
FIG. 5 shows a diagram of an integrated circuit of the present invention incorporating digital-to-analog converter and analog-to-digital converter circuits.

FIG. 5 shows an example of a portion of an integrated circuit of the present invention for storing digital information. The circuitry of the integrated circuitry is similar to what is shown in FIG. 4. In addition to an array 490 of analog memory cells for storing digital or analog information, there is a D/A converter 493 and A/D converter 495. To store digital data, D/A converter 493 takes digital information on input 497 and converts this to multilevel or analog information for storage in array 490. To retrieve digital data, A/D converter 495 takes the multilevel or analog information stored in array 490 and converts it to digital data on output 499. Input 497 may be in the form of parallel or serial bits of data. Output 499 can be in the form of parallel or serial bits of data.

Returning to FIG. 4, memory cells are organized in an array 416 of memory cells having rows and columns. In a specific embodiment, there are about 1.92 million analog or multilevel memory cells. With 1.92 million memory cells, this will store about eight minutes of voice data at a 4 kilohertz sampling frequency. An integrated circuit embodiment with 1.92 million memory cells is a practical implementation of the present invention using present technology. Clearly, an integrated circuit having fewer than 1.92 million memory cells is also be easily manufacturable. For example, a reduced-size version of the present invention having 960K memory cells provides half the data storage capacity. Given the size of the memory cell of the present invention and the desire to provide a large amount of storage at reasonable cost an integrated circuit with 1.92 million analog memory cells (e.g., fabricated using Flash technology) is practical. As technology improves and memory transistor sizes decrease, it will become possible, and practical, to manufacture integrated circuits having greater than 1.92 million memory cells. Rows and columns are addressable by row and column addresses and a row decoder 420 and column decoder 424. A master control circuit 429 controls operation of the integrated circuit. External or off-chip connections to the master control circuit are made via pins /RESET, BUSY, SAC, /INT, DO, DI, /CS, and SCLK.

Operation of the integrated circuit is controlled by the master control circuit. Commands or instructions are input to the master control circuit, which will then perform the desired function. Some of the functions the integrated circuit provides includes record, playback, cue, and erase. In this implementation, the command and data for the command is clocked into the device in serial form using the DI and SCLK pins. If there is output data, it is clocked out, also in serial form, through DO. The command interface to the integrated circuit is referred to as a serial port interface (SPI). The commands are referred to as SPI commands. More details of the SPI interface may be found in U.S. provisional application No. 60/091,326.

Information stored in array 416 is read or played back using a read circuit 435. Read circuit 435 is functionally the inverse of write circuit 414. An output of the read circuit has a one-to-one correspondence to the original analog value that was stored in the memory cell using the write circuit. The output is passed through a low pass filter 440 to reconstruct the original waveform. If recording and playback do not occur at the same time, low pass filter 440 and low pass filter 411 may be implemented using the same on-chip circuit to reduce die size. Multiplexers will select whether the low pass filter is coupled to the recording or the playback circuitry. This reduces the die size since the same circuitry is used for these two purposes. Another benefit of using the same filter is there will be better matching of the electrical characteristics for both recording and playback.

In the particular embodiment of FIG. 4, there is a squelch circuit 445 before an AUDOUT pin or differential ANAOUT+ and ANAOUT− pins. The squelch circuit will give the user an impression of a greater signal-to-noise ratio at the output, much like the squelch function of radio receivers or some two-way radios. The user sets a particular delay by placing a particular size of capacitor at a SQLCAP input. When the signal input to the squelch circuit is above a certain threshold level which is set by squelch circuit 445, the stored signal is output at AUDOUT or ANAOUT+ and ANAOUT−. However, if the signal drops below this squelch threshold level for a period of time set by the value of the capacitor, the output is a greatly attenuated version of the originally stored signal. The squelch feature can be used to reduce undesirable background noise from the output. Although a squelch feature is provided in FIG. 4, other embodiments of the invention may not include this squelch feature and the associated circuitry.

An output amplifier 450 is connected to provide an amplified differential output of the stored signal at ANAOUT+ and ANAOUT− pins. An output amplifier 454 provides a single-ended output of the stored signal at an AUDOUT pin. In a specific embodiment, when a signal is being recorded at inputs ANAIN+ and ANAIN−, the signal may be monitored at ANAOUT+ and ANAOUT− and AUDOUT pins. This monitor feature can be used by a user to ensure the circuitry is operating properly.

A clock for low pass filter 411, write circuit 414, read circuit 435, and low pass filter 440, is selected using a multiplexer 460. The clock is either internally generated or provided by an external source. This clock provides the sampling frequency at which the analog input is sampled. The clock is supplied from a programmable internal oscillator 466 or a programmable divider 471, which is connected to an external clock source EXTCLK. The SCLK input may also be selected to provide the clock during operations such as testing. In a specific embodiment, programmable internal clock 466 is implemented using a relaxation oscillator and a delay locked loop (DLL) frequency synthesizer. However, there are many other techniques to implement the programmable internal clock including a delay, a phase locked loop (PLL), phase frequency loop (PFL), crystal oscillator, and frequency synthesizer.

The clock from multiplexer 460 is used to control the sampling frequency of the input waveform. Internal oscillator 466 generates a range of clock frequencies. For example, internal oscillator may be used to generate a clock frequency from about 4 kilohertz to about 8 kilohertz. Depending on the desired application, the frequency ranges may vary. The internal oscillator may generate frequencies from the hundreds of kilohertz to the megahertz ranges. The user can select the frequency of the internal oscillator. To permit even greater flexibility, an external clock source input through the EXTCLK pin can be used instead of the internal oscillator. This external clock source is frequency divided using programmable divider 471. The user can change the divider ratio to change the frequency of the clock without changing the EXTCLK.

Therefore, in the present invention, the user can select the sampling frequency. In a specific embodiment of the present invention, the user can select a 4 kilohertz, 5.3 kilohertz, 6.4 kilohertz, or 8 kilohertz sampling frequency. The internal oscillator is programmable to provide a range of sampling frequencies. And, an even greater range of sampling frequencies is available by having the user supply an external clock. This permits the user to control the bandwidth of the signal that is recorded. If the user desires greater bandwidth, the user will select a higher sampling frequency. A higher sampling frequency also means there will be a greater number of sampled data points, which will require a greater number of memory cells for storage for a given duration of a signal.

The programmable internal frequency generator and provision for an external clock source are features of the present invention. The user can vary the sampling rate as desired, and as can be appreciated, this provides greater flexibility than a integrated circuit having a fixed sampling frequency. In an integrated circuit that only provides a fixed sampling frequency, when different sampling frequencies are desired by customers, there would have to be different versions of the same integrated circuit. The user-selectable sampling rate permits the same integrated circuit to be used in various applications. The manufacturer of the integrated circuit does not need to fabricate different parts for different customers and applications. And, the customer or user does not need to stock different parts having different sampling frequencies.

An aspect of the present invention is that as the sampling is increased, the integrated circuit will record at a higher bandwidth, but the maximum duration of the recording will be less. If the user selects a sampling rate of 2000 samples per second, this gives a recording time of about 960 seconds or 16 minutes of recording time for 1.92 million cells. If the user selects a sampling rate of 8000 samples per second, this results in about 240 seconds or 4 minutes of recording time. Using a sampling rate of 8 kilohertz will provide a higher quality recording of the original signal than the case when using a 4 kilohertz sampling rate. See table B below for more examples.

Figure 6:
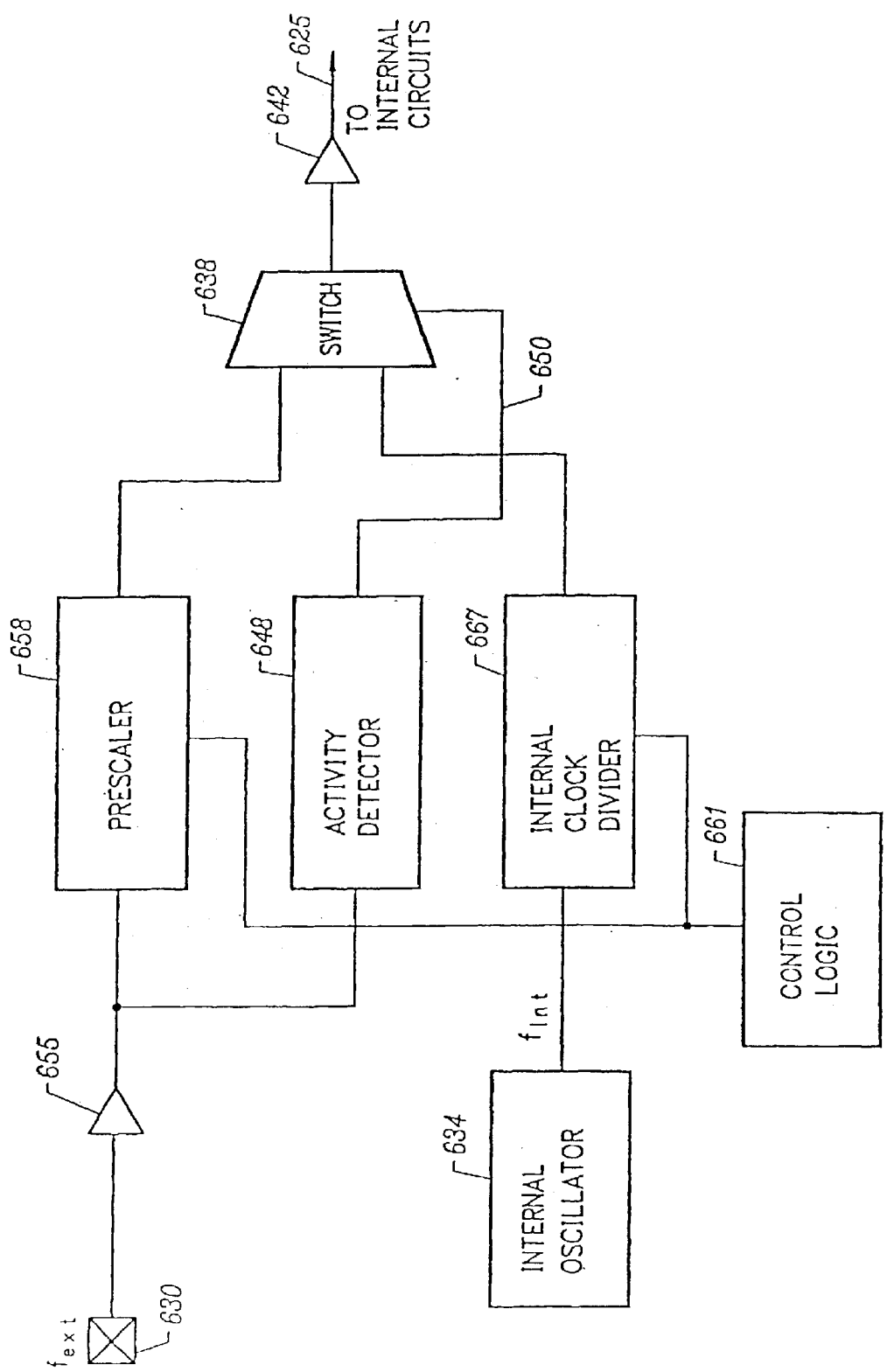
FIG. 6 shows a block diagram of circuitry for implementing a user selectable sampling frequency.

FIG. 6 shows a block diagram of circuitry for implementing a user-selectable sampling frequency feature of the present invention. A feature of the present invention is to provide a user-selectable or user-controllable sampling frequency that can be dynamically changed. The sampling frequency can be changed while the integrated circuit is operating. The user-selected sampling frequency will be used for recording or playback, or both. The sampling frequency may be dynamically changed during the recording or playback operation. The sampling frequency can be changed while the memory integrated circuit remains resident on a printed circuit board. The user's selection of the sampling frequency is stored internally in the integrated circuit: there is no need to change external components such as the value of an external resistor or capacitor to change the sampling frequency. The user configures the analog memory integrated circuit to use the user-selected sampling frequency. This selection can be held in logic, volatile, or nonvolatile storage circuitry on the integrated circuit. As discussed above, a sampling clock output 625 is provided to internal circuits on the integrated circuit such as the read and write circuitry. The source of this sampling clock output may be from an external clock input pad 630, where the user provides an external clock frequency $f_{ext}$. Or, the source may be from an internal oscillator 634, providing an internal sampling frequency $f_{int}$. In a specific embodiment of the present invention, $f_{int}$ is 4096 kilohertz, although other frequencies may be used.

Although the FIG. 6 implementation provides both internal and external frequencies, in other embodiments, only the internal or external frequencies are provided. For example, the integrated circuit can include only a programmable internal oscillator and not provide for input of an external clock frequency, or vice versa.

The internal sampling clock $f_{int}$ or external sampling frequency $f_{ext}$ is selected by a switch 638 to be passed to sampling clock output 625. An output from switch 638 can be further amplified using a buffer 642, if desired or needed. Switch 638 can be implemented using one of the many techniques to design a switch on an electronic device. For example, switch 638 can be a multiplexer implemented with pass gates or logic gates. An alternative to a multiplexer is a summing amplifier, where the unselected signal is set to zero.

The control 650 of switch 638 can come from various sources. The switch may be controlled by user-programmed cells such as Flash, EEPROM, EPROM, antifuses, SRAM, DRAM, laser trimmable bits, and other similar technologies. For example, the user can specify the use of the internal or external clock through the SPI interface. In the embodiment of FIG. 6, an activity detector 648 controls switch 638. Activity detector 648 is coupled to pad 630 and provides an output 650 to switch 638 to detect and indicate whether there is activity at pad 630. If no clock frequency is detected at pad 630, switch 638 will select the internal oscillator path. No clock frequency is detected at pad 630 when, for example, pad 630 is set at ground, VDD, or another voltage. However, if a clock frequency is detected at pad 630, switch 638 will select the external clock path. This feature of the present invention allows a user to use an external sampling frequency without the need to additionally configure special bits to so indicate.

The external sampling frequency is provided at pad 630. This signal may be amplified by a buffer 655 (if desired or needed). Then, $f_{ext}$ is coupled to a prescaler circuit 658 that adjusts $f_{ext}$ based on a control logic circuit 661. For example, the prescaler circuit frequency divides the $f_{ext}$ frequency by an amount the user desires. The user provides information on how much to frequency divide to the control logic circuit. This information may be provided by using the SPI interface discussed in a section of U.S. provisional application No. 60/091,326, filed Jun. 30, 1998. In a specific embodiment, an output of the prescaler circuit is a sampling frequency that is 128 times the user-desired or user-selected sampling frequency $f_{samp}$.

Internal oscillator 634 is coupled to an internal clock divider 667 that frequency divides $f_{int}$. Similar as to the case for prescaler 658, the amount of frequency division for internal clock divider 667 is user-selectable and controlled by control logic circuit 661. The user can select the divider ratio through the SPI interface. Also, in a specific embodiment of the invention, an output of internal clock divider 667 will be 128 times the user-desired sampling frequency.

The user's selection of the internal sampling frequency is stored internally in the integrated circuit. This selection can be stored, for example, in a register, flip-flop, latch, or other storage or logic circuits The user's selection can also be stored into memory cells such as Flash, EEPROM, EPROM, SRAM, DRAM, laser programmable fuse, fuse, antifuse, and other technologies on the integrated circuit. For example, there may be trim bits on the integrated circuits that specifically control and determine the internal sampling frequency. Trim bits are bits within the integrated circuit that are used to configure characteristics and operating parameters of the integrated circuit. The trim bits may be implemented using any memory technology including Flash, EEPROM, analog Flash or EEPROM, or multilevel Flash or EEPROM. When the user's selection for the sampling frequency is stored internally using Flash technology, since this is a nonvolatile storage technology, the user's selection for the sampling frequency will be retained even after power is removed from the integrated circuit. In this case, the user does not need to configure the integrated circuit with the selected sampling frequency again upon power up. When not using a nonvolatile technology, the user needs to input the desired sampling frequency before reading or writing to the memory.

Since the user's sampling frequency selection is stored internally on the integrated circuit, this selection may also be changed or adjusted during the operation of the integrated circuit. Therefore, the sampling frequency can be dynamically changed. No components external to the integrated circuit such as an external register need to be changed or adjusted. For example, the user may change (e.g., via the SPI interface) the value stored in a register or latch, one or more memory cells, or other storage circuit to dynamically change the sampling frequency. In a specific embodiment, the user value to select the sampling frequency is a digital value (e.g., a binary number). However, in other implementations, this value may be an analog value.

In one implementation, clock output 625 of the circuitry in FIG. 6 provides a clock that will be 128 times the user-desired sampling frequency (i.e., $128*f_{samp}$). This specific multiple of the sampling frequency was selected to permit greater ease in logical manipulation of the signal by on-chip circuitry to generate derivative clock signals. In particular, $128*f_{samp}$ is the highest common frequency of the clock signals needed for a particular embodiment of the present invention.

Figure 7:
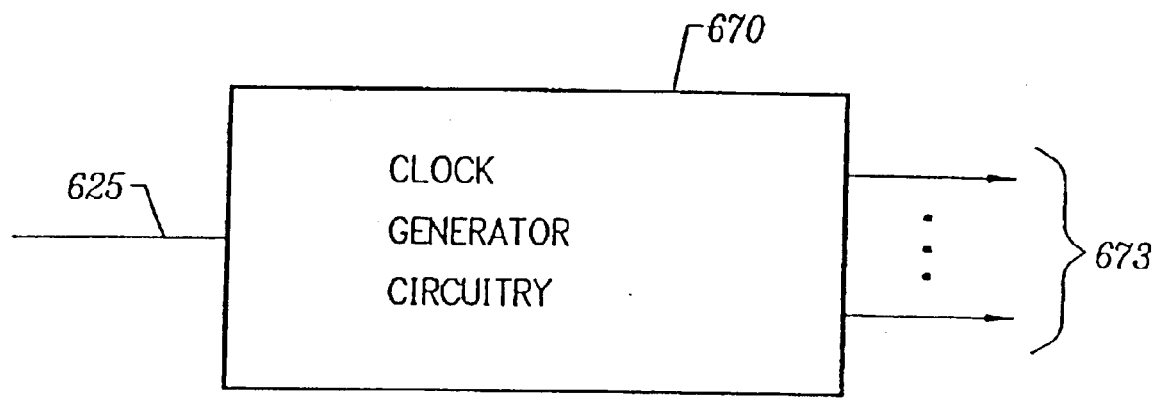
FIG. 7 shows a diagram of clock generation circuitry.

FIG. 7 shows clock generation circuitry 670 that uses clock output 625 to generate a number of clock outputs 673. Clock generation circuitry 670 generates clock signals for other circuitry on the integrated circuit. Clock signals 673 can include one or more higher frequency clocks (i.e., higher than $f_{samp}$) used, for example, by charge pump circuitry. Clock signals 673 can include one or more lower frequency clocks (i.e., equal to or lower than $f_{samp}$) used by the write and read circuits. For example, a clock at the sampling frequency is used by the write circuit. Clock signals 673 can also include one or more clocks that are at a lower or high frequency that may have a desired duty cycle for operating the on-chip circuitry.

Figure 8:
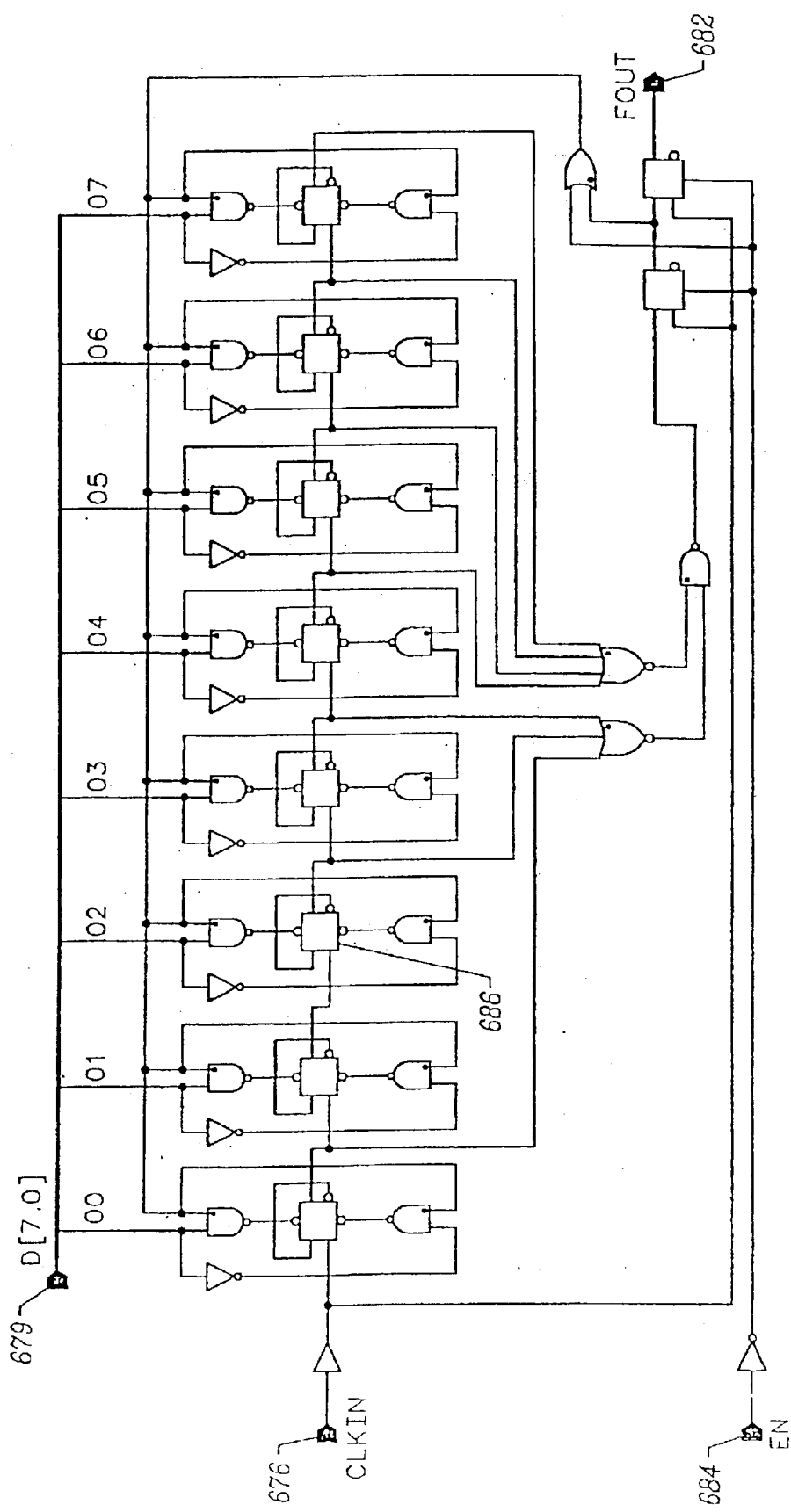
FIG. 8 shows a circuit diagram for a prescaler circuit.

FIG. 8 shows a circuit schematic for a specific implementation of prescaler 658. The external clock $f_{ext}$ is input at 676 and an 8-bit binary number is input at 679. The external clock frequency is divided by a value represented by the 8-bit binary number to obtain 128*$f_{samp}$ at an FOUT output 682. This circuitry has an enable input EN 684 to enable or disable FOUT 682. This circuitry includes a number of flip-flop circuits 686 similarly arranged in parallel. Output of flip-flop circuits 686 are coupled into NOR gates and then an AND gate for generating FOUT 682. The output frequency at FOUT 682 will be the $f_{ext}$ frequency divided by d, where d is the value represented by the 8-bit binary number.

Figure 9:
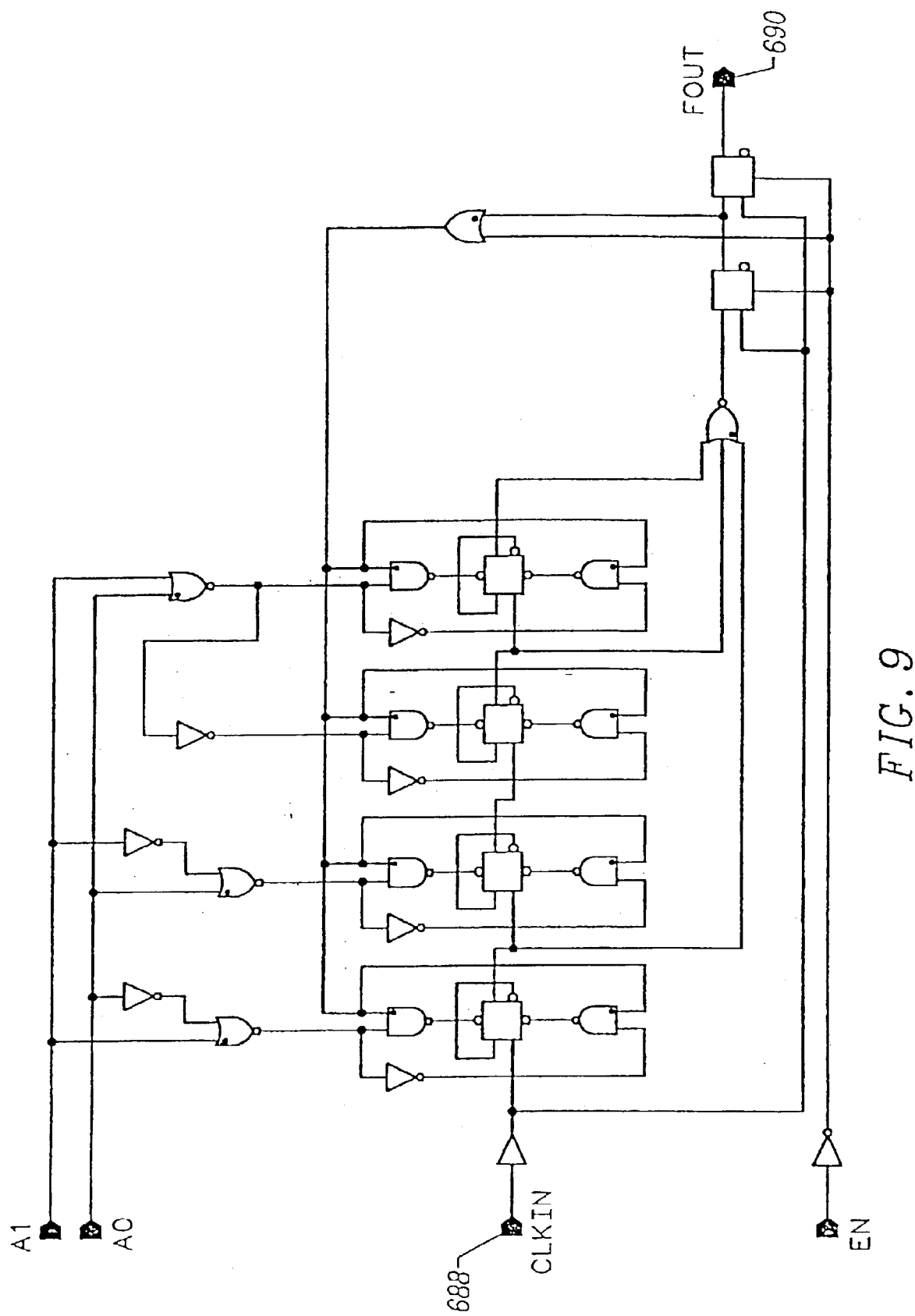
FIG. 9 shows a circuit diagram for internal clock divider circuitry.

FIG. 9 shows a circuit schematic for internal clock divider 667. However, the internal clock divider 667 performs a similar function as the prescaler 658. Therefore, the specific circuit implementation in FIG. 8 or a variation may also be used to implement clock divider 667. The circuitry in FIG. 9 or its variation may also be used for prescaler 658. In the FIG. 9 implementation, the internal clock divider uses a decoding-style technique for generating different output frequencies. The internal clock frequency $f_{int}$ is input at 688, and the 128*$f_{samp}$ output is taken at an $F_{OUT}$ output 690. A 2-bit value is input using A1 and A0 to divide the clock into four possible output frequencies. The following table A provides a listing of the $F_{OUT}$ outputs for the A0 and A1 inputs based on an input frequency of 4.096 MHz. Based on A0 and A1, the input frequency is divided to obtain the output frequency.

TABLE A

| A0 | A1 | $F_{OUT}$ 690 | $f_{samp}$ |
|---|---|---|---|
| 0 | 0 | 512 kHz | 4 kHz |
| 0 | 1 | 682 kHz | 5.3 kHz |
| 1 | 0 | 819 kHz | 6.4 kHz |
| 1 | 1 | 1024 kHz | 8 kHz |

As the table shows, this specific embodiment of the present invention provides four possible internal sampling frequencies 4 kilohertz, 5.3 kilohertz, 6.4 kilohertz, or 8 kilohertz. This circuitry is merely an example of the circuitry that may be used in the present invention. Similar circuitry may also be used to provide other specific frequencies. The user can also be given choice of more frequencies or a range of frequencies. For example, there may be eight or more different frequencies to choose from. By providing a greater number of inputs An, the sampling frequency may be essentially any frequency within a desired frequency range.

Figure 10:
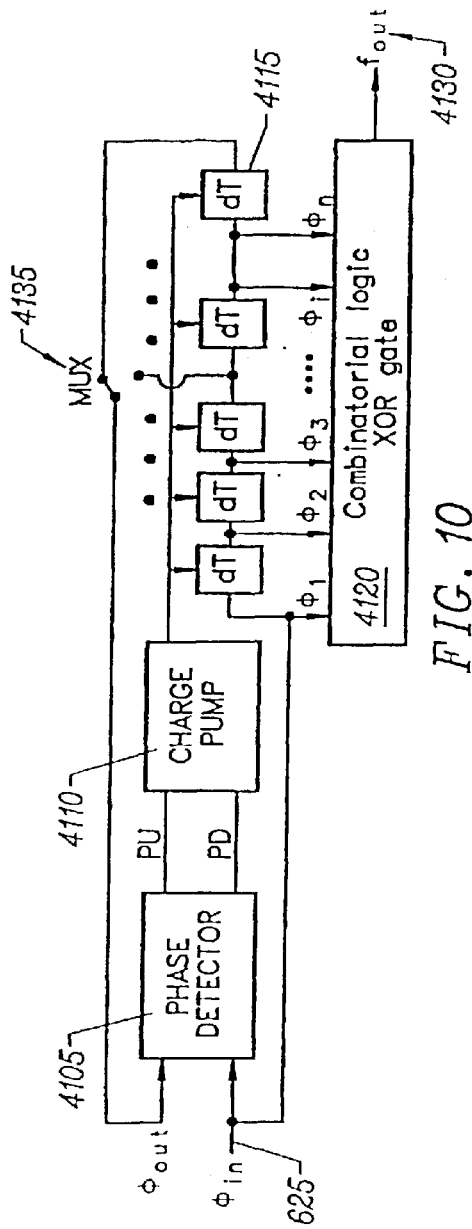
FIG. 10 shows a delay locked loop (DLL) circuit for clock generation.
Figure 11:
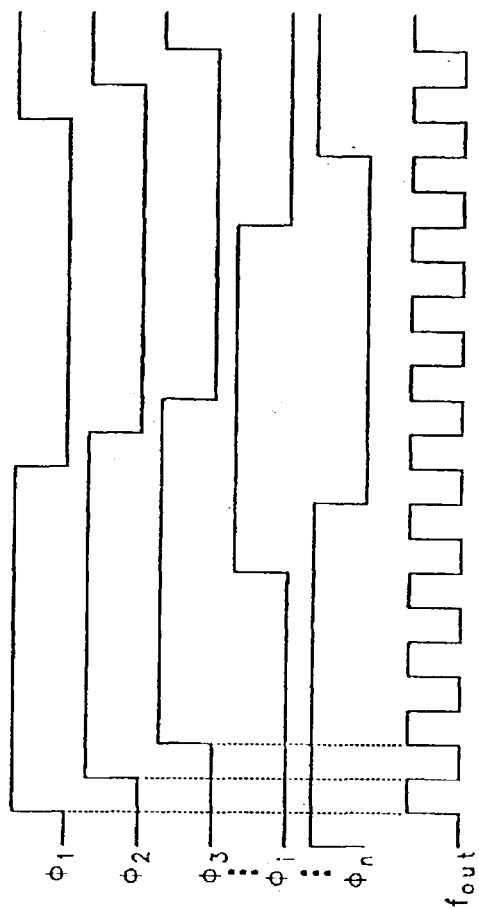
FIG. 11 shows waveforms for a delay locked loop circuit.

FIG. 10 shows a block diagram of delay locked loop (DLL) circuitry that is used for clock generation circuit 670. Other circuitry besides a DLL may be used to perform frequency multiplication. For example, a phase locked loop (PLL) circuitry may also be used. FIG. 10 shows a DLL circuit including a phase detector 4105 that is coupled in clock output 625. The phase detector generates PU (pull-up) and PD (pull-down) outputs that are coupled to a charge pump 4110. The charge pump is coupled to a number of delay cells 4115, which may be in a simple embodiment, inverting buffers. Each delay cell generates a phase output PHI1 to PHIN. Phase output PHI1 is coupled to clock output 625. The phase outputs are logically combined using combinatorial logic 4120 such as a XOR gate or another type of logic gate to generate $f_{OUT}$ 4130. FIG. 11 shows a timing diagram of phases of the clock, $\phi_1$ to $\phi_n$ and the resulting $f_{OUT}$. Signal $f_{OUT}$ 4130 is generated from the $\square_1$ to $\phi_n$ waveforms by using XOR gate 4120. Signal $f_{OUT}$ will be high only when one and only one of the clock phases is high.

In FIG. 10, to obtain the desired $f_{OUT}$ 4130 output frequency, a multiplexer or switch 4135 is selectively connected at various points in the delay chain to feedback an output of one of the delay cells 4115 to phase detector 4105. Depending on which point of the delay chain is fed back to the phase detector, a higher or lower frequency $f_{OUT}$ 4130 is derived. Switch 4135 essentially shortens or lengthens the delay chain. This will change the frequency.

Figure 12:
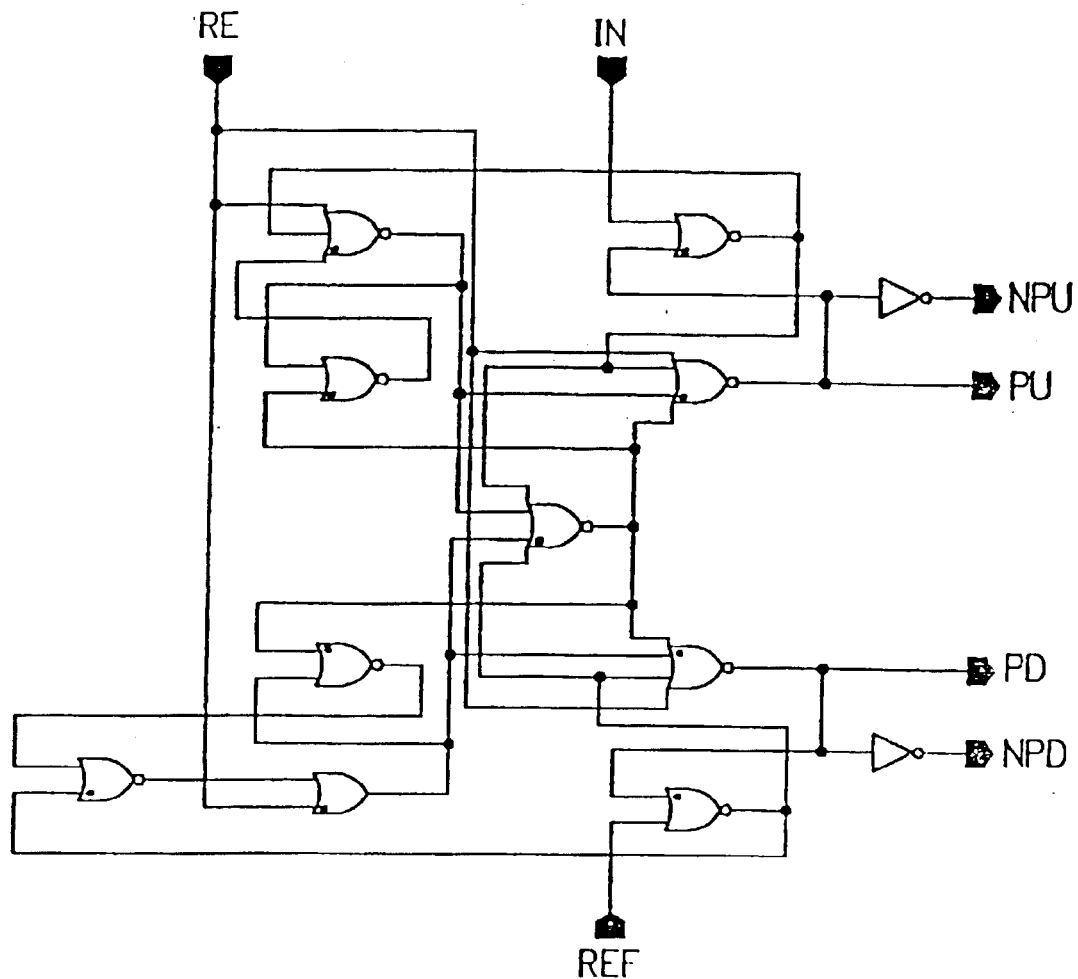
FIG. 12 shows a circuit diagram for a phase detector for a DLL.

FIG. 12 shows a schematic of a phase detector circuit 4105. Clock $\phi_{IN}$ is input at IN and clock $\phi_{OUT}$ is input at REF. The outputs are pull-up (PU), /pull-up (NPU), pull-down (PD), and /pull-down (NPD). RE is an active high signal that goes low with the rising edge of REF. When RE is high, PU and PD will be low. The phase detector is implemented with NOR logic gates. Other types of logic gates may also be used.

Figure 13:
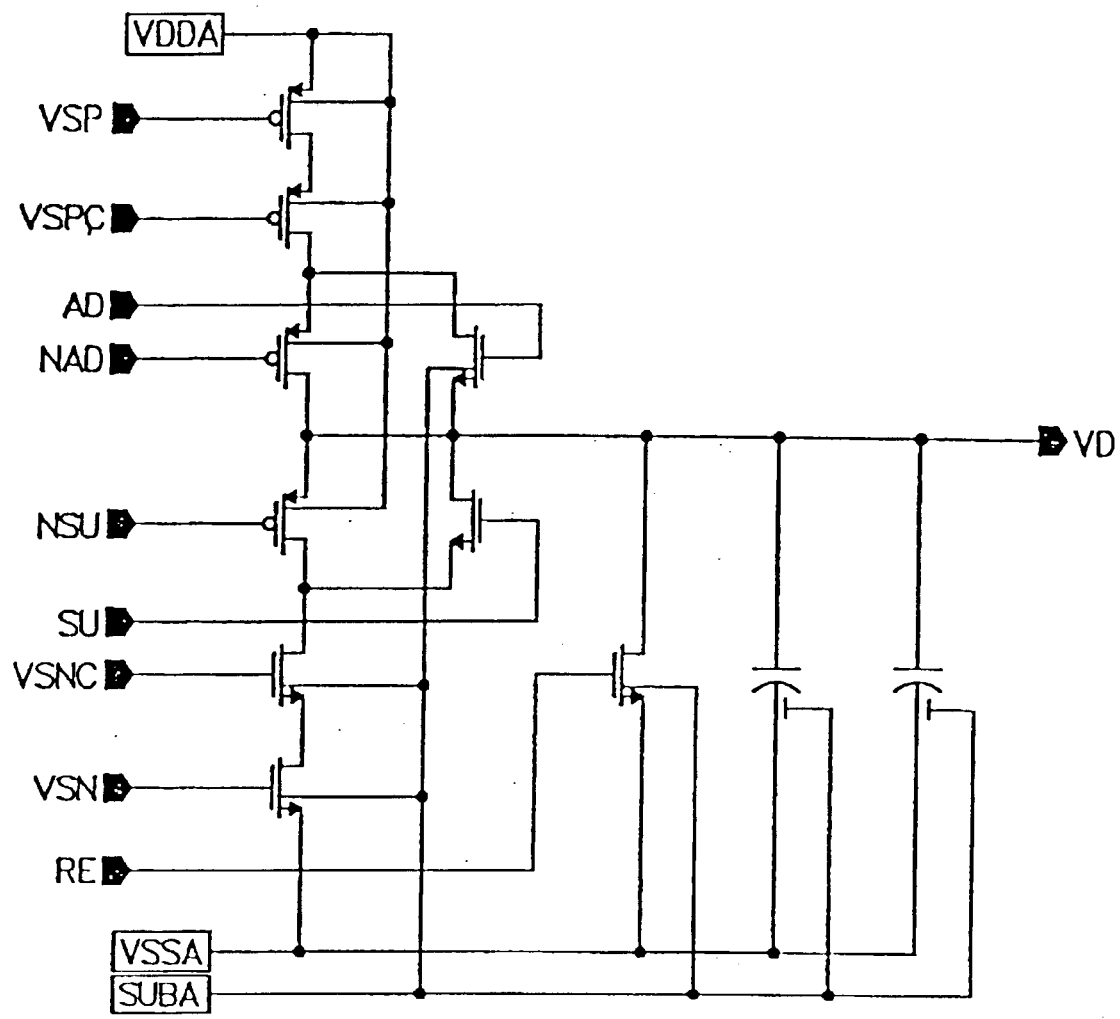
FIG. 13 shows a circuit diagram of a charge pump for a DLL.

FIG. 13 shows a schematic of a charge pump circuit 4110. From the phase detector, PU is connected to AD. NPU is connected to NAD. PD is connected to SU. NPD is connected to NSU. VSP, VSPC, VSNC, and VSN are bias voltages from a bias voltage generator. This bias voltage may be from a slave bias generator of a master-slave biasing scheme discussed later. An output of the charge pump is VD.

Figure 14:
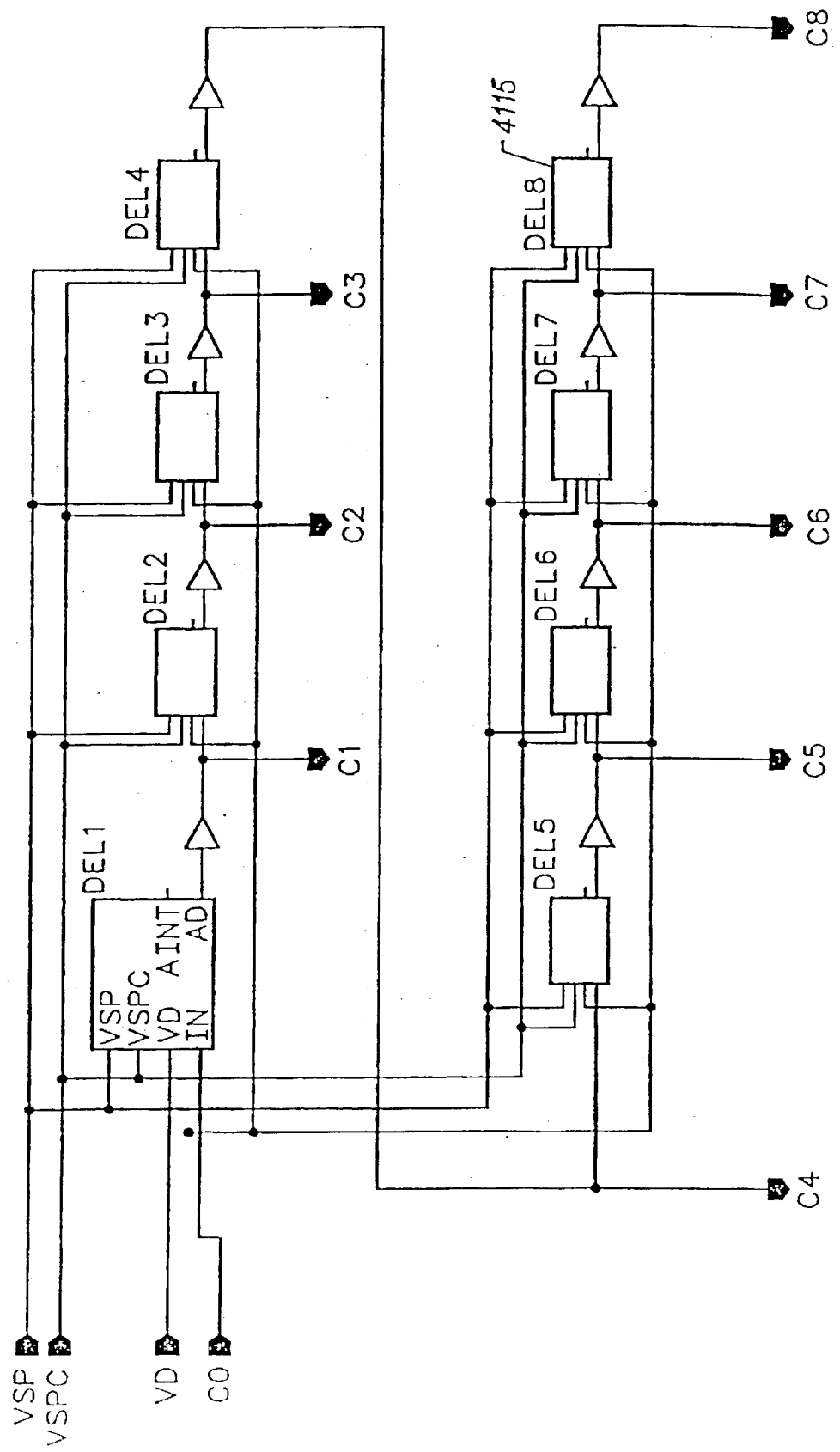
FIG. 14 shows a number of delay cells arranged in series.
Figure 15:
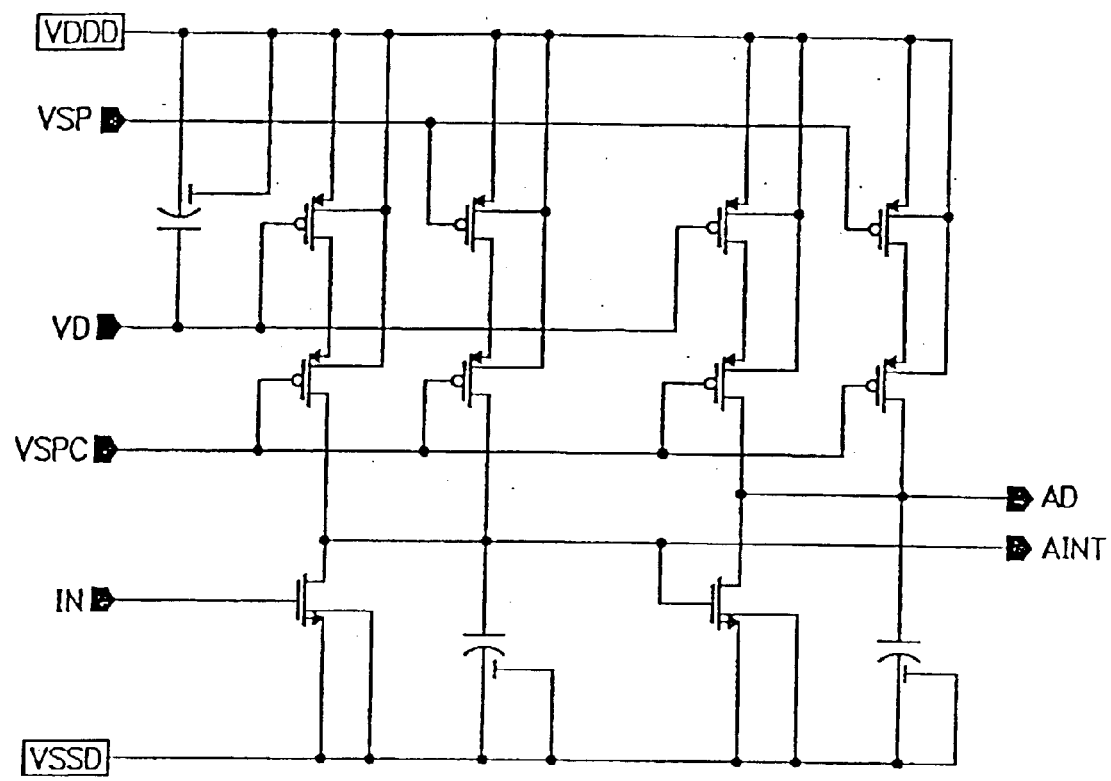
FIG. 15 shows a circuitry for one delay cell.

FIG. 14 shows a schematic of a number of delays cells 4115 coupled in series. FIG. 15 shows a schematic of a single delay cell 4115. VD from the charge pump is connected to each of the delay cells. VSP and VSPC are bias voltages as described above. C1 and C8 are the different output phases from each of the delay cells.

Figure 16:
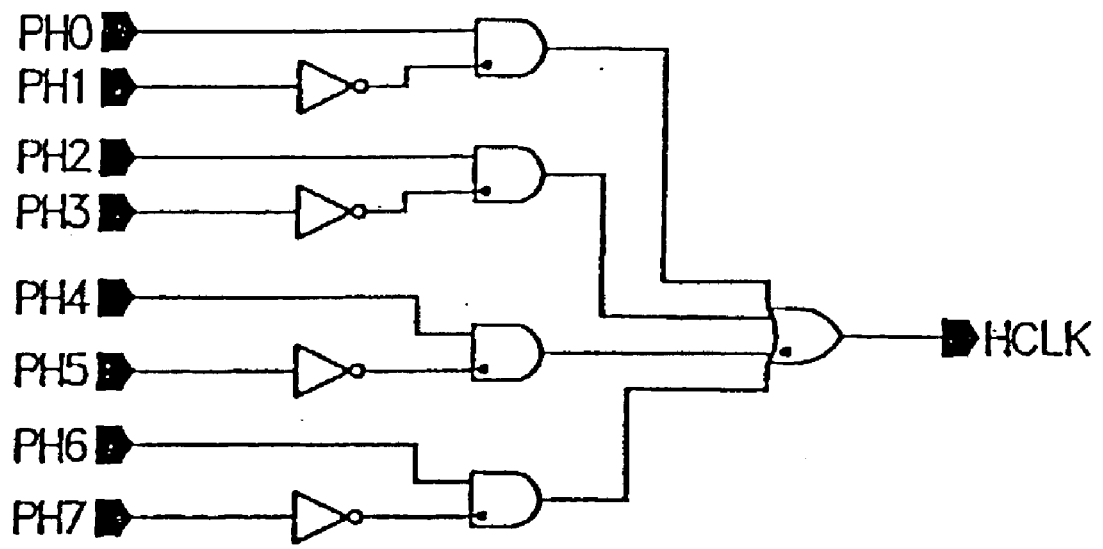
FIG. 16 shows circuitry for the first stage of the combinatorial logic circuit.
Figure 16:
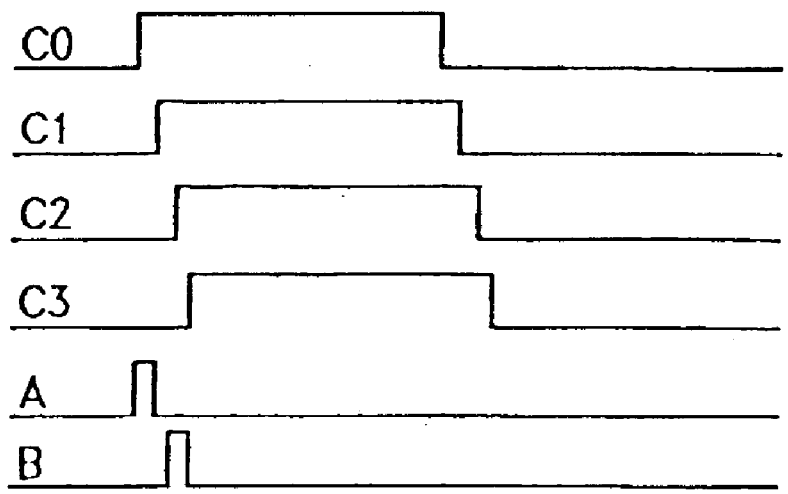

FIG. 16 shows a more detailed schematic of a first stage of combinatorial logic 4120. Each of the phases of the clock C1 to C8 is connected to PH0 to PH7, respectively.

Figure 17:
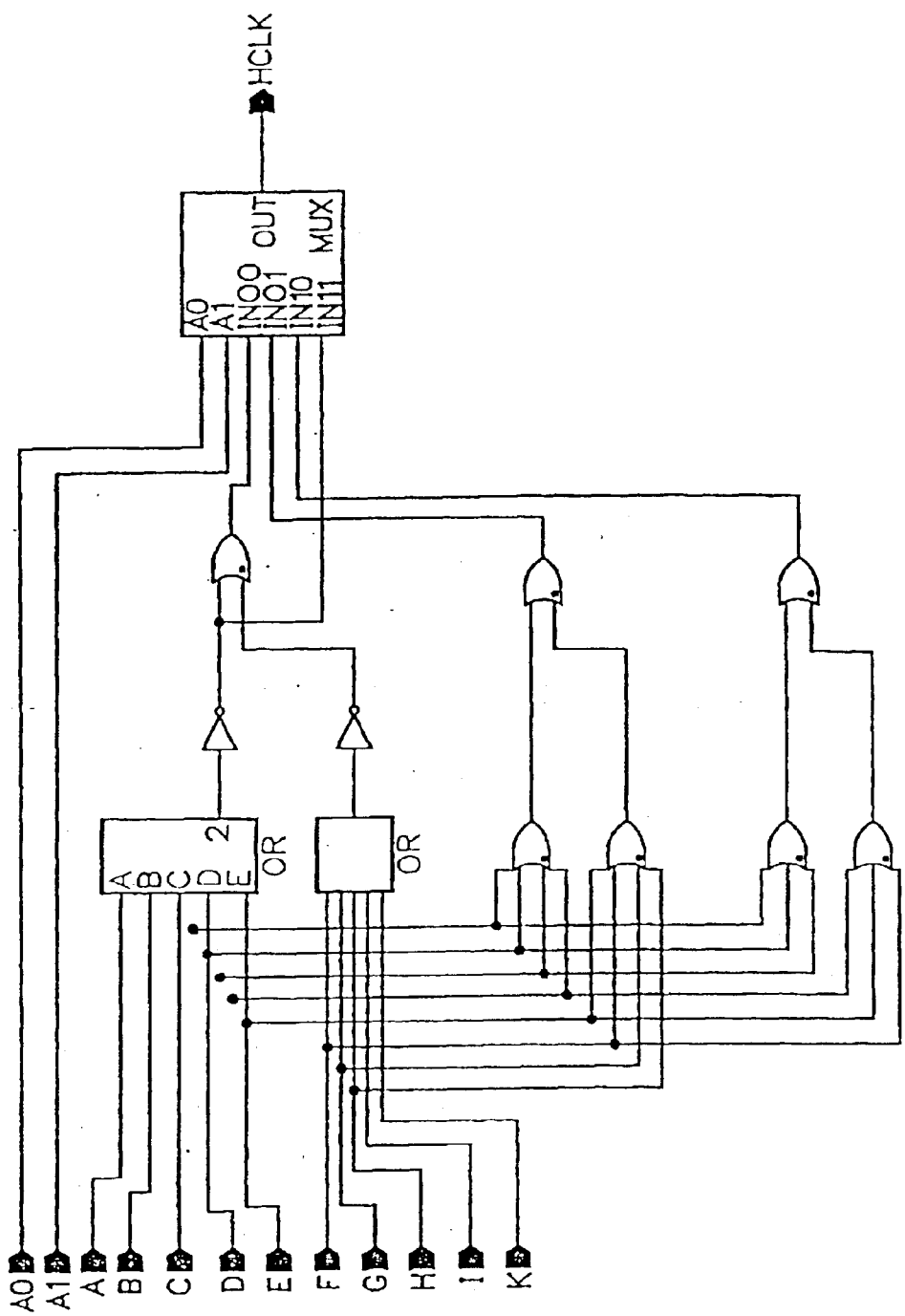
FIG. 17 shows circuitry for the second stage of the combinatorial logic circuit.

FIG. 17 shows a second stage of combinatorial logic 4120 that takes input from the first stage of combinatorial logic and synthesizes the final clock output.

Figure 18:
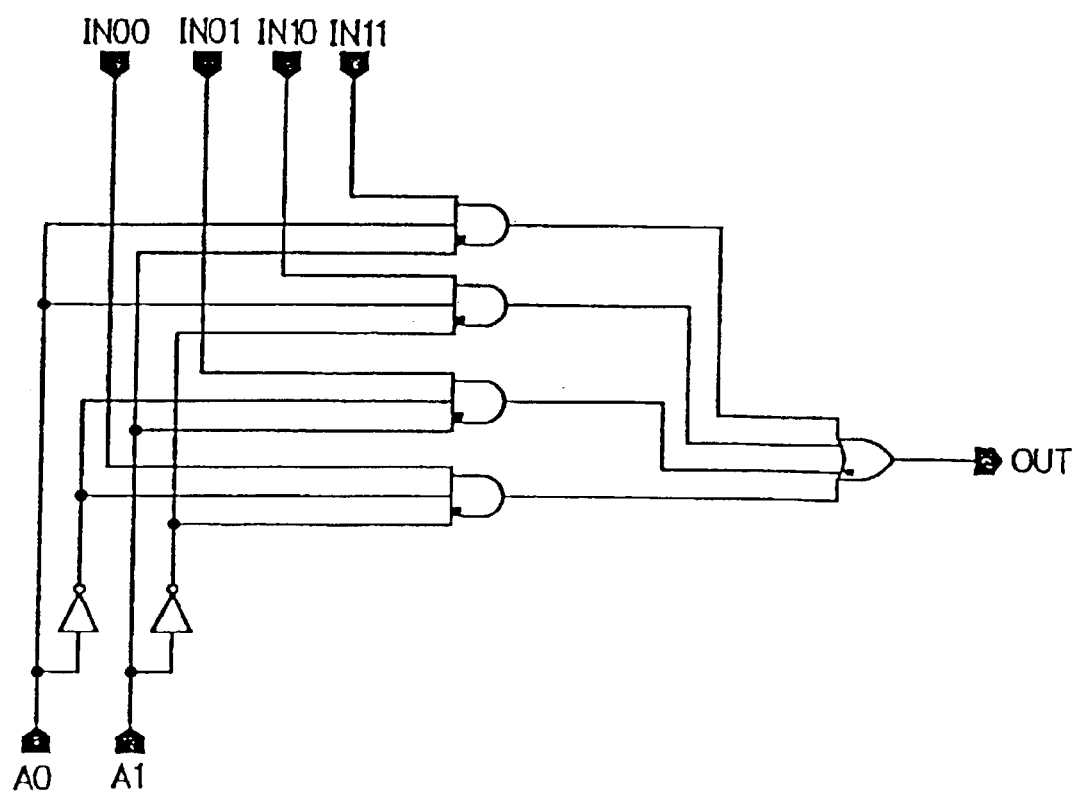
FIG. 18 shows a feedback multiplexer.

FIG. 18 shows a schematic of the feedback multiplexer 4135. Based on A0 and A1, this multiplexer connects an output of a delay cell input at IN00, IN01, IN10, and IN11 to an OUT. OUT is connected to $\phi_{OUT}$ of the phase detector.

Figure 19:
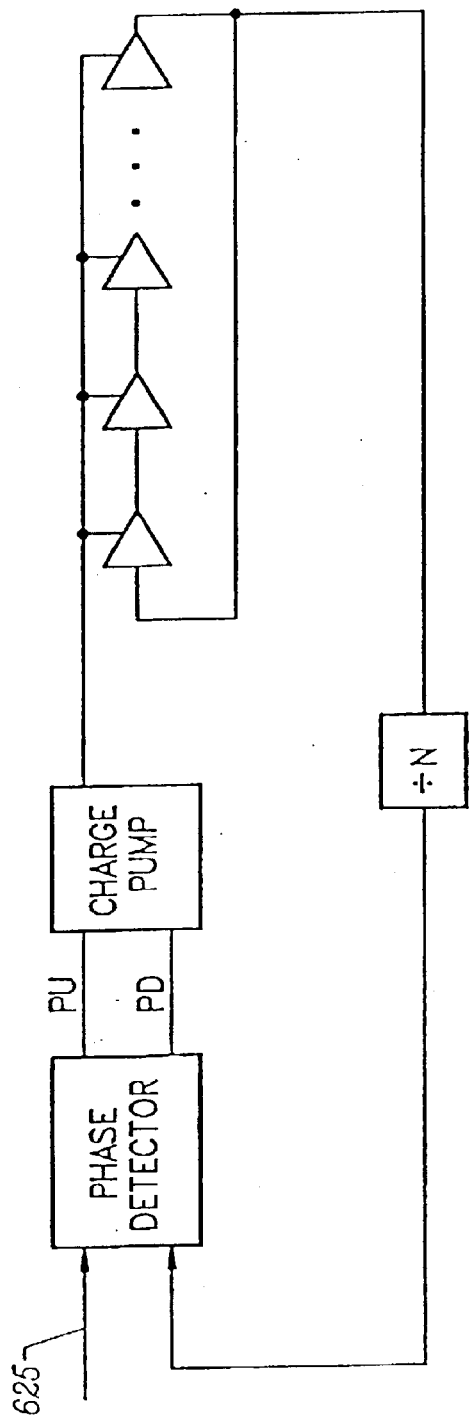
FIG. 19 shows a phase locked loop circuit for the clock generation circuitry of the present invention.

FIG. 19 shows a schematic of a frequency multiplier using PLL circuit arrangement. Clock 625 is input to a phase detector. The phase detector generates PU and PD signals for a charge pump. An output of the charge pump is coupled to a number of delay cells arranged in a ring oscillator arrangement. An output from one of the delay cells is fed back through a frequency divider (÷N) circuit to the phase detector.

Figure 20:
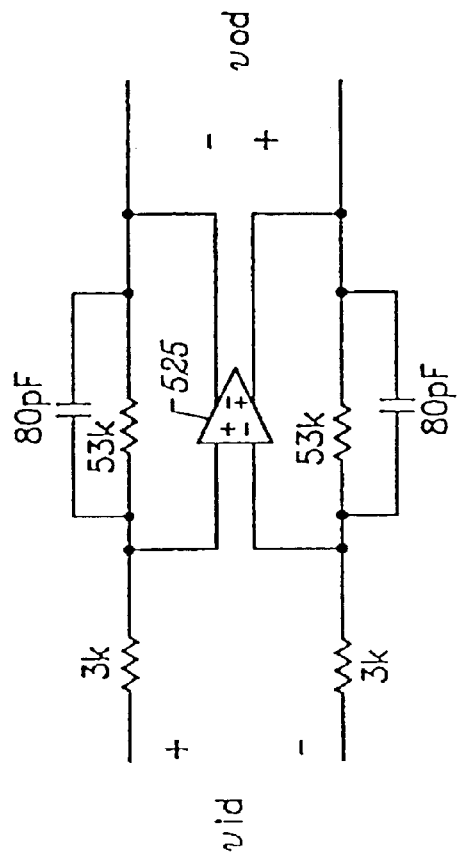
FIG. 20 shows a specific implementation of a preamplifier.
Figure 21:
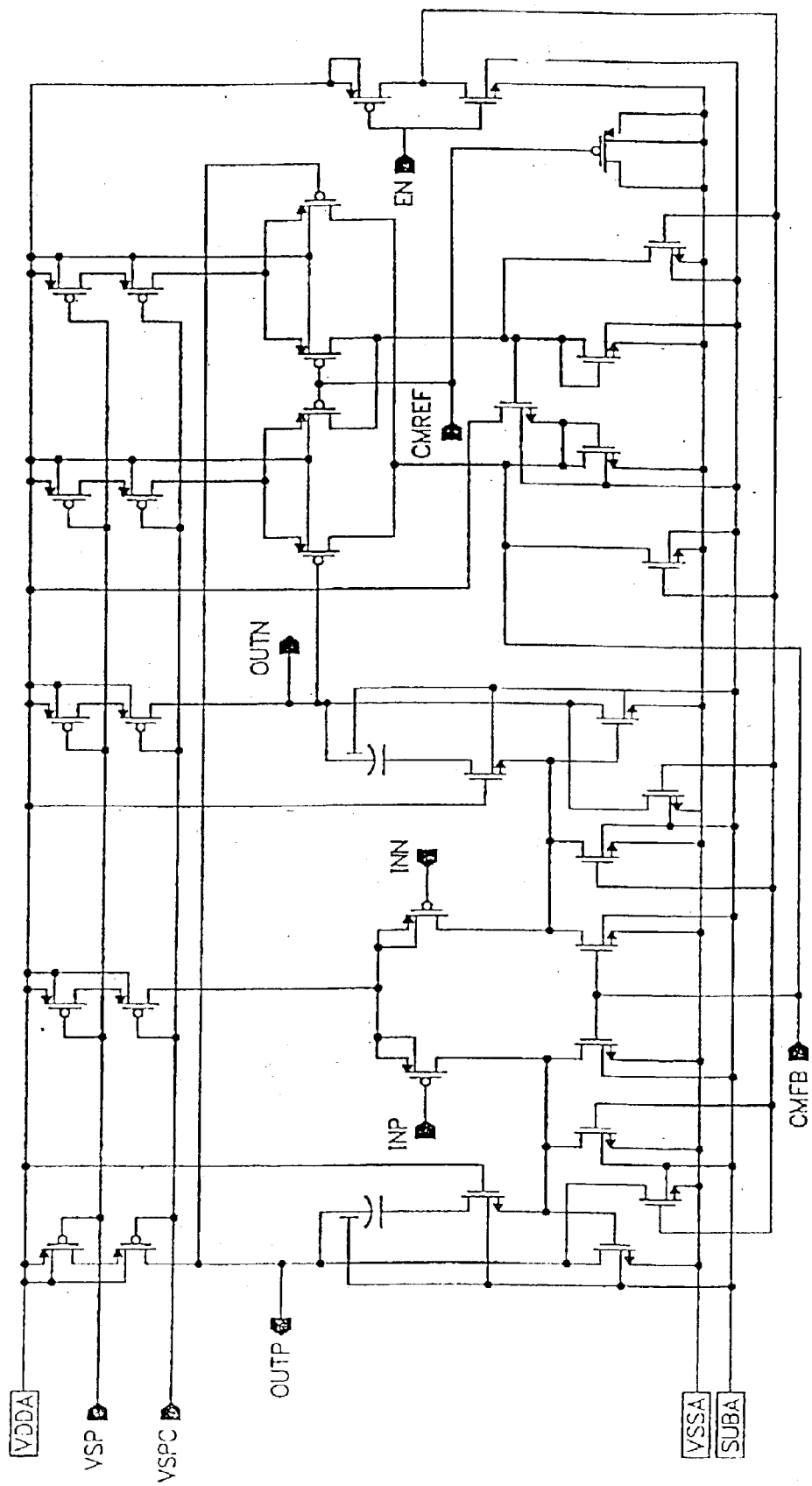
FIG. 21 shows a more detailed diagram of the preamplifier of FIG. 20.

FIG. 20 shows a specific implementation of preamplifier 405 of FIG. 4. The circuitry uses a fully differential operational amplifier 525 connected with common mode feedback. ANAIN+ and ANAIN− are input at Vid+ and Vid−, respectively. A differential output is taken at Vod+ and Vod−. The gain of this preamplifier 405 is about 17.667 or about 25 decibels (dB). The gain of the preamplifier may range from about 20 to 30 decibels. For example, the gain may be about 23 decibels. FIG. 21 shows a circuit schematic of the differential operational amplifier circuitry of FIG. 20. This design uses MOS transistors. The inputs are INP and INN. Output is taken from OUTP and OUTN.

Figure 22:
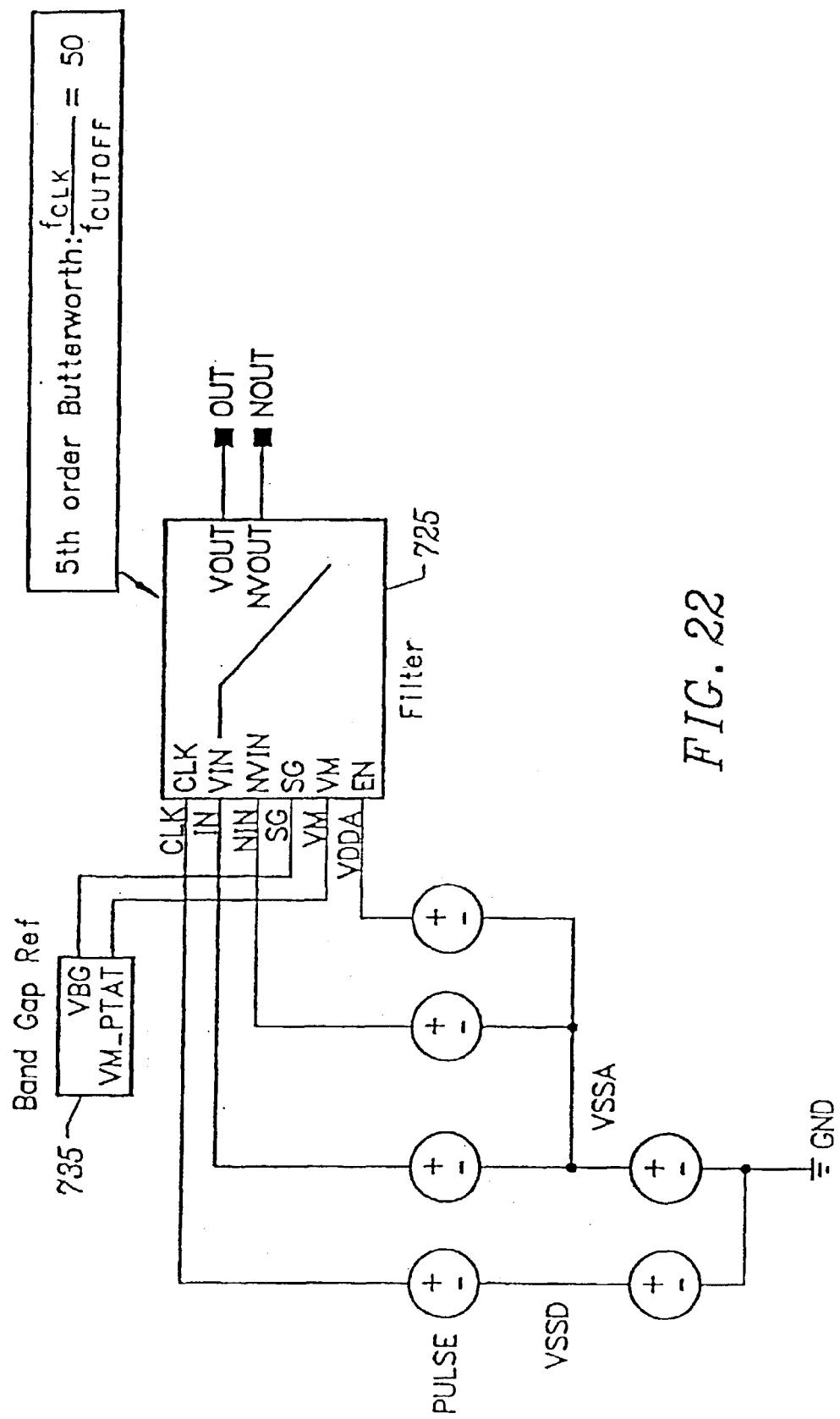
FIG. 22 shows a block diagram of a low pass filter.

FIG. 22 shows a block diagram of low pass filter 411 of FIG. 4. In this implementation, a filter 725 is a fifth-order Butterworth filter where $f_{CLK}/f_{CUTOFF}$ is at least 50. In further embodiments of the present invention, the $f_{CLK}/f_{CUTOFF}$ is 75 or greater. Moreover, the filter may have an $f_{CLK}/f_{CUTOFF}$ in a range from about 50 to about 100. This filter is sampled data filter that provides sampled data at its differential outputs, OUT and NOUT. A bandgap reference 735 generates a bias voltage reference for filter 725. Other types of sampled data filters may also be used. These include Chebychev, Bessel, elliptic, polynomial, and various implementations of switched capacitor filters, among others. The filter used may also be a continuous time filter, where the data is sampled in a different manner.

Figure 23:
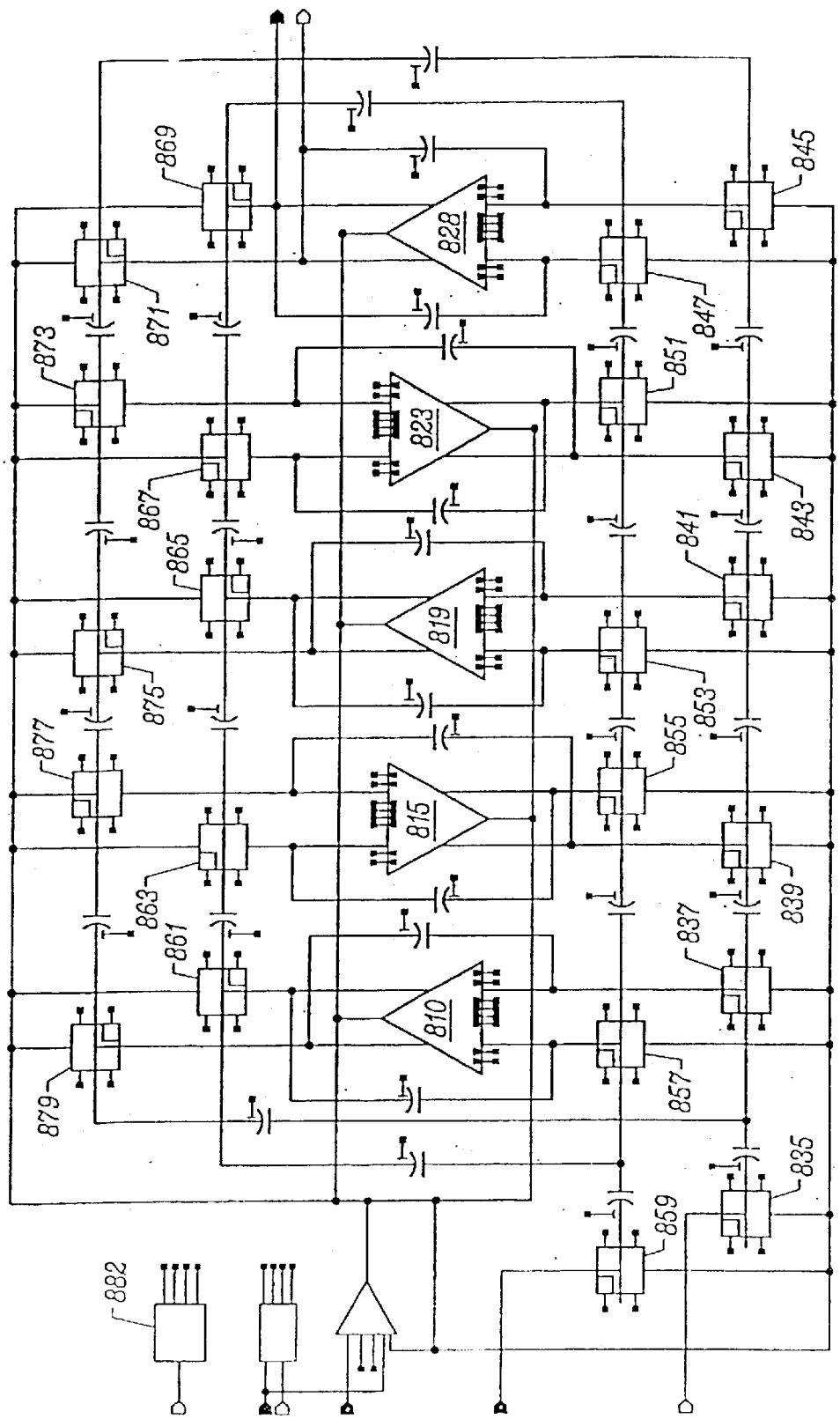
FIG. 23 shows a more detailed diagram of a low pass filter.

FIG. 23 shows a more detailed diagram of the sampled data Butterworth filter of FIG. 22. The circuitry includes five operational amplifiers 810, 815, 819, 823, and 828. A number of switches 835, 837, 839, 841, 843, 845, 847, 851, 853, 855, 857, 859, 861, 863, 865, 867, 869, 871, 873, 875, 877, and 879 are coupled to the amplifiers. The switches are coupled to clocks generated by a nonoverlapping clock buffer 882. The switches are AC switches of the type used to implement switched capacitor circuitry.

Figure 24:
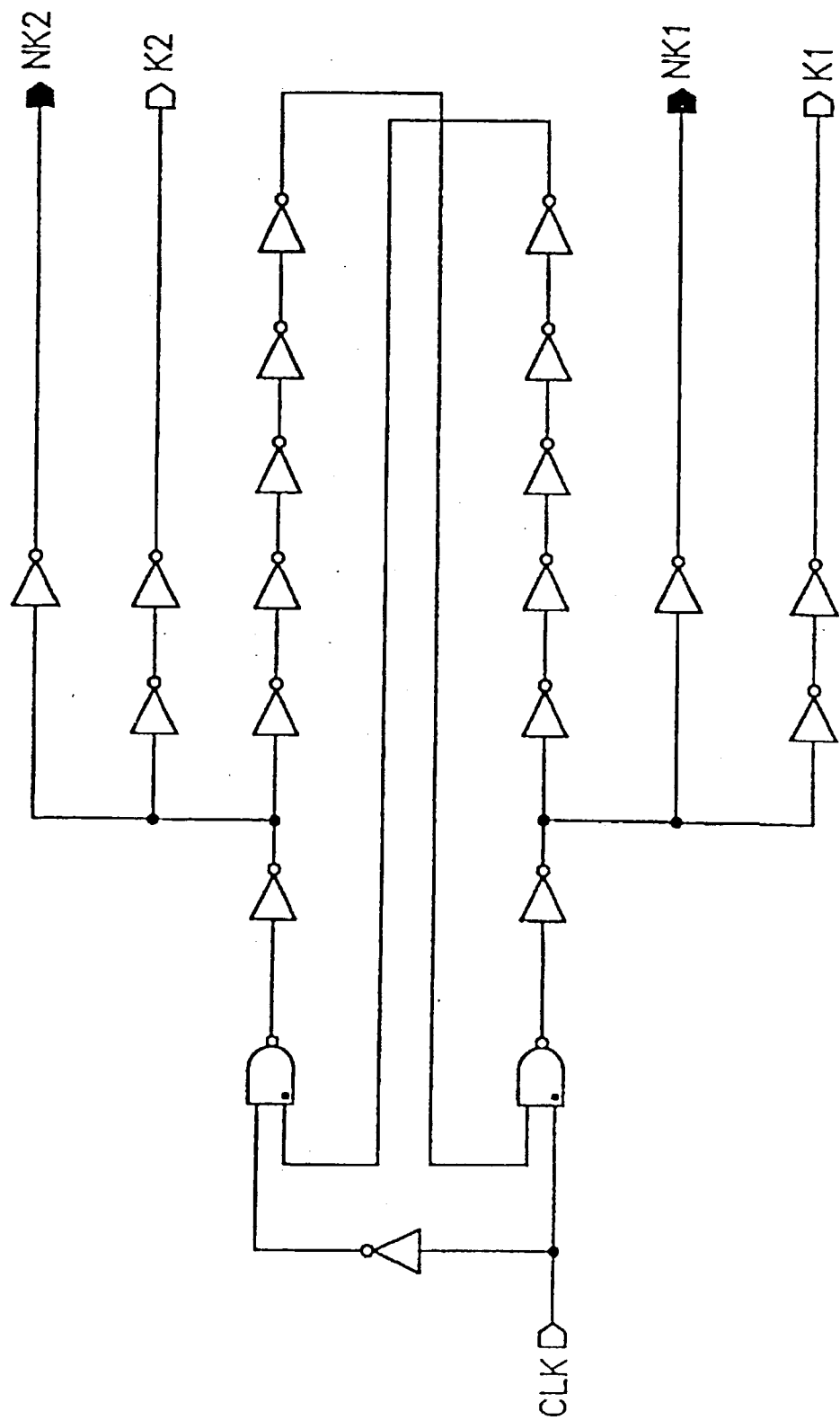
FIG. 24 shows an implementation of a clock buffer.
Figure 36:
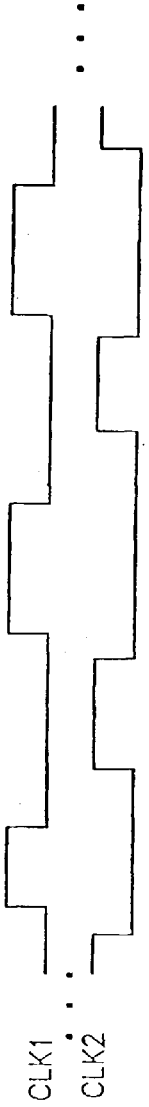
FIG. 36 shows a timing diagram of clocks for use with the circuitry in FIG. 35.

FIG. 24 shows an implementation of nonoverlapping clock buffer 882. A clock signal is input at CLK. The resulting complementary pairs of clock signals are K1 and NK1, and K2 and NK2. These clock signals are input to the AC switches and are nonoverlapping. Nonoverlapping means the active phase K1 is terminated before the next active phase K2. In other words, only one of the complementary clock signals is high, or low, at a time. FIG. 36 shows an example of nonoverlapping clock signals CLK1 and CLK2.

Figure 25:
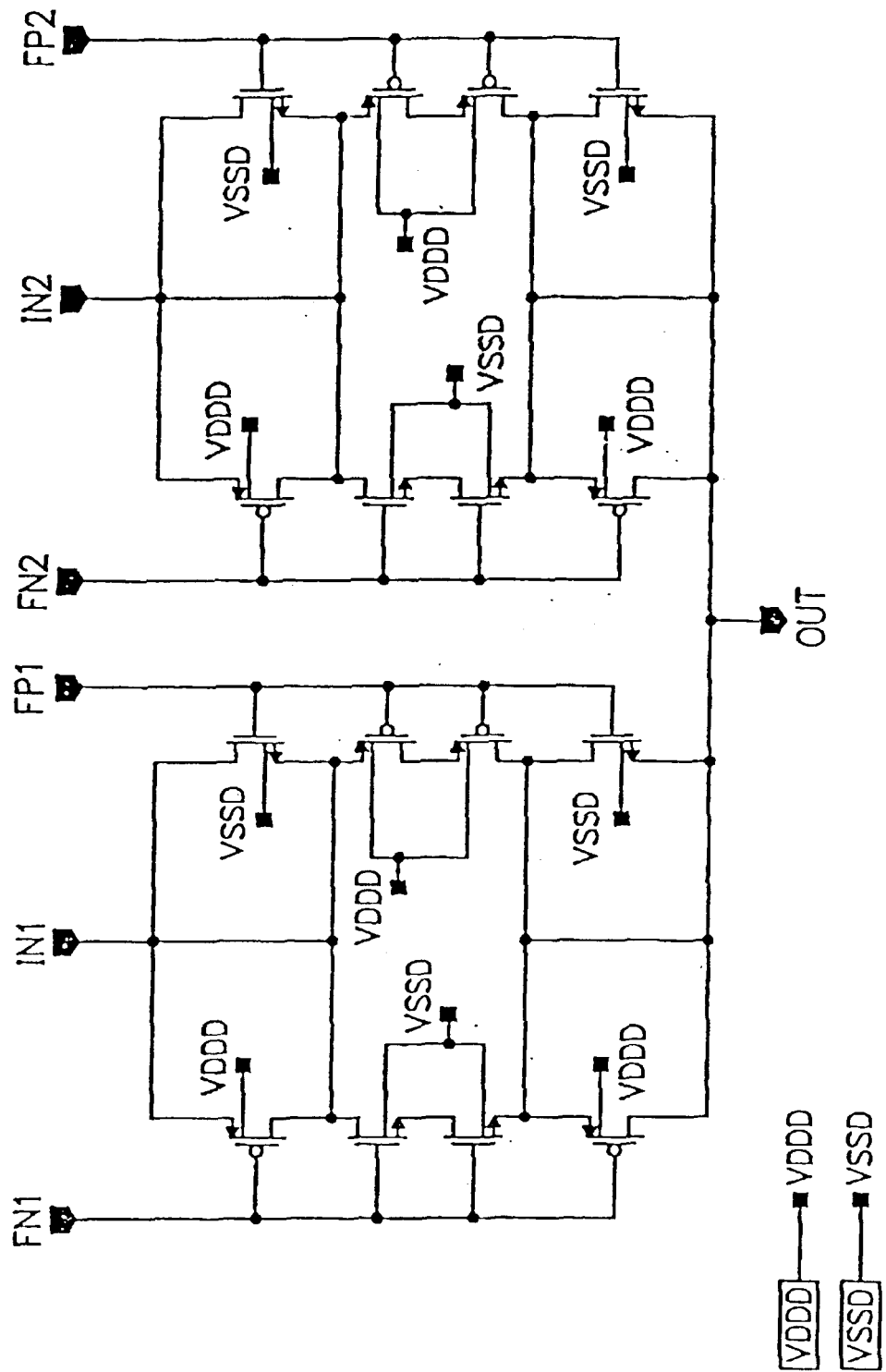
FIG. 25 shows an implementation of a switch.

FIG. 25 shows an embodiment of a switch circuit. Many of such switches are used to implement the filter in FIG. 23. Such switches are also used to implement the other AC switches on the integrated circuit. IN1 and IN2 are the inputs. OUT is the output. FN1 and FP1 are complementary, nonoverlapping clock signals. FN2 and FP2 are also complementary, nonoverlapping clock signals. When FN1 and FP2 are high and FP1 and FN2 are low, OUT will be IN1. When FN1 and FP2 are low and FP1 and FN2 are high, OUT will be IN2.

Figure 26:
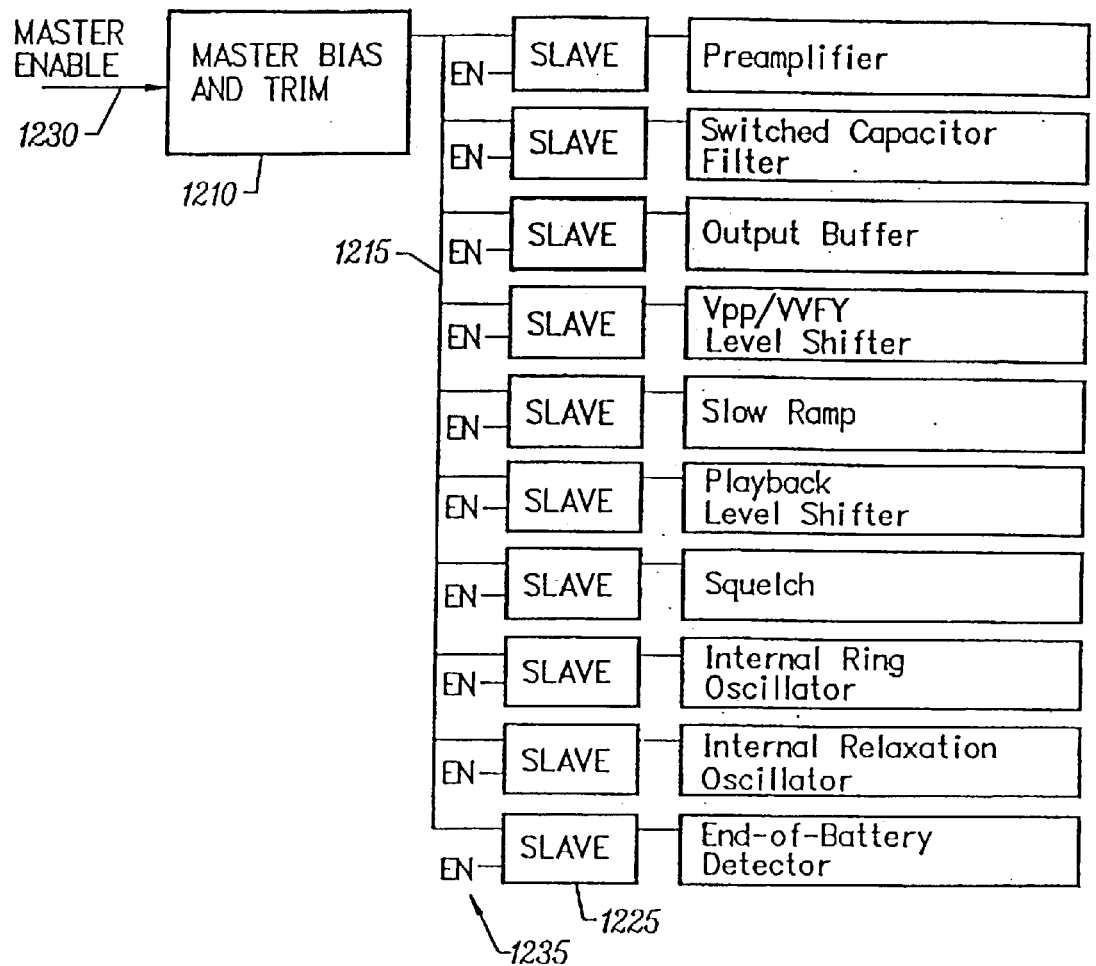
FIG. 26 shows a diagram of an arrangement of a master-slave biasing scheme.

FIG. 26 shows a diagram of a master-slave bias arrangement of the present invention. The master bias generator 1210 generates a bias voltage 1215 for a number of slave bias circuits 1225. There is typically only one master bias generator. The master bias generator has a master enable input 1230 to control whether the master bias generator is enabled. When enabled or on, the master bias generator generates the bias voltage or bias voltages. When on, the master bias generator consumes power. When disabled or off, the master bias generator does not generate the bias voltage or bias voltages and does not consume power. It is desirable to have only one or very few master bias generators on the chip in order to provide uniform bias voltages and reduce power consumption.

The master bias generator is connected to a number of slave bias circuits, each of which outputs a bias voltage derived or based on the master bias generator. Each slave bias circuit 1225 also has a local enable (EN) input 1235. The local enable input is used in the same way as the master enable input. When the local enable is off, the slave bias circuit will not output a bias voltage and does not consume power. When the local enable is on, the slave bias circuit output the bias voltage and consumes power.

By using the master-slave bias arrangement of the present invention, local circuits receiving the bias voltage through one slave bias circuit are isolated from other local circuits receiving the bias voltage through a different slave bias circuit. Thus, noise and other artifacts generated at a particular location are less likely to be coupled back to the master bias generator, and through other slave bias circuits, to circuits in another location. This is especially important in facilitating a stable bias reference voltage. Furthermore, individual slave bias circuits 1225 have individual local enable pins 1235. This allows power to be saved since the slave circuit can be turned off when particular circuits do not require the bias voltage. For example, a particular portion of the circuitry may be used only during the testing of the device. To conserve power, the slave bias circuit for that portion of the circuitry will be turned off for operations other than testing.

FIG. 26 also shows circuit or functional blocks of the integrated circuit that are connected to individual slave bias circuits. The preamplifier, switch capacitor filter or low pass filter, output buffer, VPP and VVFY level shifter, squelch circuit, internal ring oscillator (to run the charge pumps), internal relaxation oscillator (to generate the sampling frequency), and end-of-battery detector are connected to individual slave circuits. The functionality of these blocks is described in more detail elsewhere in this specification.

While operating the integrated circuit, certain functional blocks are not used when other functional blocks are being used. For example, the VPP and VVFY level shifters are not typically used at the same time as the playback level shifter. This is because the memory cells are generally not written to and read from at the same time. In cases such as this, the slave bias circuit for the unused or nonoperated circuitry can be turned off. This will save power and also further enhance the isolation between the bias voltage output lines of the slave bias circuits.

Further, it is desirable to have separate slave bias circuits for the circuit blocks where isolation of the bias output lines is important. For example, the slave bias circuit for the internal ring oscillator is separate from that for the internal relaxation oscillator. This will help prevent noise or other effects of one oscillator from affecting the other oscillator. Another example of where separate slave bias circuits are desirable is for the digital and analog circuitry. The analog circuit will be connected to different slave bias circuits from the digital circuits.

Figure 27:
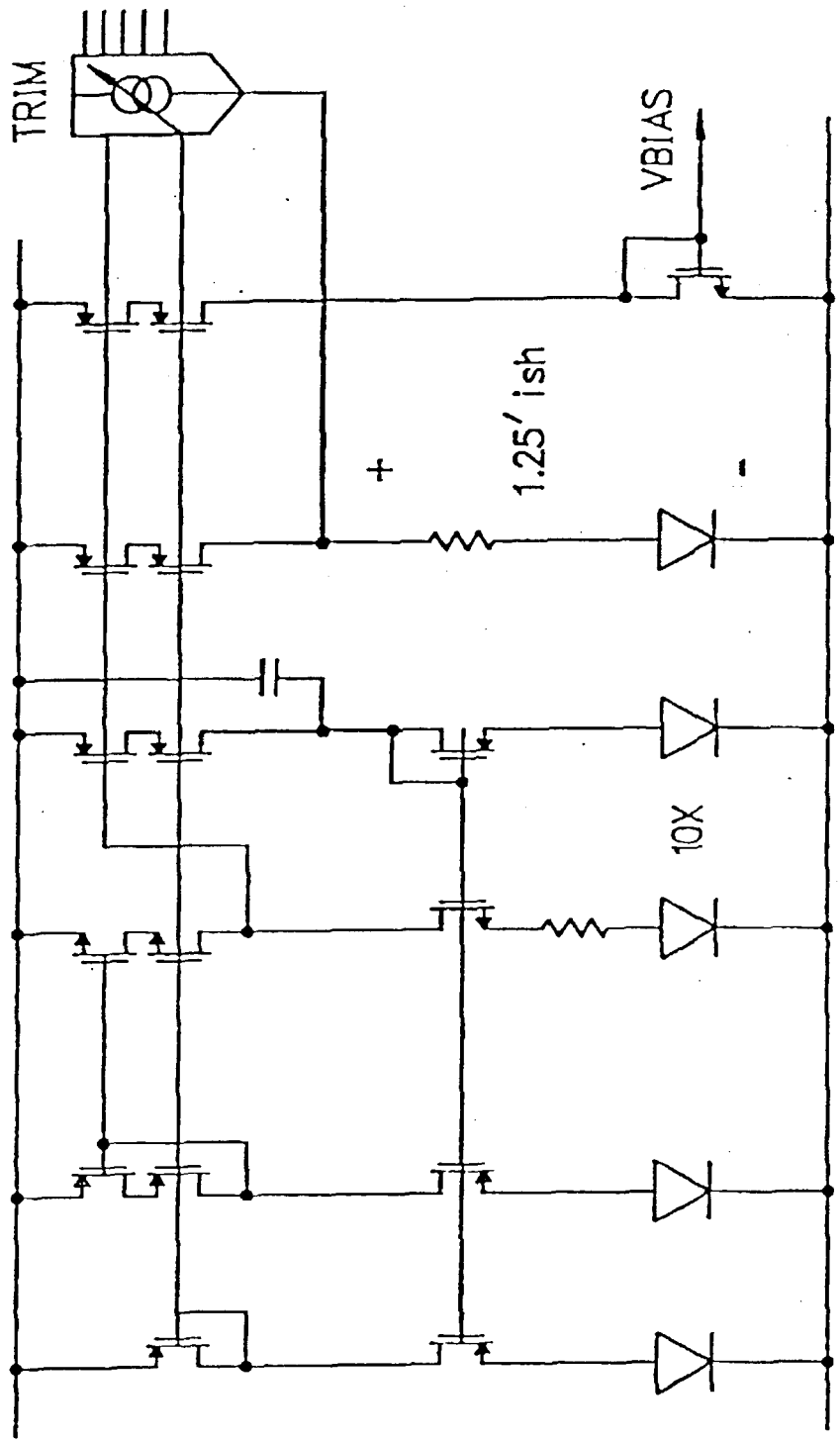
FIG. 27 shows circuitry that may be used to implement the master bias voltage or other bias voltages for an integrated circuit of the present invention.

FIG. 27 shows a diagram of circuitry that may be used to implement the master bias voltage or other bias voltages. The particular circuitry shown in FIG. 27 is for a bandgap reference voltage generator. The bandgap reference voltage provides a stable, constant voltage reference relative to changes in power supply voltages, temperature, and pressure, among other factors. Other circuitry, other than a bandgap reference, may be used to generate a reference voltage. These may also be used to implement the master bias voltage.

Figure 28:
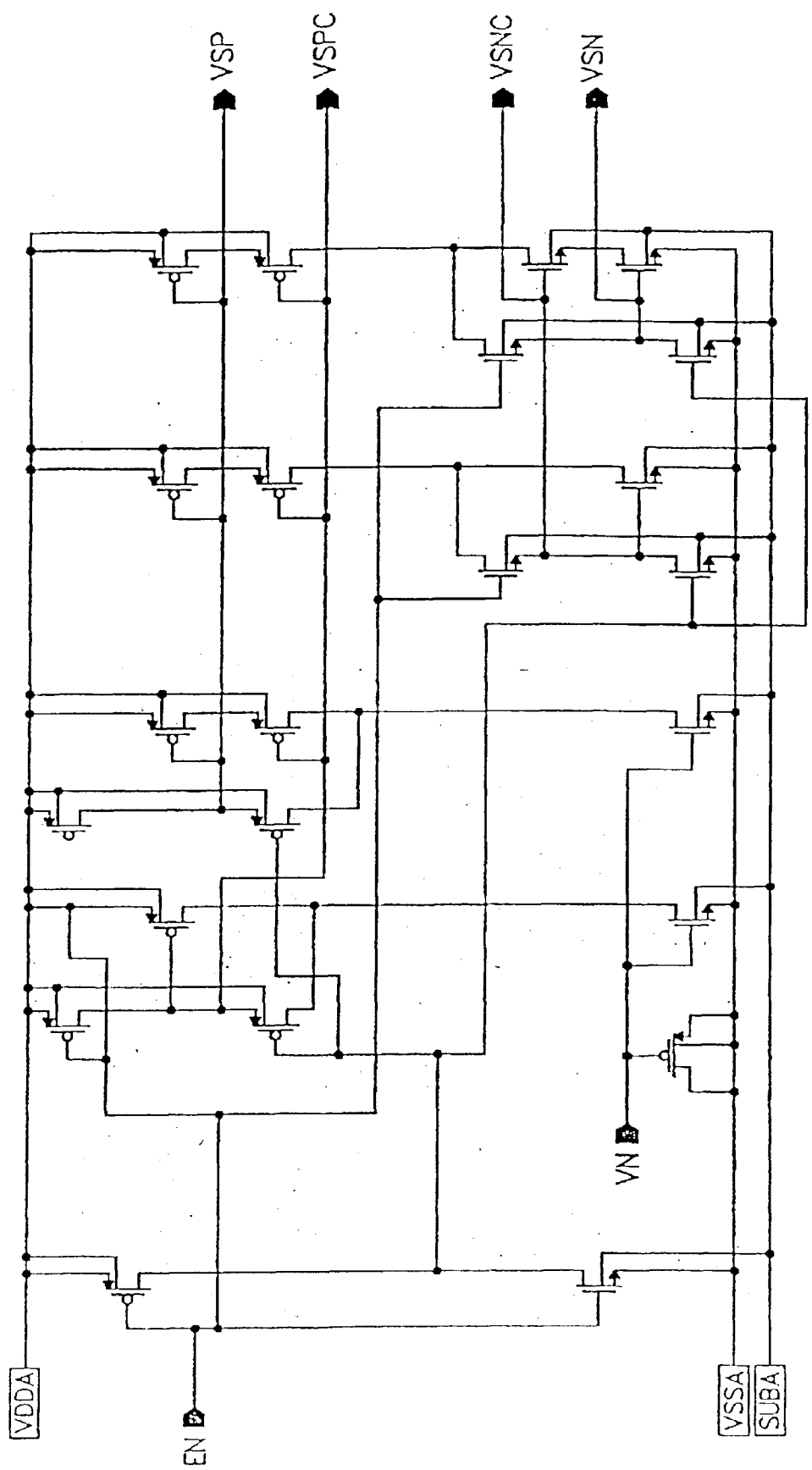
FIG. 28 shows a more detailed diagram of a slave bias circuit.

FIG. 28 shows a more detailed diagram of a slave bias circuit. This specific configuration has an enable input EN to control whether bias voltages are generated at outputs VSP, VSPC, VSNC, and VSN. When EN is a logic high, bias voltages are generated. When EN is a logic low, the slave circuit will not generate bias voltages, and the circuitry will consume essentially zero power. A VM input is a bias voltage input used to generate the bias voltages. VM is connected to the master bias generator. The slave bias circuit used VM to generate multiple bias voltages. VSP will be about a VT below VDD. VSPC will be about 2*VT below VDD. VSNC will be about 2*VT above ground. VSN will be about a VT above ground.

Figure 29:
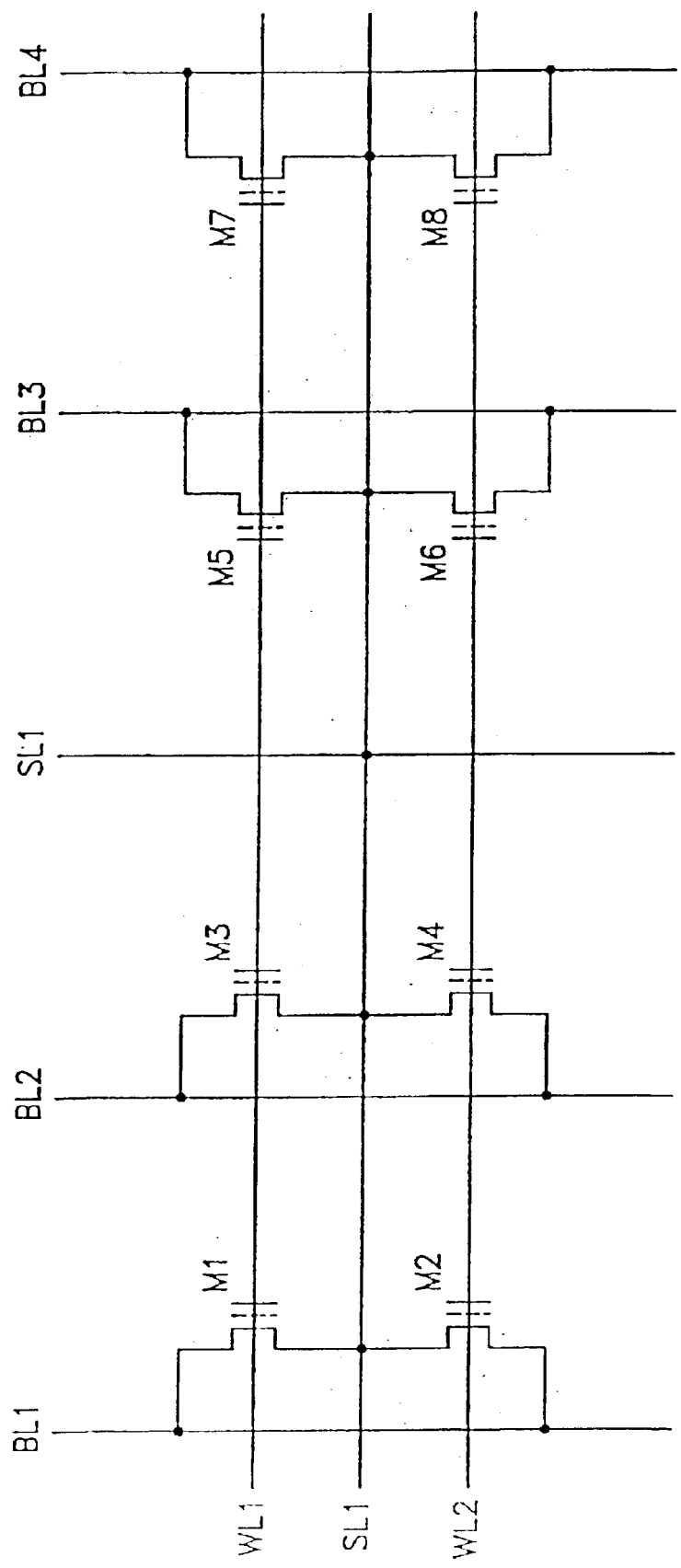
FIG. 29 shows a diagram of a memory array.

FIG. 29 shows a diagram of a portion of a memory array of the present invention. Individual memory cells are arranged in rows and columns. FIG. 15 shows eight memory cells M1, M2, M3, M4, M5, M6, M7, and M8. The memory-transistors are floating gate memory cells such as EEPROM or Flash. As many memory cells as desired may be added to the array by repeating or mirroring this structure. Word lines WL1 and WL2 coupled to the control electrodes or gates for two different rows of memory cells. Bit lines BL1, BL2, BL3, and BL4 coupled to four different columns of memory cells. These memory cells share a common source line SL1. Moreover, for example, an array may have 1K, 10K, 100K, 500K, 1M, 2M, 4M, 6M, 8M, 10M, 12M, 16M, 20M, 32M, 64M cells or more. As discussed previously, a practical implementation of the present invention using present technology has about 1.92 million or less memory cells. As technology advances, it will undoubtedly be possible to have more memory cells on the integrated circuit. For example, a chip twice the size will have 3.84 million memory cells. This "double sized" memory will store approximately sixteen minutes of voice data when using a 4 kilohertz sampling frequency. The cells are organized by rows and columns.

FIG. 29 shows a sector or page of memory cells. Since the memory cells have a common source line, all the memory cells in the sector are erased at the same time. Memory cells in one sector will have a different source line from memory cells in other sectors. The memory is organized in sectors to allow a group of memory cells to be more easily erased. It is undesirable to use too large a sector size or else too much data is erased at one time. Then, it is likely much of the data will need to be rewritten into the memory.

In a specific embodiment, the nonvolatile analog memory cells are fabricated using Flash technology. Flash technology provides reprogrammable, nonvolatile memory cells. Flash transistor may be written, erased, and rewritten an indefinite number of times. In this written description, writing the Flash memory cells may also be referred to as "programming" the cells. And, programming the cells means a stored threshold voltage (VT) of the memory cells will be increased. For example, Flash transistor may be operated for about 300,000 or more erase and write cycles. Also, Flash transistors retain their stored value even when power is removed from the integrated circuit. It is expected the data retention time is better than 100 years.

A memory cell may be a single Flash transistor having a floating gate. Electrons are transferred to and from the floating gate. The quantity of electrons stored on the floating gate will be representative of the memory cell's stored value. The quantity of electronics stored on the floating gate, and hence the cell's stored value is determined by finding a threshold voltage (VT) of the transistor. For example, the threshold voltages for a Flash transistor typically range from about 3 volts to about 5.5 volts. The voltages or stored VTs in this range are used to represent the different stored values. The range for VT is technology dependent and will vary. The threshold voltage for the Flash transistor may also be negative in some applications of the present invention. For EEPROM cells, the VT range will be from about −2 volts to about 3 volts.

A Flash transistor is programmed or written by placing electrons on the floating gate. Programming can be accomplished by generating a programming current through the transistor sufficient to generate hot electrons. The programming current through a Flash transistor may range from about 200 microamps to about 3 milliamps, or more. A typical programming current would be about 0.5 milliamps to about 2 milliamps. For some Flash transistors, programming currents of less than 200 microamps are used. For example, some Flash transistor are programmed with about 10 microamps. Some hot electrons will jump the potential barrier and become embedded in the floating gate of the Flash transistor. Flash transistors are erased by removing electrons from the floating gate using such mechanisms as Fowler-Nordheim tunneling. Essentially, electrons are attracted out of the floating gate by placing a relatively large positive voltage on the source line.

Many other technologies may also be used to implement the memory cells of the present invention. For example, EEPROM or EPROM technology may also be used instead of, or in combination with, Flash technology. For EEPROM technology, the EEPROM transistors having a floating gate can be programmed using Fowler-Nordheim tunneling. Analog memory cells may be implemented using other technologies including dynamic RAM (DRAM) cells by controlling the amount of charge stored on the capacitor; ferroelectric RAM (FRAM) cells by controlling the electric polarization of the ferroelectric material; and antifuses by controlling the resistance or other electrical property of the antifuse link. Other technologies may include charge-coupled devices (CCDs) and fuses, among others.

Flash transistor technology provides certain advantages compared to EEPROM technology. The time for hot electron programming of Flash cells is much shorter than the programming time of EEPROM cells. Typically, Flash cells may be programmed about 100 times faster than EEPROM cells. The programming time for Flash cells is typically about 125 microseconds, although less time (e.g., 63 microseconds) is often sufficient. Since the programming time is shorter with Flash cells, an integrated circuit with Flash technology can be operated with a higher sampling frequency because less time is needed before taking the next sample. Furthermore, the samples are "fresher" since less time has elapsed between the time the sample was taken and the sampled data is stored. "Fresher samples" refers to samples that are free of sample and hold "droop" errors, which can be caused by charge loss or leakage during the hold mode. By using fresher samples, this results in less distortion. Flash cells are also smaller than EEPROM cells, so larger numbers of Flash cells may be fabricated on the same integrated circuit area. The circuitry overhead for interfacing with and configuring Flash transistors is also comparatively less than for EEPROM transistors. Generally, there are many benefits to using Flash technology as compared to other floating gate technologies including EEPROM technology.

In other embodiments of the present invention, the memory cells or a portion of the memory cells may be one-time programmable (OTP) instead of reprogrammable. The OTP cells can be used for setting options on the integrated circuit. An example of another use of OTP memory is to store prerecorded sound, music, video, or pictures. OTP integrated circuits of the present invention may be sold much like prerecorded cassettes, CDs, minidiscs, videotapes, videodiscs, and DVDs. OTP cells can be implemented using the same technology used to implement the reprogrammable cells. However, OTP cells cannot be erased because the circuitry is designed not to allow erasure.

Figure 30:
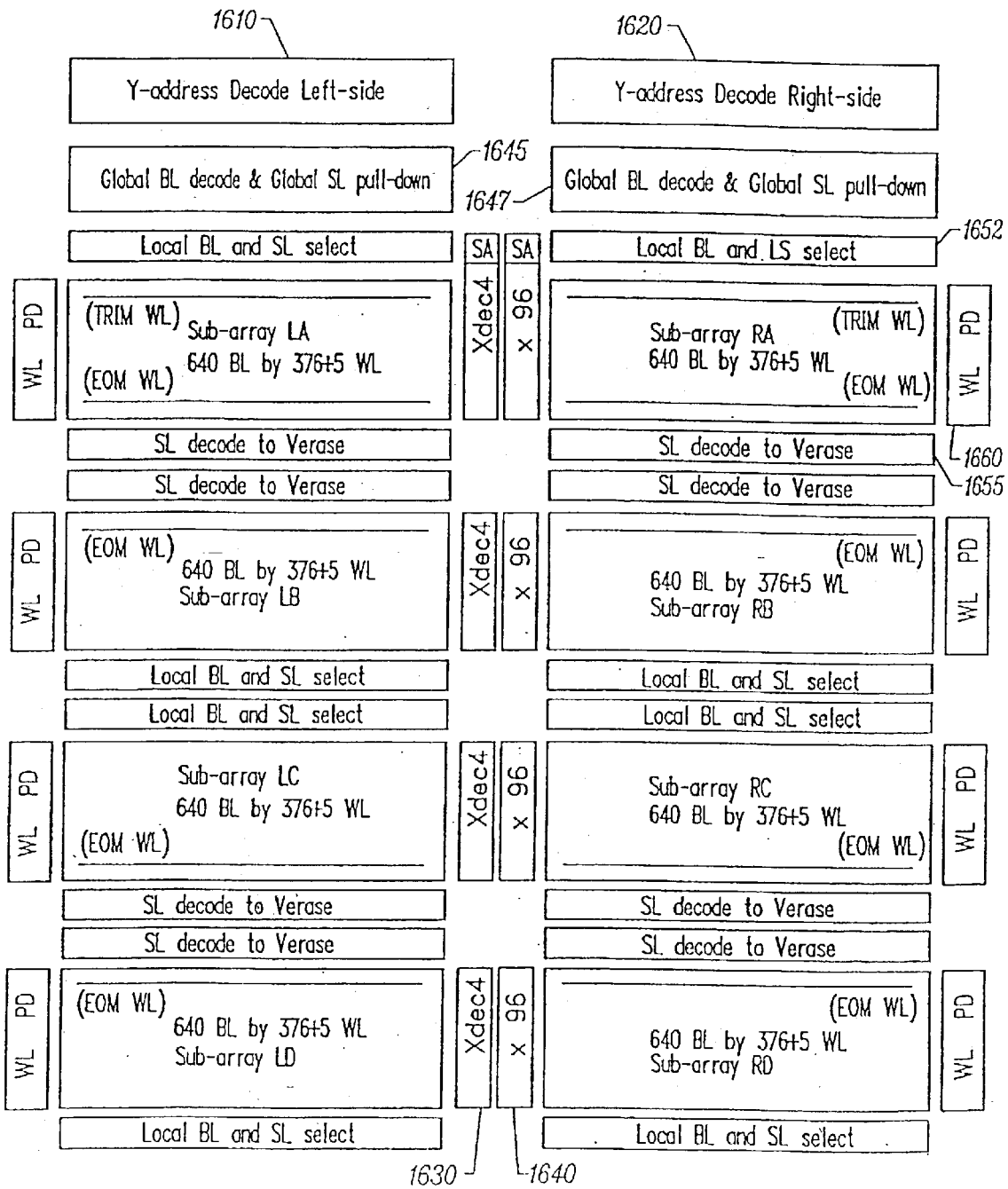
FIG. 30 shows a diagram of an organization of a memory array.

FIG. 30 shows a diagram of an organization of a memory array of the present invention. There are many possible arrangements for memory cells in an integrated circuit of the present invention. FIG. 30 shows one specific example where the memory cells are organized in subarrays. Subarrays on a left side are labeled LA, LB, LC, and LD. Subarrays on a right side are labeled RA, RB, RC, and RD. A subarray has row or word lines (WLs) and column or bit lines (BLs). The subarray is further segmented in sectors. A sector of memory cells can have different bit lines, but these memory cells share the same source line (SL). As discussed above, this permits the erasure of a sector of memory cells at one time.

Figure 31:
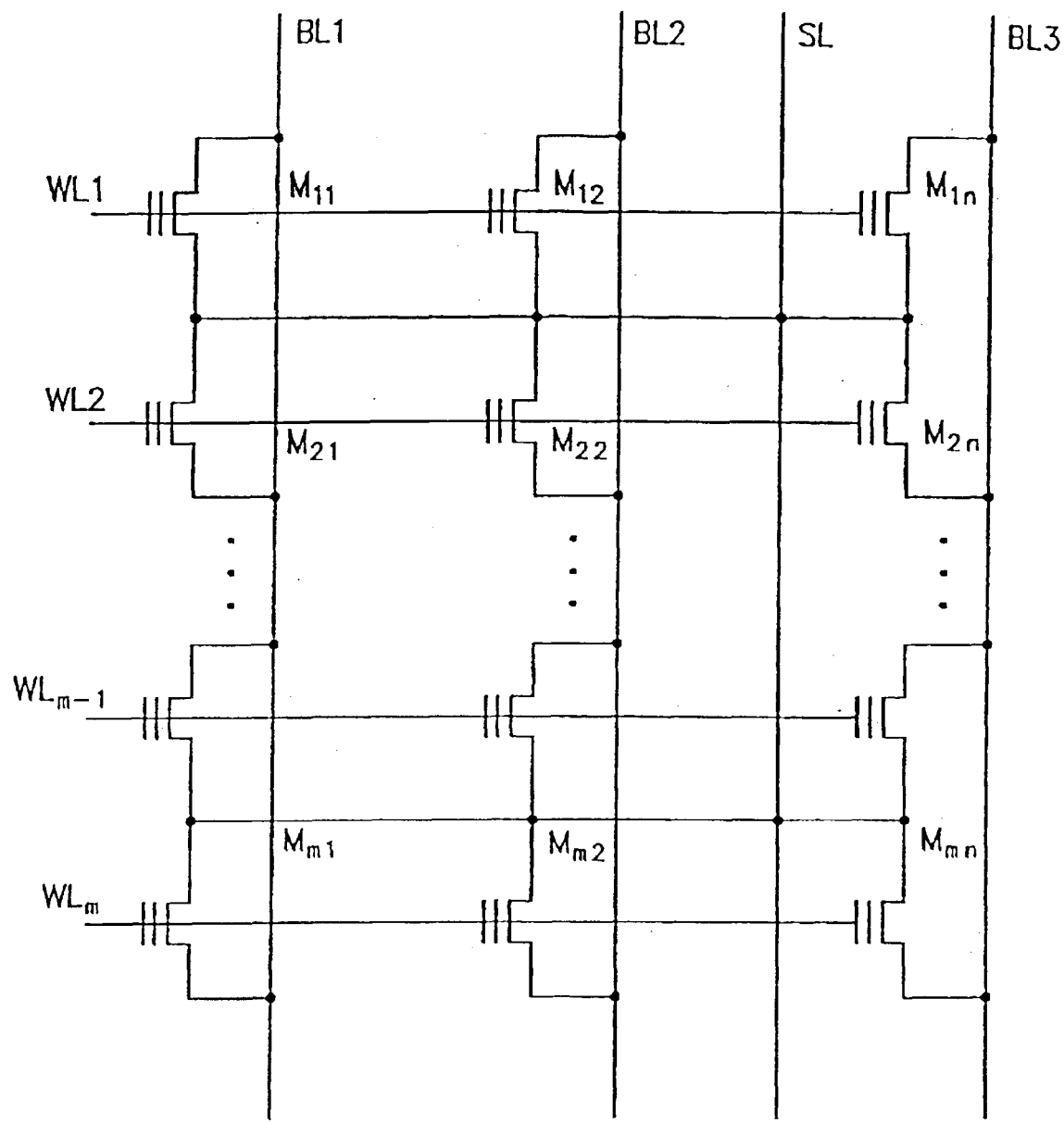
FIG. 31 shows a plurality of memory cells sharing a common source line.

Another example of a configuration for a sector of memory cells is shown in FIG. 31. In FIG. 31, there are a number of memory cells M11 to Mmn having a source line SL connected in common for the cells. The memory cells have word lines WL1 to WLm and bit lines BL1 to BLn. Other configurations for sectors of memory cells may share one or more word lines, or one or more bit lines. There may be any number of cells in a sector. For example, in one embodiment, there are 1504 cells in a single sector that is organized as 4 bit lines and 376 word lines.

FIG. 30 shows circuitry for a Y-address decoder 1610 for the subarrays on left side, and for a Y-address decoder 1620 for the right side. Further, there are X-address decoders 1630 and 1640 for the each of the subarrays. The X-address decoders are located between the subarrays. There are global bit line decoders 1645 and 1647 for left and right subarrays, respectively. The subarrays have local bit line and source line select circuitry 1652 and source decode to $V_{erase}$ circuitry 1655. Also, there is a word line decoder 1660 for each of the subarrays. The decoders are divided into pull-up and pull-down decoders. All decoders may be on one side, either the pull-up or pull-down side. In a specific embodiment of the present invention, decoders 1640 are pull-up decoders while decoders 1660 are pull-down decoders.

Within each subarray, one word line is designated as an end of message (EOM) word line (i.e., EOM WL) that is used to gate memory cells to indicate whether a message ends within a sector. Also, there is a trim word line (i.e., TRIM WL) in one or more of the subarrays. The trim word line includes memory cells that are configured to enable or disable options for the integrated circuit. The memory cells along the trim word line may be one-time programmable.

In a specific layout of the cells in FIG. 31, in the vertical direction, the bit lines of the memory cells are run in diffusion and metal-1. There will be polysilicon-1 stripes. Source lines are run in metal-1. To allow signals to pass, two global bit lines are in metal-2, one global source line is in metal-2, and two passing source lines are in metal-1. In the horizontal direction, word lines are run in polysilicon-2. And, a common source diffusion is shared by the bit lines.

U.S. provisional application No. 60/091,326 provides a further description of the memory array. In brief, in a specific example of an integrated circuit of the present invention, there are a total of 1.92 million bits of Flash cells for user voice or digital data storage. The cells are segmented into eight subarrays of about 240K bits. A subarray is arranged to have 640 bit lines by 376 word lines. The actual physical layout for each subarray will typically have more bit lines and word lines. For example, there are 648 bit lines and 384 word lines. The additional bit lines and word lines are used for end of message, trim, and array-edge protection purposes. Global bit lines and global source lines are run in metal-2 above or on top of the subarrays. These global lines are subsequently coupled to local bit lines and local source lines in order to address each cell individually.

Furthermore, each of the subarrays is further divided into 160 bit-line-based sectors. Each bit-line-based sector contains four bit lines that can be erased together through one common source line shared by the four bit lines. Each sector is made of 1504 user cells (4 rows*376 cells/row). A user sector includes a sector located within a left subarray and a sector located within a right subarray. There are 3008 cells per user sector, and each user sector may be selected by using a unique address. There are 640 (4*160) user-addressable sectors on a single chip.

Figure 32:
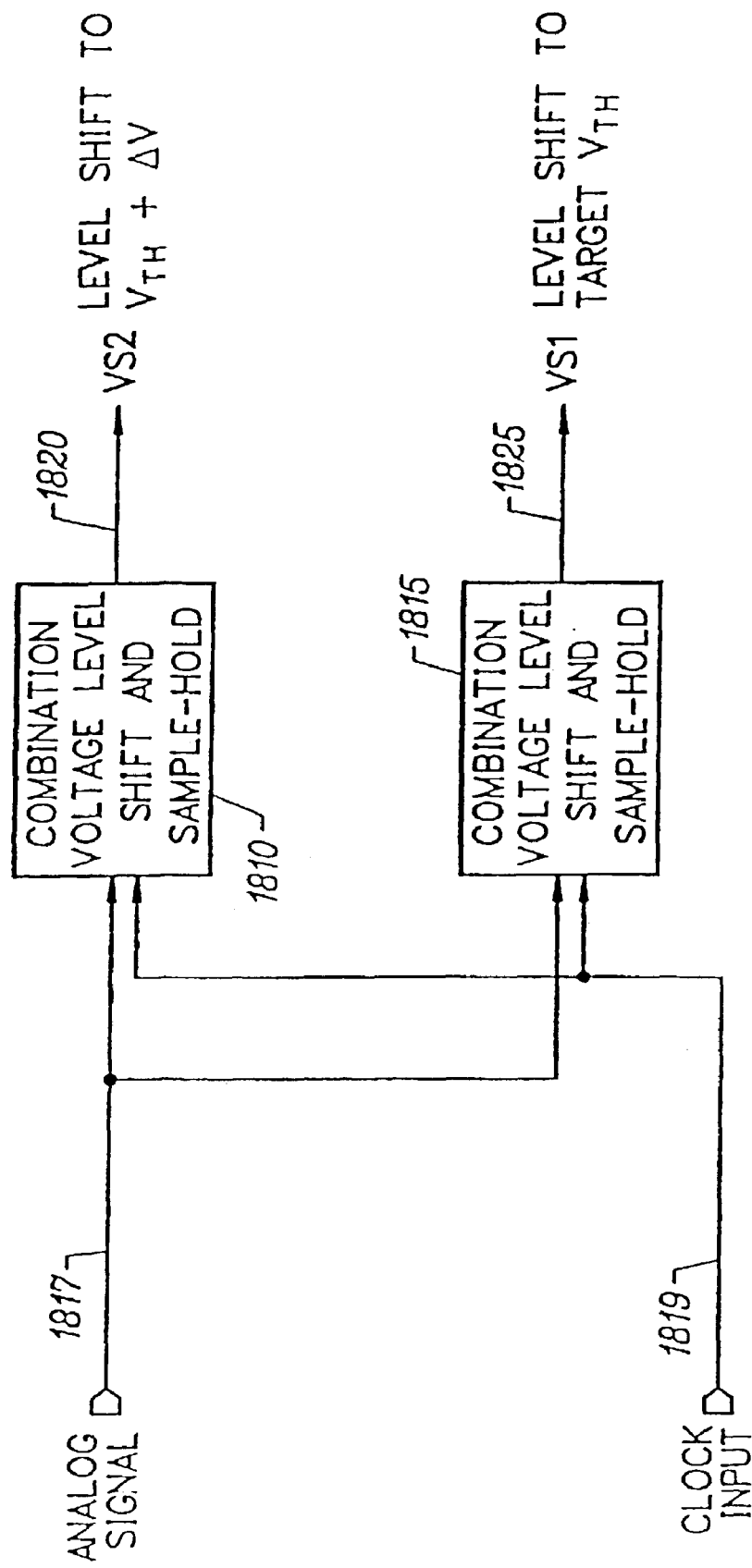
FIG. 32 shows circuitry for writing information in a memory cell.

There are many different techniques of implementing circuitry for writing or programming information into the memory array. Some techniques are discussed in U.S. Pat. No. 5,694,356, which is incorporated by reference. FIG. 32 shows an example of a specific implementation of the write circuit 414 of FIG. 4. Circuit blocks 1810 and 1815 each contain a combination of voltage level shifter and sample and hold (S/H) amplifier circuit. The level shifter and S/H circuit may also be implemented in separate or different circuit blocks. For example, the S/H circuit can be part of the low pass filter circuitry 411 of FIG. 4. This circuitry holds the data and generates voltage levels for storing the sampled data into a memory cell. The S/H circuit samples when the clock runs and holds when the clock is stopped on a low phase.

Inputs to the circuit blocks are a signal 1817 (which is typically analog) to be stored or recorded and clock inputs 1819. The analog signal comes from an antialiasing filter, such as low pass filter 411 or the Butterworth filter of FIG. 23. The clock inputs are from a nonoverlapping clock buffer such as shown in FIG. 24. Level shifter circuit block 1810 provides an output 1820. This level shifter can be referred to as a programming voltage or VPP level shifter circuit. Level shifter circuit 1815 provides an output 1825. This level shifter can be referred to as a target or verify (VVFY) voltage level shifter circuit. Output 1825 provides a level shifted voltage VS1 (or VVFY) corresponding to the target threshold voltage (VT) to be programmed into the memory cell. For typical Flash memory cells, the range of target VTs will be from about 2.5 volts to about 6 volts. Output 1820 provides a level shifted voltage VS2, which is the target VT plus an offset. During programming, VS2 is coupled to the control electrode or control gate of the memory cell so the memory will be programmed to the desired or target VT. In a specific embodiment, the offset voltage is about 5 volts. In this case, if the desired VT is 3.5 volts and the offset is 5 volts, the VS2 voltage will be 8.5 volts. Using two level shifters provides the advantage that the two level shifters may be independently adjusted in order to program memory cells more precisely.

The voltages generated and provided by the level shifters may be above the supply voltages for the integrated circuit. These high voltages are used to program and verify the memory cells. In order for the level shifters to provide these high voltages, high voltages can be generated on-chip using charge pump circuitry (discussed below). These high voltages are connected to the amplifiers of level shifters. Specifically, the generated high voltages are connected to the supply rails of level shifter circuitry. The level shifter will be able to generate a range of output voltages up to its supply voltage.

The writing techniques of the present invention use two level shifter circuits 1810 and 1815. By having the two level shifters, each may be adjusted independently from another to allow for proper and more precise programming of memory cells. Other programming methodologies may use a single level shifter or more than two level shifters. In a particular embodiment, in order to program multiple memory cells at one time, a number of level shifters are used in conjunction with another at the same time.

Figure 33:
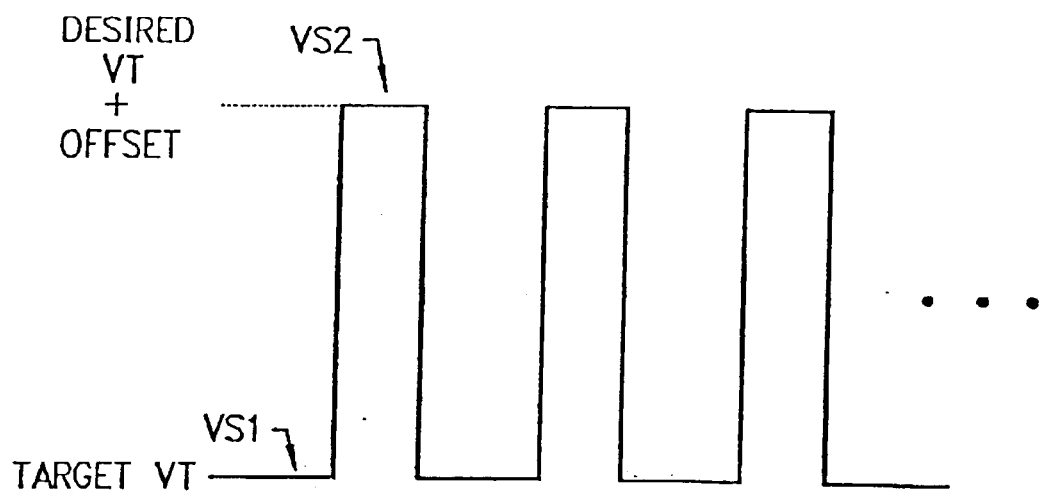
FIG. 33 shows a waveform of the programming voltage during programming.

In a technique of programming the analog memory cell according to the present invention, VS1 and VS2 are coupled alternatively to the control electrode or word line of the Flash cell. Typically, VS1 will be in a range from about 2 volts to about 7 volts. VS2 will be in a range from about 5 volts to about 13 volts. As shown in FIG. 33, at the control gate, there will be pulses between a target or desired VT level (VS1 level) and a desired VT level plus an offset voltage level (VS2 level). When VS1 is coupled to the control gate of the memory cell, the memory cell is evaluated whether or not it conducts current. Programming is completed when the memory cell no longer conducts. When VS2 is coupled to the control gate of the memory cell, the memory cell is being programmed. And, after repeated pulses of this VS2 voltage, the VT of the memory will eventually reach the desired VT level. The larger the offset voltage, the faster the memory cell will program.

The VS2 voltage is pulsed at the control electrode until the VT of the memory cell reaches the desired or target VT value. FIG. 33 shows a diagram of a waveform at the control gate of the Flash cell. A memory cell will be programmed using anywhere from a single pulse to about forty pulses, or more. Pulsing of VS2 continues until current stops flowing through the memory cell when VS1 is applied to its control electrode. At the point the memory cell no longer conducts current with VS1 at its gate, the memory cell's VT will be at the target VT level. As the analog signal varies, the VS1 and VS2 levels will also track the variation. A higher voltage analog sample will result in higher VS1 and VS2 voltages.

By selecting the appropriate values for the VS1 and VS2 voltages, the resolution and programming time for the memory cells are also adjusted. In an embodiment of the present invention, level shifters 1810 and 1815 are trimmable to allow adjustment of the VS1 and VS2 voltages without mask changes. The VS1 and VS2 voltages can be adjusted during testing (before or after packaging, or both) Of the integrated circuits to account for manufacturing and other variations. To provide better resolution, a technique of the present invention is to select the VS1 and VS2 voltages so that about fifty percent or more of the allowed time for programming is used. Better resolution is desirable because this results in the most precise storage representation of the original signal.

Generally, if fewer pulses are required to program a memory cell, this means the cell is programmed using coarser steps. However, the maximum amount of time available to program per sample is dictated by the sampling frequency, as shown in table B below.

TABLE B

| Sampling Frequency $f_{samp}$ | Time Per Sample | Max Recording Time For 1.92 M Cells |
| --- | --- | --- |
| 2 kHz | 500 $\mu s$ | 16 minutes |
| 4 kHz | 250 $\mu s$ | 8 minutes |
| 5.3 kHz | 188 $\mu s$ | 6 minutes |
| 6.4 kHz | 156 $\mu s$ | 5 minutes |
| 8 kHz | 125 $\mu s$ | 4 minutes |
| 16 kHz | 63 $\mu s$ | 2 minutes |
| 32 kHz | 31 $\mu s$ | 1 minute |
| 44 kHz | 23 $\mu s$ | 43 seconds |
| 128 kHz | 8 $\mu s$ | 15 seconds |

A memory cell should be programmed before the next sample. Shorter programming times are desirable to facilitate higher sampling frequencies. Therefore, level shifters 1810 and 1815 should be designed to support the desired level of resolution and fidelity. By providing trimmable circuitry so the VS1 and VS2 voltages are easily adjusted, this permits greater flexibility in addressing manufacturing variations and "tuning" parts to provide an optimum level of resolution. Particular integrated circuits may also be adjusted to suit the intended application.

Figure 34:
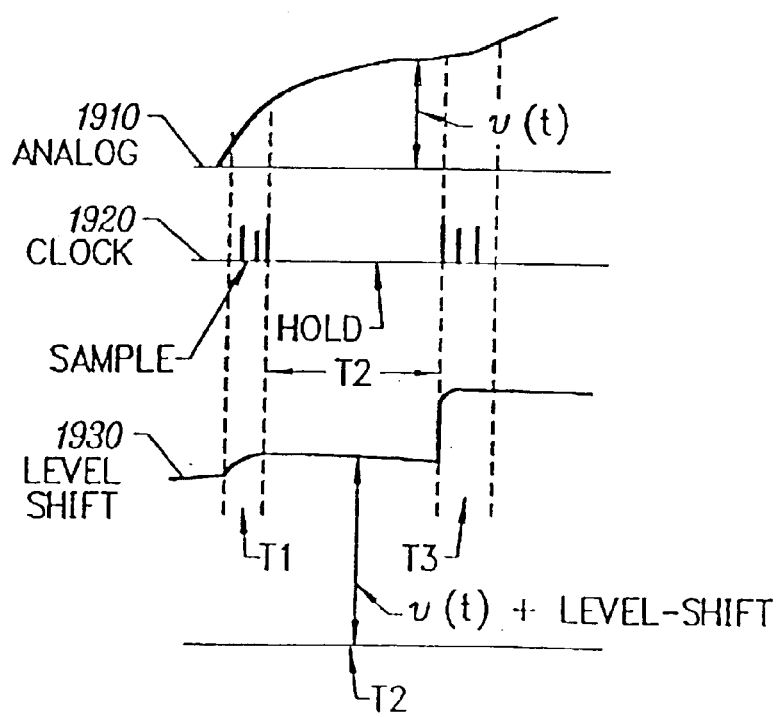
FIG. 34 shows a timing diagram illustrating the operation of the write circuitry.

FIG. 34 shows a timing diagram illustrating operation of the level shifter circuitry. An input signal 1910 is representative of a signal at signal input 1817. A clock signal 1920 is representative of a signal at clock input 1819. A level shift output 1930 is representative of an output of the level shifter circuit (e.g., either VS1 or VS2 outputs). In operation, the level shifter provides a level shifted output 1930 representative of input 1910. The sample and hold circuit, samples when the clock runs, and holds when the clock is stopped on a low phase. In particular, during a period T1, the input signal 1910 is sampled using the clock signal as a sampling clock. Note that during period T1, the output of the level shifter changes to become the level of the input signal v(t) plus a constant, which is the level-shifted value. By the beginning of a period T2, the level shifter output has become its target or final value (i.e., v(t) plus a constant). During period T2 when the clock is low, the value of the input 1910 which has been sampled is held. The output of the level shifter does not change. The level shifter output 1930 is used for programming the memory cell or other purposes. During period T2, the sampled value is stored into a single memory cell by pulsing the level shifter output 1930 at the control gate of the memory cell. After period T2, during a period T3, the analog value is again sampled, similarly as described for period T1. This technique of sampling and holding is repeated as many times and for the duration desired to store the input signal into the memory cells. For example, to store one minute of an analog signal such as a voice, the process is repeated for the duration of one minute.

Figure 35:
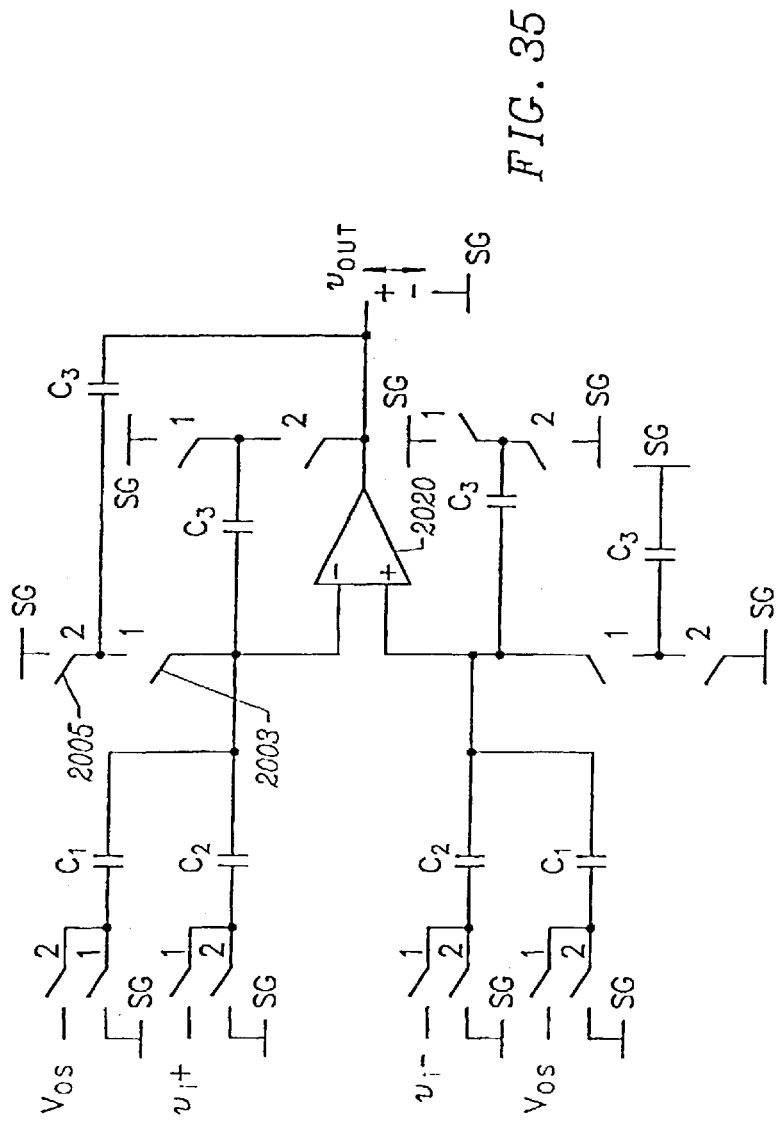
FIG. 35 shows a simplified schematic of a combination voltage level shifter and sample and hold circuit of the present invention.

FIG. 35 shows a more simplified schematic of a combination voltage level shifter and sample and hold circuit of the present invention. This circuitry can be used to implement level shifter circuit blocks 1810 or 1815 of FIG. 32. The circuitry has a number of AC switches that are connected depending on a clock input CLK1 or CLK2, which are nonoverlapping clock signals. For example, the switching of a switch 2003 is controlled by CLK1, and the switching of a switch 2005 is controlled by a CLK2. FIG. 36 shows a timing diagram for nonoverlapping clock signals CLK1 and CLK2. CLK1 and CLK2 are nonoverlapping because only CLK1 or CLK2 is high at the same time. A switch will be "closed" when the controlling clock signal is a high. Otherwise, the switch will be "open." For example, when CLK2 is high, and CLK1 is low, the circuitry in FIG. 35 will be in a HOLD mode. Because CLK1 and CLK2 are nonoverlapping, a switch controlled by CLK1 and a switch controlled by CLK2 will not be closed at the same time.

The circuitry takes as input a fully differential input signal (e.g., input 1817 of FIG. 32) at Vi+ and Vi−. An offset voltage is input at Vos. These inputs are coupled to an operational amplifier 2020. An output is provided at Vout. A signal ground (SG) potential is representative of a signal reference voltage. The circuitry provides a level-shifted output depending on the sizes of the capacitances C1, C2, and C3 according to the following equation: (Vout−Vsg)= (C2/C3*(Vi+−Vi−))−(2*C1/C3 (Vos−Vsg)).

The level shifter circuit also perfoms a differential input to single-ended output conversion. The level shifter output is single ended because the memory is single ended. The level shifter can be designed to have a fully differential output if a fully differential memory is used, but a fully differential memory would use about twice the integrated circuit area as a single-ended memory.

Figure 37:
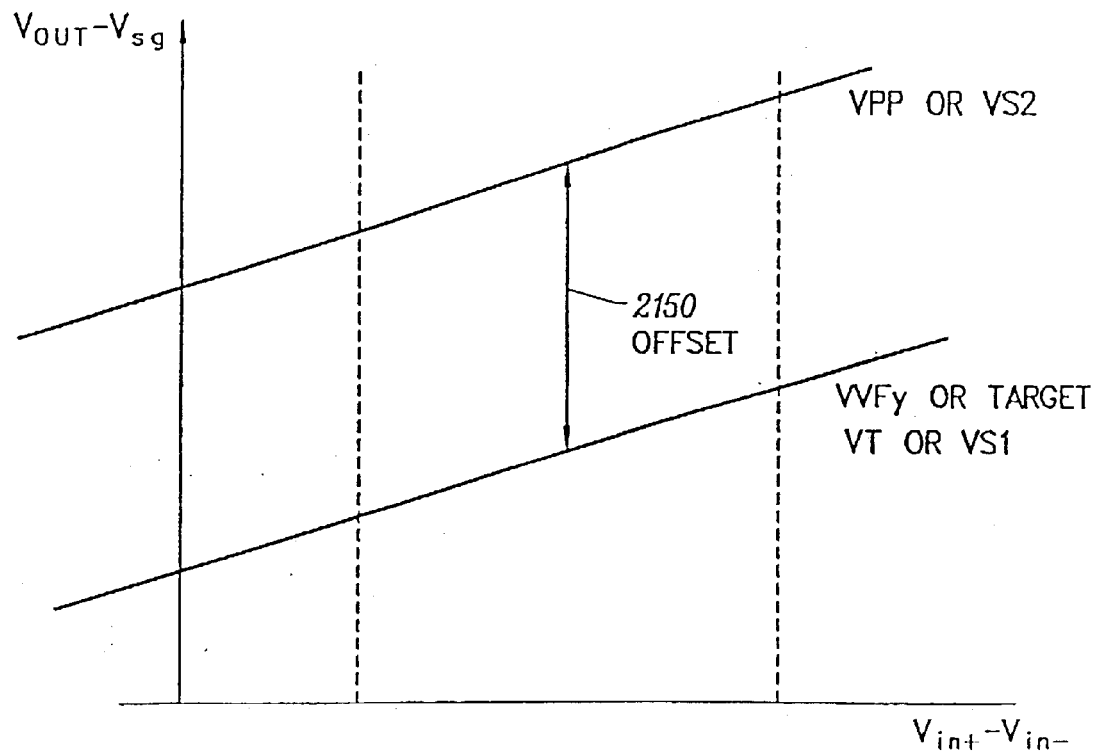
FIG. 37 shows a graph of the relationship between the programming and target VT voltage from a level shifter circuit.

When implemented using the circuit in FIG. 35, the VPP level shifter has a trimmable output voltage where ($V_{out}$−$V_{sg}$) is adjusted by changing the sizes of capacitances C1, C2, and C3. Adjusting C1 adjusts the offset component of the equation. FIG. 37 shows offset component 2150. Therefore, by adjusting C1, for a given target VT voltage, a desired value for VPP or VS2 can be obtained. The range of voltages for VS2 is technology dependent, varying depending on parameters such as oxide thickness and channel length. By adjusting C1, the yield of good die may be improved. In a specific embodiment, VS2 ranges from about 5 volts to about 13 volts. The offset voltage between VS1 and VS2 is programmably selectable by adjusting C1. This offset voltage is about 5 volts in a typical case.

The C2 capacitance can also be adjusted. This will adjust the signal component and vary the slope of the VS2 curve (see FIG. 37). It is generally desirable for the VS1 and VS2 curves to be parallel because the offset voltage will be constant. In some cases, however, it may be desirable to have a relationship between VS1 and VS2 not having a constant offset voltage.

The C3 capacitance is also trimmable. Adjusting C3 will affect both the offset and signal components since it is a factor in both offset and signal components of the equation.

Figure 38:
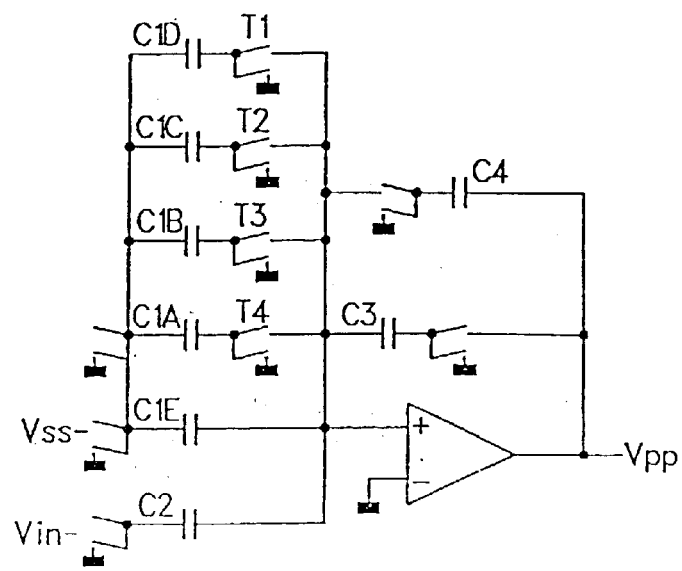
FIG. 38 shows an implementation for a trimmable level shifter circuit.

FIG. 38 shows circuitry for implementing a trimmable capacitance that may be used for C1, C2, or C3 of the level shifter in FIG. 20. In FIG. 38, the size or capacitance for C1 may be programmably selected. A number of capacitors C1A, C1B, C1C, C1D, and C1E are programmably connected in parallel. By combining one or more of these capacitors with C1E, other capacitance values for C1 are obtainable. Capacitors C1A, C1B, C1C, and C1D may be combined or added together with C1E by closing the appropriate switches T1, T2, T3, or T4. In one embodiment, the sizes of capacitors C1A, C1B, C1C, and C1D are weighted in order to obtain a wider range of capacitance values for C1. For example, the capacitor sizes may be binary weighted. In other embodiments, the capacitors are each different sizes (giving different capacitance values), or are the same size (giving the same capacitance value). Capacitors C1A, C1B, C1C, C1D, and any others may be formed using MOS transistors, polysilicon-1 to polysilicon-2 coupling, or other techniques commonly used to form a capacitance on an integrated circuit.

Similar techniques may also be used to form variable sized capacitances for C2, C3, and C4, if desired. In a specific implementation of the circuitry in FIG. 38, the VPP output voltage is about 9 volts when signal ground is applied to Vin. The VPP output voltage is programmably adjustable in about 0.13 volt steps.

FIG. 38 shows a single-ended version of the level shifter. A fully differential version may be constructed similarly as shown in FIG. 35. The programmably connectable capacitors would be connectable to both positive and negative inputs of the operational amplifier. To adjust the value of a particular capacitance, the capacitance value at both positive and negative inputs are charged at the same time. For example, in FIG. 35, C1 on both positive and negative inputs is programmably adjustable and will have the same value after adjustment.

Figure 39:
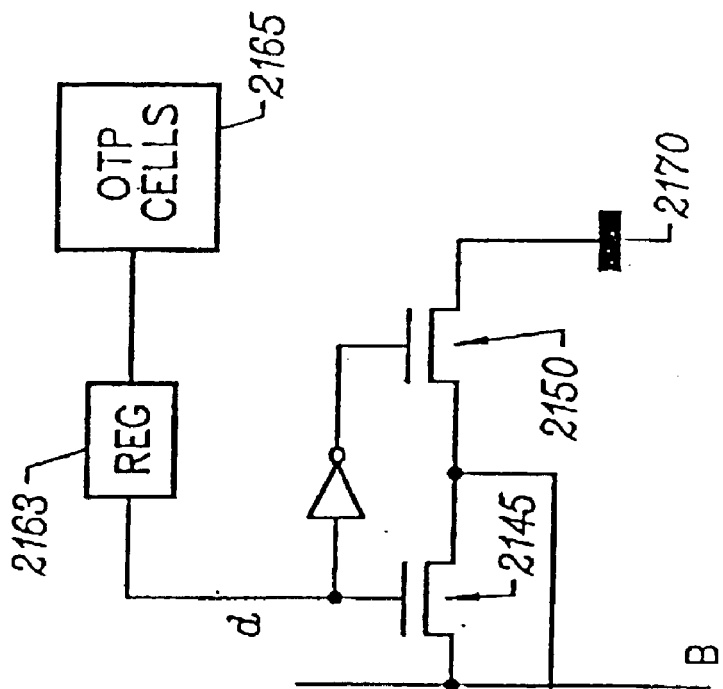
FIG. 39 shows a more detailed circuit diagram for a switch for a trimmable capacitor of the present invention.
Figure 39:
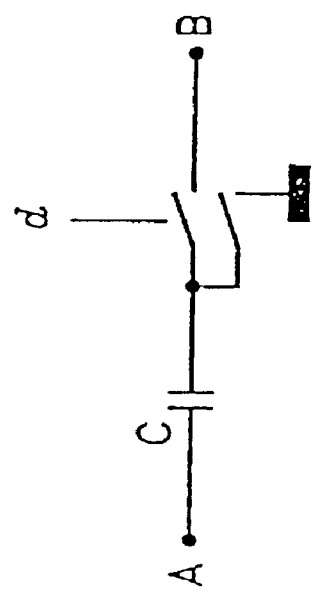

FIG. 39 shows a specific embodiment of a switch and a capacitor C that may be used to make a trimmable capacitor of the present invention. In this embodiment, the switch is formed using an NMOS pass gate 2145 and an NMOS pass gate 2150. Other types of pass gates may be used instead; these include a fully complementary pass gate with an NMOS device and a PMOS device. In this embodiment, an on or off state of the pass gates are controlled by a bit stored in a register 2163. The register may be loaded based on information programmed into one-time programmable (OTP) cells 2165. Pass gates 2145 and 2150 receive complementary versions of the control signal from the register. Either pass gate 2145 or 2150 is on at one time. When pass gate 2145 is on, capacitor C is connected between points A and B. When pass gate 2150 is on, capacitor C is connected between A and a fixed potential voltage 2170, which is typically ground. This ensures there will be no problems during operation due to a "floating" capacitor.

Switches T1, T2, T3, and T4 of FIG. 38 are static or DC switches. During normal operation, these switches will be in one state or another. However, the other switches in FIG. 38 are AC switches that switch, based on a clock, during the normal operation of the circuitry. FIG. 38 shows a switched capacitance version of the circuitry. An analogous timed continuous circuit can be implemented using impedances or resistances. In other words, an impedance may be substituted for the switch and capacitor.

The timed continuous implementation can also have a programmable offset. Using a similar technique as for capacitors, a number of resistances can be connected together in such a fashion to allow the total resistance value to be programmably variable. Also, a technique to implement a variable impedance such as in U.S. patent application Ser. No. 09/159,848, which is incorporated by reference, may be used.

There are many other possible implementations for a switch used to make a trimmable capacitor. For example, a switch may be controlled by way of Flash, EEPROM, EPROM, nonvolatile cell, floating gate cell, RAM, DRAM, antifuse, input from the SPI interface, or many other possible sources. Further, in some embodiments, the switches may be laser programmable or directly programmable memory cells coupled to the capacitor. The memory cells will be programmed by the user.

There are many other techniques of implementing a trimmable or variable capacitor, and these techniques may also be used in implementing the level shifter of the present invention.

The procedure to read information from a memory cell is essentially the reverse of the procedure described above to store information into the memory cell. A read circuit 435 (shown in FIG. 4) is used to read data from the memory cells.

Figure 40:
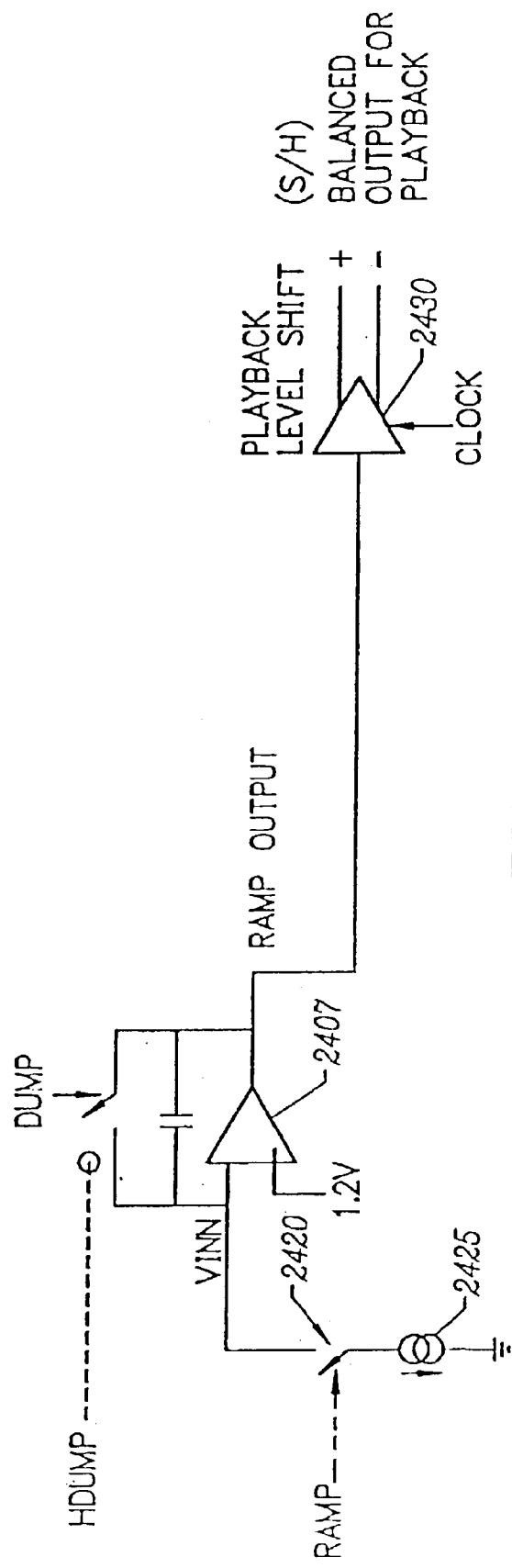
FIG. 40 shows a simplified schematic of circuitry for retrieving information from the memory cells.

FIG. 40 shows a simplified schematic of a ramp circuit and playback level shifter of the present invention. This circuitry is used in one implementation of read circuit 435. The ramp circuit determined the stored VT of a memory cell. The ramp circuitry includes an operational amplifier 2407 having a first input coupled to a VINV signal and a second input coupled to a reference voltage. This reference voltage is 1.2 volts and comes from the master bias generator or a slave bias generator. The first input is connected through a switch 2420, which is controlled by a signal RAMP, to a current source 2425. When RAMP is high, switch 2420 will be closed, coupling the current source to the first input of operational amplifier 2407. When RAMP is low, switch 2420 is open, decoupling the current source from the first input. Operational amplifier 2407 provides a RAMP OUTPUT. A HDUMP switch is coupled to discharge the ramp output based on a DUMP signal. The input to the ramp circuit is single ended because the memory is single ended. The output of the ramp circuit is single ended. A playback level shifter circuit 2430 receives the RAMP OUTPUT and provides a fully differential balanced output for playback. In an embodiment of the present invention, the playback level shifter may also include sample and hold circuitry, which is similar to the case for the record level shifters, VPP and VVFY level shifters, above.

Figure 41:
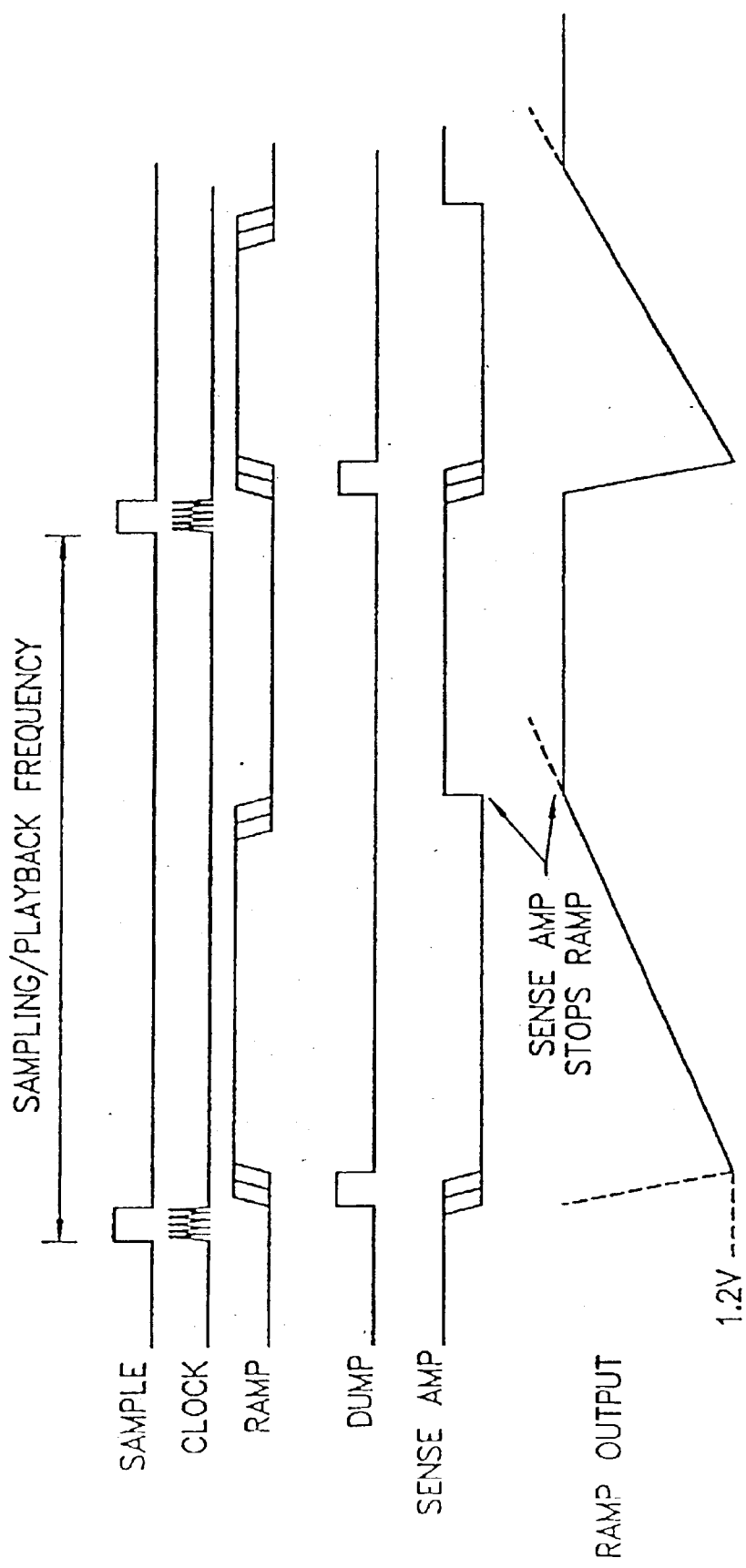
FIG. 41 shows a timing diagram illustrating the operation of the read circuitry.

FIG. 41 shows a timing diagram illustrating the operation of the read circuit or playback circuitry. This circuitry determines the VT of the memory cell to be read. The stored VT represents the stored information. The circuitry in FIG. 40 is run at the sampling frequency used to store the data. The RAMP signal indicates that switch 2415 is closed to begin ramping the voltage at RAMP OUTPUT. As long as the switch is closed, the voltage at RAMP OUTPUT will continue to rise. The initial starting voltage at RAMP OUTPUT is 1.2 volts, which is the reference voltage. A DUMP signal closes the HDUMP switch to reset the circuit to the 1.2-volt level at RAMP OUTPUT. The initial starting voltage can be any voltage other than 1.2 volts, as long as it is below the minimum VT range of the memory cells. Instead of ramping up, the RAMP OUTPUT can ramp down from a predetermined high voltage, higher than the maximum VT range of the memory cells.

To determine the stored VT of a memory cell, the RAMP OUTPUT is connected to the gate of the memory cell. The memory cell is connected to a sense amplifier or other circuit to determine whether the memory cell is conducting or not conducting current. The ramp circuitry continues to ramp the voltage at the gate of the memory cell. The memory cell will not conduct when the control electrode voltage is below its stored VT. The memory cell will conduct when it is above its VT. And, the sense amplifier is low w hen the memory cell does not conduct, and high when the memory cell conducts, or vice versa. Therefore, the ramp circuitry ramps the control electrode until the output of the sense amplifier changes from low to high, or vice versa. The voltage at RAMP OUTPUT at the point in time when the sense amplifier toggles is representative of the stored VT of the memory cell. This value, representative of the stored VT, at RAMP OUTPUT is provided to the playback level shifter circuitry. The playback level shifter level shifts down this voltage back to the voltage level of the original signal. This is the reverse operation of the VPP and VVFY level shifter.

Figure 42:
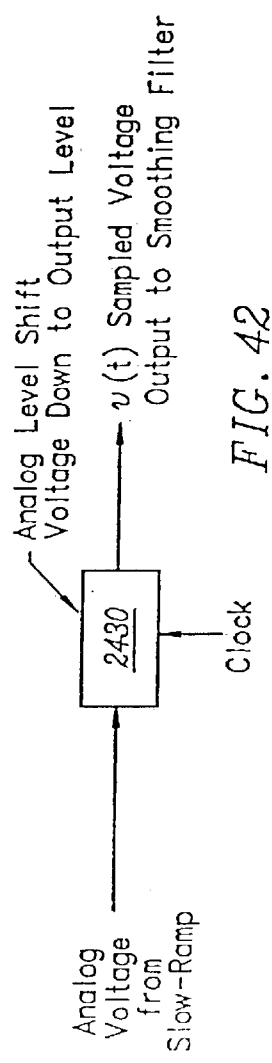
FIG. 42 shows a schematic of an implementation of a playback level shifter circuit.

FIG. 42 shows a diagram of a playback level shifter circuit 2430. The voltage from the ramp circuit and a clock signal is input to level shifter circuit 2430. An output of the level shifter circuit is a voltage which is level shifted down to the appropriate voltage for playback and re-creation of the originally stored signal.

The voltage ranges input to the ramp circuit and playback level shifter circuit may be above the supply voltage of the integrated circuit, depending on the stored VT of the memory cell. Therefore, similar to the case with the VPP and VVFM level shifters, supply rails for the ramp circuit and playback level shifter circuit are connected to a high voltage above the supply voltage for the integrated circuit. This high voltage can be generated by charge pumps on the integrated circuit.

Figure 43:
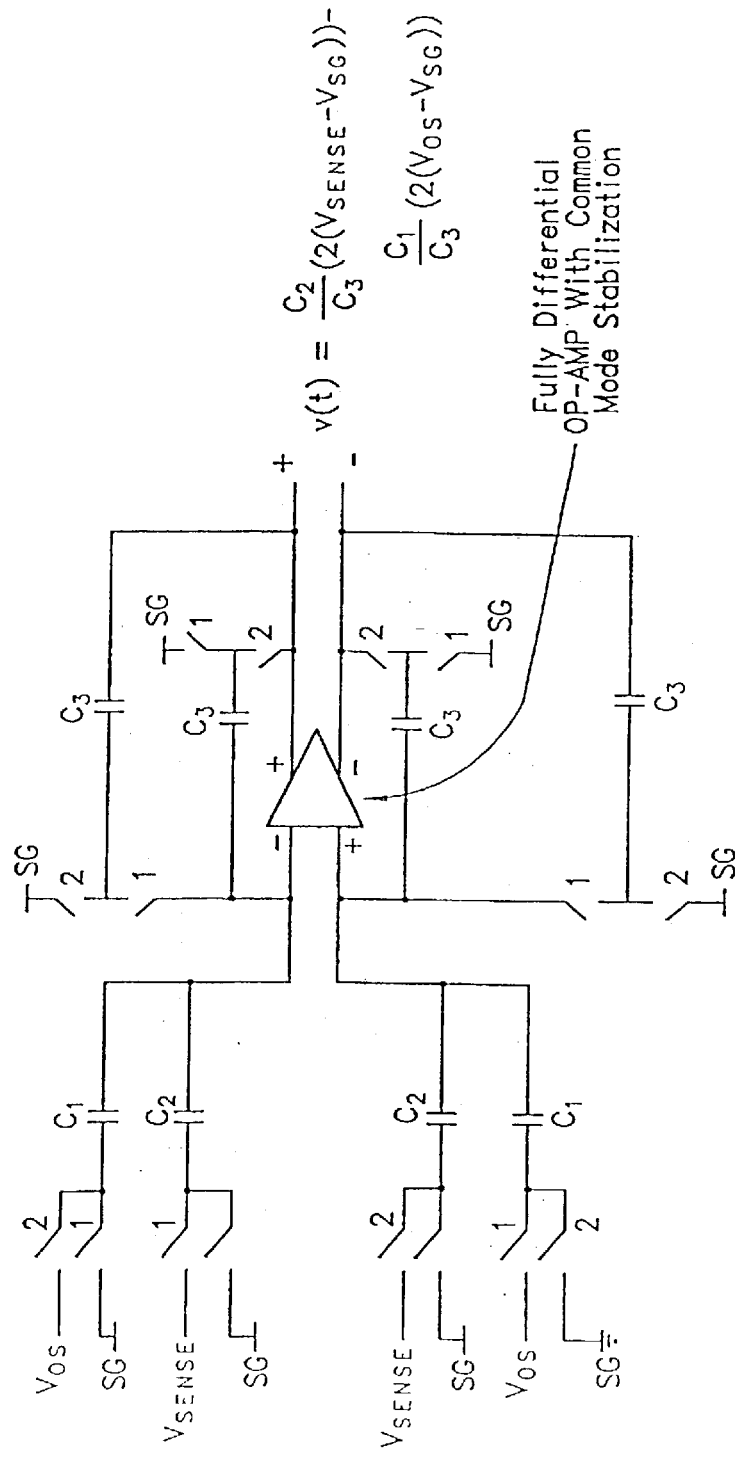
FIG. 43 shows a simplified schematic of an implementation of the playback level shifter circuit, also including sample and hold circuitry.

FIG. 43 shows a circuit diagram of an implementation of the playback level shifter circuit. This circuit includes a sample and hold circuit. This circuitry is similar to that described in FIG. 36 above. The discussion for the record level shifter applies analogously to the playback level shifter. The playback level shifter also converts the single-ended input from the ramp circuit to a fully differential output. The voltage from the ramp circuit is input to Vsense. A v(t) output of the circuitry has the following relationship: v(t)=C2/C3*(2*(Vsense−Vsg))−C1/C3(2*(Vos−Vsg)). By varying the sizes of capacitors C1, C2, and C3, the amount of the level shifting is adjustable just as it is for the VPP and VVFY level shifters. In a specific embodiment, capacitor C1 is a programmably variable capacitance. By adjusting the size of capacitance C1, the offset between V(t) and (Vsense−Vsg) is changed. The circuitry to implement a programmable, variable capacitance was discussed above, and is especially applicable to this circuitry.

As shown in FIG. 4, an output from the read circuit 435 is coupled to a low pass filter 440. This filter is sometimes referred to as a smoothing filter. This filter produces a continuous output for the playback signal. There are many possible implementations of low pass filter 440. A specific implementation is the low pass filter circuitry shown in FIGS. 22 and 23, and described above. In a specific embodiment of the present invention, the same on-chip circuitry is used for low pass filter 411 and low pass filter 440. This reduces overall die size. For example, when used for recording, the output of preamplifier is coupled to the low pass filter circuitry. When used for playback, the output of the read circuit is coupled to the same low pass filter circuitry. In other embodiments, separate circuitry is used for the low pass filter for record and playback.

Figure 44:
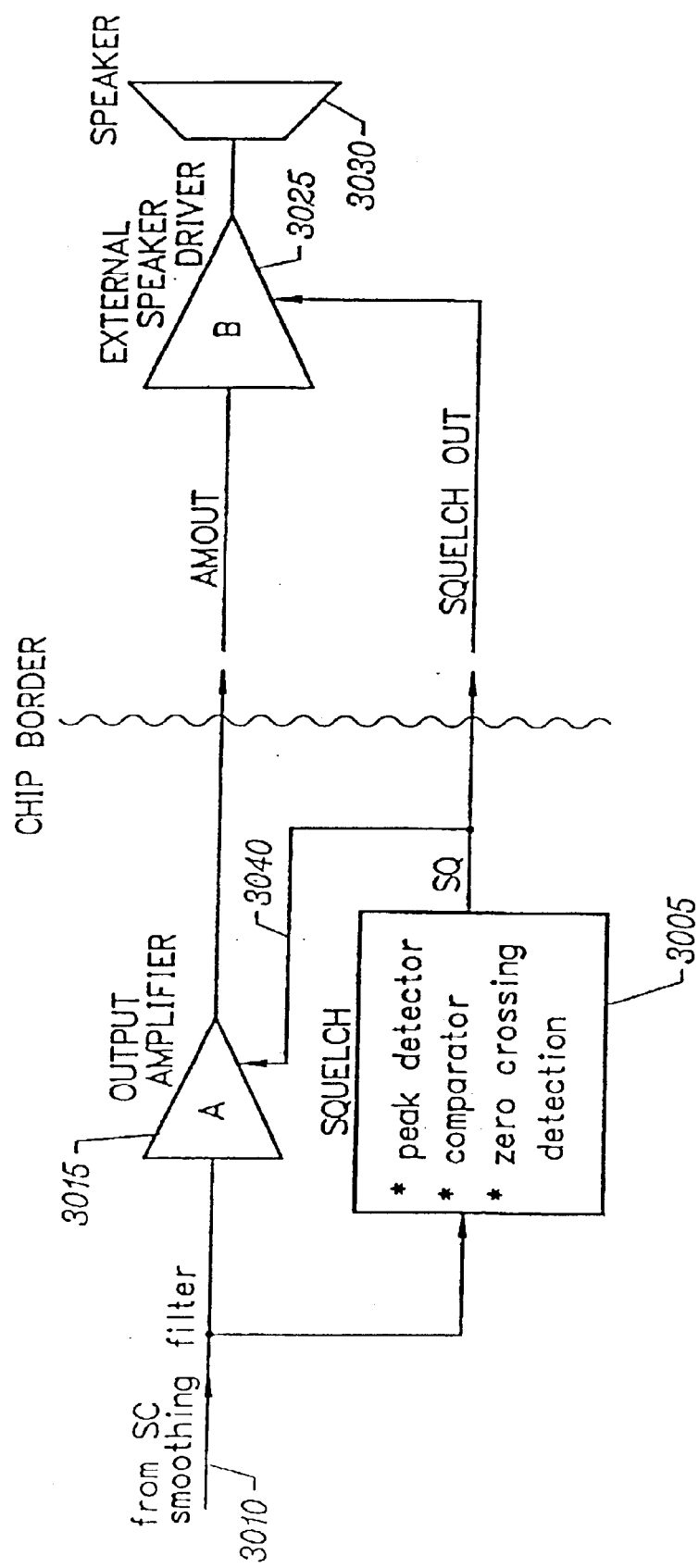
FIG. 44 shows circuitry for producing the playback signal, including a squelch circuit, at an output of an integrated circuit.

FIG. 44 shows circuitry for producing the playback signal at an output of an integrated circuit. This particular implementation includes a squelch circuit 3005. Other implementations of the present invention may not include a squelch circuitry. This is one implementation of squelch circuit 445 of FIG. 4. The squelch circuit of the present invention attenuates the output voltage by about six decibels when the input signal level stays below a defined threshold for a defined time. If the signal level is low for a certain time, the background noise is attenuated by this feature. The user can select the defined threshold and defined time, or these parameters may be set by the design. This circuitry is active when used during playback and inactive at other times in order to reduce power consumption.

An output 3010 from the low pass or smoothing filter is input to an output amplifier 3015 and squelch circuit 3005. Output amplifier 3015 has an ANOUT signal output that is representative of the information stored in the memory cells. For example, if voice or other sounds were stored in the memory cells, ANOUT can be used to drive an external speaker driver 3025 and speaker 3030. The voice or other sounds are then played out of the speaker. Output amplifier 3015 provides a gain A0.

Squelch circuit 3005 generates a SQ signal output 3040 to indicate whether the ANOUT signal should be attenuated. Output amplifier 3015 takes as an input the SQ signal 3040. When the SQ input is low, ANOUT will not be attenuated. Output amplifier 3015 provides a gain A0. However, when the SQ input is high, ANOUT will attenuated by the desired amount. Output amplifier 3015 provides a gain A0 of −6 decibels, which is less than in the normal case. The SQ signal can also be provided as an external signal SQUELCH OUT. SQUELCH OUT can be used, for example, to enable or disable the attenuation of external speaker driver 3025.

Figure 45:
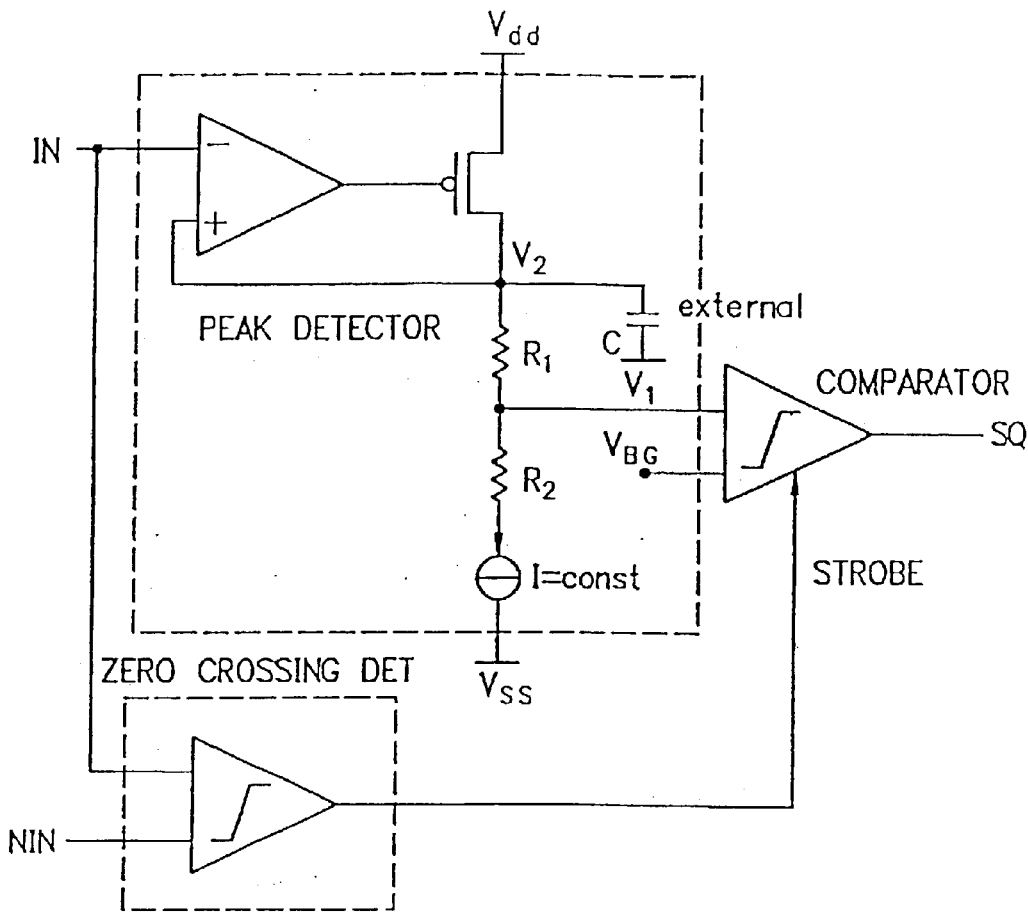
FIG. 45 shows a diagram of an implementation of squelch circuit.

FIG. 45 shows a diagram of an implementation of squelch circuit 3005. This implementation includes a peak detector, comparator, and zero-crossing detector. The circuitry operates as follows: The peak detector signal is level shifted by resistor $R_1$. The resulting signal $V_1$ is compared to the signal ground level which is equal to the bandgap reference voltage $V_{BG}$. If $V_1$ is smaller, squelch becomes active at the next crossing of the signals IN and NIN (i.e., the signal SQ becomes active). The time constant is set by capacitor C and the current I which discharges the node $V_2$ with the rate I/C.

IN is connected to a positive signal from the low pass or smoothing filter. In a specific embodiment, IN is a fully differential signal. NIN is connected to a negative signal from the low pass or smoothing filter. In a specific embodiment, NIN is also a fully differential signal. C is an external capacitor. R1 and R2 are internal resistors or resistances. I is a current source. STROBE is used to indicate a comparison between $V_1$ and $V_{BG}$. $V_{BG}$ is the bandgap reference voltage. A value of (IN+NIN)/2 will be equal to $V_{BG}$, as set by a common mode feedback circuit in the low pass or smoothing filter.

Figure 46:
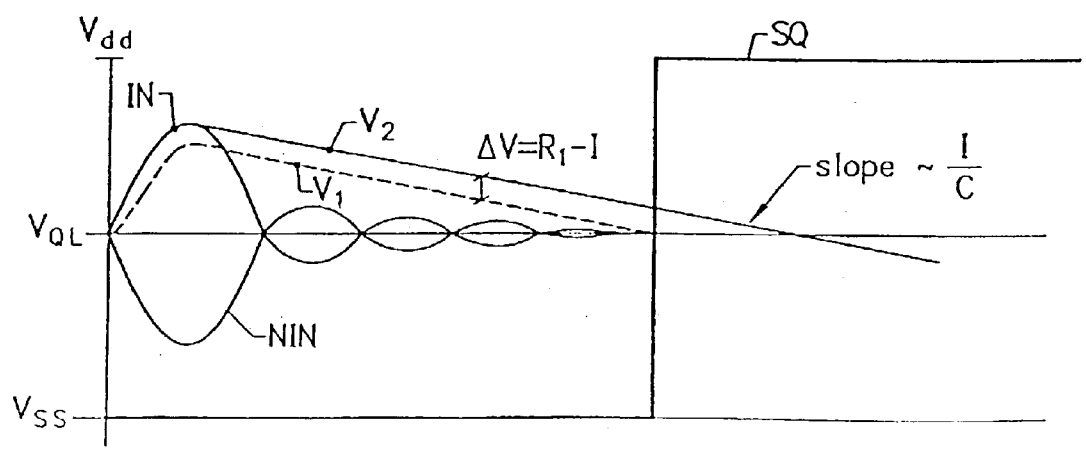
FIG. 46 shows a signal diagram of an operation of the squelch circuit of FIG. 45.

FIG. 46 shows a signal diagram illustrating the operation of the squelch circuit. When SQ is high, the signal is attenuated.

It is contemplated the integrated circuit of the present invention will operate in a relatively wide range of supply voltage conditions. For example, the integrated circuit may be battery powered. Different types of battery packs (e.g., air, lithium, nickel metal hydride, nickel cadmium, lead acid, gel cell, alkaline, zinc manganese) will provide different voltage levels. Furthermore, the voltage levels may also change depending on how much charge remains in the battery.

Depending on the voltage level of the power supply, certain on-chip circuitry may need to be adjusted to reflect this change in operating conditions. An example of such circuitry is the charge pump circuitry used to provide the voltages to program a memory cell. The charge pump voltages are used by the level shifter circuits. Since it is desirable to program multiple data levels in a single memory cell, it is important to maintain precise programming voltages in order to ensure information is properly stored. For example, when the power supply voltage level is relatively high, fewer charge pump stages may be needed compared to the case when the power voltage level is relatively low. By adjusting the charge pump output voltage levels to compensate for supply voltage variation, this allows the integrated circuit to store analog and digital data more precisely—effectively more bits of storage per memory cell.

Figure 47:
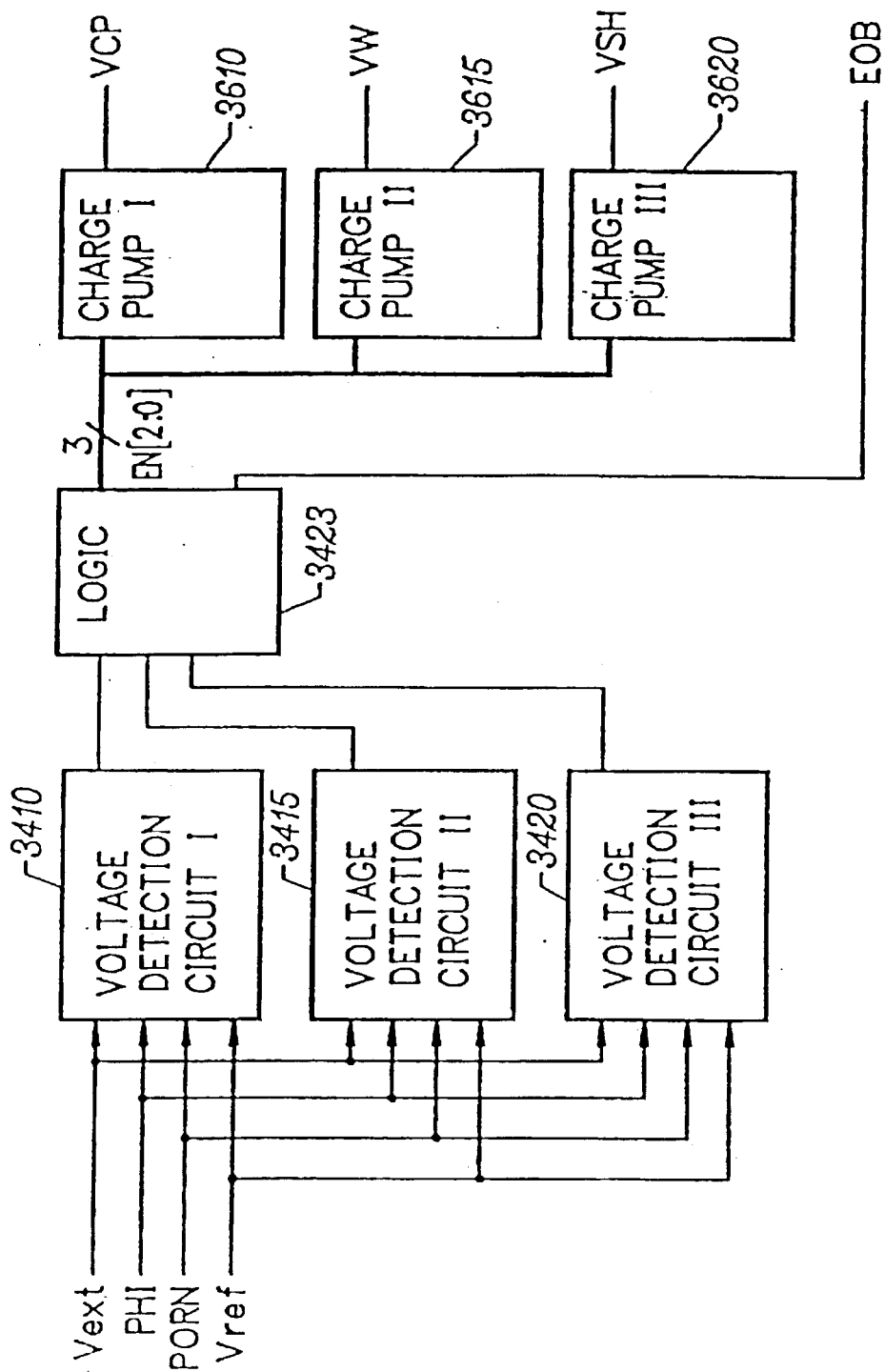
FIG. 47 shows a diagram of an implementation of circuitry a power supply level detection.

FIG. 47 shows an embodiment of circuitry for power supply level detection and adjustment circuitry of the present invention. The circuitry includes three voltage detect circuits 3410, 3415, and 3420 to detect the voltage level of the supply voltage. A number of charge pumps 3610, 3615, and 3620 are adjusted based on the voltage level. If the voltage level is now too low, an EOB signal will indicate this situation. A low supply voltage may mean the battery is low. EOB stands for end of battery life. Each voltage detect circuit has an input for external voltage ($V_{ext}$), logic signal to update voltage detection (PH1), /power-on reset (PORN), and internal reference voltage (VREF). When PH1 or PORN is asserted, the voltage level detect circuit makes a detection of the supply voltage level at $V_{ext}$.

$V_{ext}$ is an external voltage. PH1 is a logic signal used to indicate that the voltage detect circuit will perform an updated check of the external voltage. PORN is a power-on reset signal. $V_{ref}$ is an internal reference voltage. EN[2:0] are three enable signals used to enable respective ones of the charge pumps I, II, and III. VCP is an output of charge pump I. This voltage may be about 12 volts. VW is an output of charge pump II. This voltage may be about 6 volts. VSH is an output of charge pump III. This voltage may be about 8 volts. EOB is a logic signal used to indicate a low battery voltage or end-of-battery life.

Figure 49:
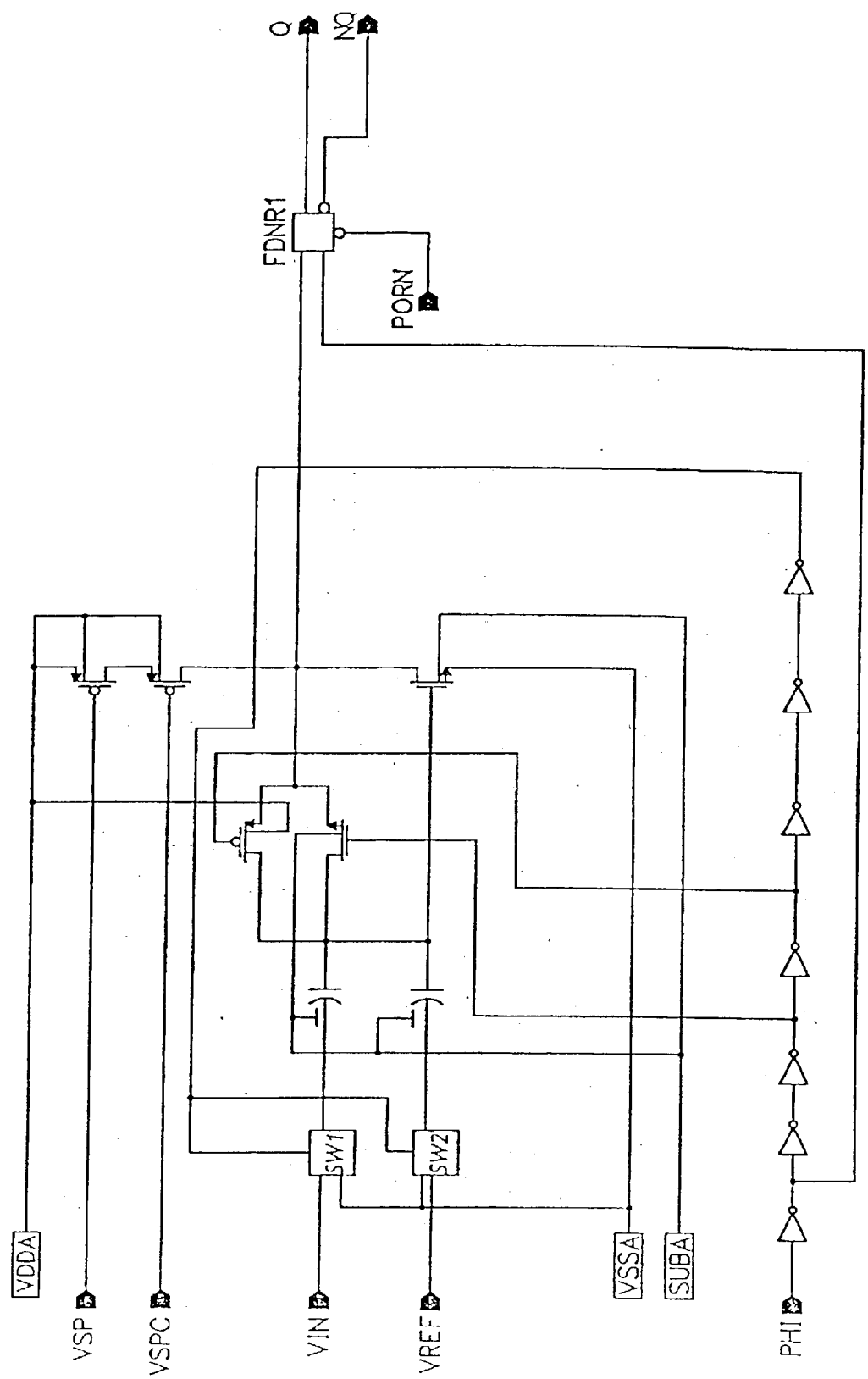
FIG. 49 shows a diagram of a power supply level detection circuit.

FIG. 49 shows a more detailed schematic of a voltage detect circuit. This circuitry can be used to implement the voltage detect circuits 3410, 3415, and 3420 of FIG. 47. The voltage detect circuit performs a comparison of a VIN voltage, connected to $V_{ext}$, to a VREF voltage. The voltage detect circuit provides a high output at node Q when VIN/VREF is greater than C2/C1.

In FIG. 47, three voltage detect circuits are coupled together to permit the detection of a number of power supply threshold levels. For example, in a specific embodiment of the present invention, a first level for the power supply may be set at 2.4 volts, a second threshold set at 2.7 volts, and a third threshold set at 3.1 volts. These threshold levels may be set, for example, by inputting the appropriate bias voltage to the VREF of voltage detect circuits 3420, 3410, and 3415, respectively. Another technique of setting the threshold levels is to appropriately select the sizes of capacitors C1 and C2 within the voltage detect circuit. Typical values are a C1 of about 1 picofarad and a C2 of about 2.2 picofarads, depending on the threshold level to be set.

Figure 48:
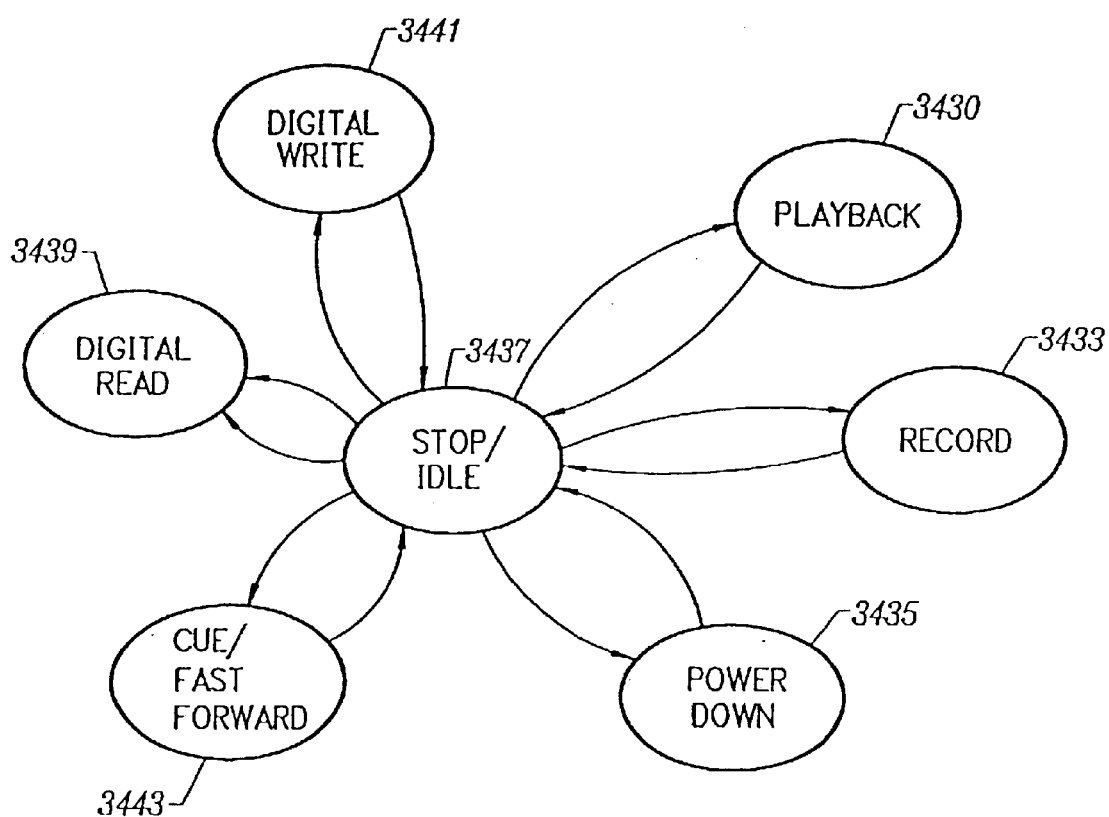
FIG. 48 shows a state diagram of some operational modes of the present invention.

In operation, the circuitry in FIG. 47 evaluates the power supply level once upon power-up of the integrated circuit. For example, after supplying power to the integrated circuit, the integrated circuit will be in a "power down" mode. A PWRUP command is input through the SPI interface to initialize the circuitry. Within about 100 microseconds of the PWRUP command, the VDD supply level is detected and any adjustments to the charge pump circuitry is made. The integrated circuit is ready for functional use. In other embodiments of the present invention, the circuitry periodically or continuously evaluates the power supply level. For example, in a specific implementation, the VDD supply voltage level is detected upon the entering of a different mode of operation. As shown in FIG. 48, the analog memory integrated circuit has operation modes including playback 3430, record 3433, power down 3435, stop or idle 3437, digital read 3439, digital write 3441, and cue or fast forward 3443. Therefore, when switching from the idle node to playback, the supply voltage level is detected. The supply voltage is detected upon entering any of the modes shown in FIG. 48.

Note that in the operational scheme shown in FIG. 48, idle mode 3437 is an intermediate mode when switching from any of the other modes in the figure. In other words, there is, for example, no direct path between record and digital read; the idle mode must be entered before switching from record to digital read. This ensures the integrated circuit is operated properly.

Once the power supply level has been determined, this information may be passed to other circuitry on the integrated circuit. The operation of the other circuit can be altered to compensate or account for the power supply level. There may also be an external signal indicative of the power supply level. For example, if the power voltage level is below 2.4 volts, other circuitry on the integrated circuit will receive the EOB signal indicating a low battery condition. Such an EOB signal may also be used to warn the user of the low battery condition. The user can then replace or recharge the battery.

Although FIG. 47 shows three voltage detect circuits, other embodiments of a power supply level detection circuit may have any number of voltage detect circuits depending on the number of desired threshold levels. For example, the circuitry will have a single voltage detect circuit if there will only be one voltage threshold level. The circuitry will have two voltage detect circuits if there will be two voltage threshold levels. And, the circuitry may have greater than three voltage detect circuits if it is desirable to have more then three voltage threshold levels.

The circuitry in FIG. 47 includes three charge pump circuits: a VCP charge pump 3610, a VW charge pump 3615, and a VSH charge pump 3620. Other embodiments of the present invention include a single charge pump, two charge pumps, or more than three charge pumps. The charge pump circuits 3610, 3615, and 3620 are coupled to different circuitry on the integrated circuit. This permits the generation of various voltages for the operation of the circuitry. For example, VCP charge pump circuit 3610 outputs a VCP voltage that is connected to the supply lines of the VPP level shifter circuit for recording (e.g., level shifter circuit 1810 of FIG. 32). VSH charge pump circuit 3620 outputs a VSH voltage that is connected to the target or VVFY level shifter circuit (e.g., level shifter circuit 1815 of FIG. 32). VSH charge pump circuit 3620 is also connected to a shield or isolation device for the array. VSH charge pump circuit 3620 is also coupled to the playback level shifter and ramp circuit (see FIG. 40). VW charge pump circuit 3615 outputs a VW voltage that is coupled to the drain or bit lines of the selected memory cells during programming.

Figure 50:
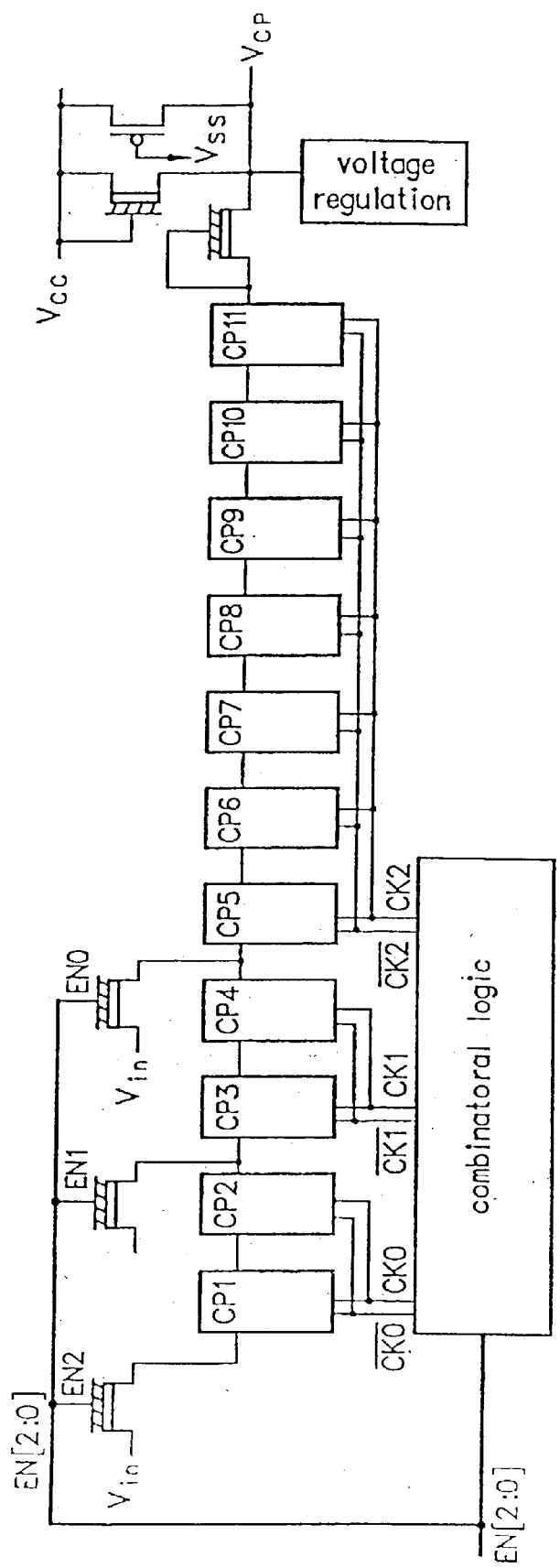
FIG. 50 shows a diagram of a charge pump circuit.

FIG. 50 shows a circuit implementation of a charge pump circuit of FIG. 47. EN[2:0] are the enable inputs from FIG. 47 used to enable the charge pump. CK[2:0] are clock inputs to the individual charge pump stages. $V_{in}$ is an input voltage to the charge pump. $V_{cp}$ is the charge pump output. This charge pump circuit has eleven stages. Circuitry for each of the stages is in FIG. 51. The number of stages used in the charge pump depends many factors including the output voltage desired, the process technology used, size of the capacitors, and other considerations. A charge pump circuit of the present invention may have fewer than eleven stages, or more than eleven stages. In a specific embodiment, the VCP charge pump has at most eleven stages, the VW charge pump has at most five stages, and the VSH charge pump has at most six stages.

The number of stages used during the operation of the charge pump will vary depending on the operating conditions of the integrated circuit. The number of stages used will ensure generation of a proper voltage output despite variations in operating conditions such as changes in the voltage supply level. The voltage level of the power supply is possibly detected using the power supply level detection circuitry of FIG. 47. Logic circuitry 3423 takes the information from the voltage level detect circuitry and adjusts the charge pump to use only a particular number of stages.

A general relationship is that the number of stages to be used will increase as the power supply voltage level decreases. Additional stages in the charge pump circuit provide an additional boost in the voltage level and current level at the output of the pump. For example, if the power supply voltage level is below about 2.7 volts, all eleven stages of the VCP charge pump are used. If the power supply voltage is between about 2.7 volts and about 3.3 volts, nine stages are used. And, if the power supply voltage is above about 3.3 volts, seven stages are used.

Similarly, for the VW charge pump, when VDD is below about 2.7 volts, all five stages are used. When VDD is between about 2.7 volts and about 3.3 volts, four stages are used. And if VDD is above about 3.3 volts, three stages are used. For the VSH charge pump, when VDD is below about 2.7 volts, all six stages are used. When VDD is between about 2.7 volts and about 3.3 volts, five stages are used. And when VDD is above about 3.3 volts, four stages are used.

The voltage range output of the charge pump circuit may be in any desired range. For example, the VCP charge pump circuitry generates a VCP voltage of about 12.8 volts to facilitate the program and erase of Flash memory cells. The VCP voltage will range from about 11.8 volts to about 13.8 volts. In other embodiments, voltages for programming the memory cells are in a range from about 5 volts to about 16 volts. The VW charge pump generates a VW voltage of about 6.4 volts, which can range from about 5.4 volts to about 7.4 volts. The VSH charge pump generates a VSH voltage of about 7.8 volts, which can range from about 6 volts to about 9 volts.

The charge pump circuitry may be adjusted by using metal options, trim bits, and other similar techniques. For example, the level of the output voltage of the charge pump is adjusted by programming one or more trim bits appropriately. By allowing for such adjustments in the charge pump circuitry, especially after the integrated circuit has been fabricated, this may increase the yield of good product die. The circuitry will be functional because the trim bits allow adjustments to account for skews in the process parameters.

Figure 51:
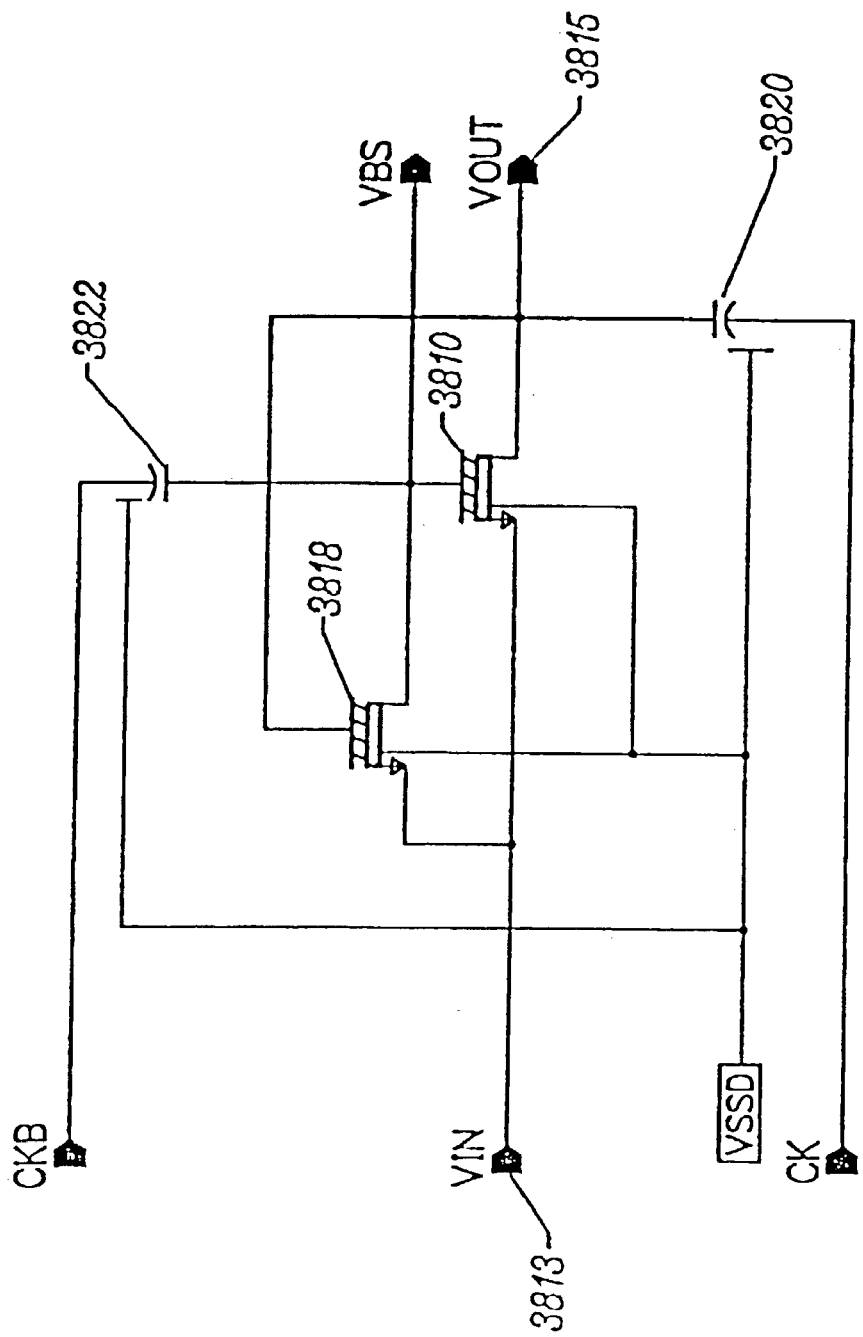
FIG. 51 shows a diagram of an implementation of a stage of a charge pump.

FIG. 51 shows an embodiment of a stage of a charge pump. A transistor 3810 is connected between an input 3813 and an output 3815. A transistor 3818 is connected between the gate of transistor 3810 and input 3813. A gate of transistor 3818 is connected to output 3815. A capacitor 3820 is connected between a clock signal and output 3815. A capacitor 3822 is connected between a /clock signal and the gate of transistor 3810. In a specific embodiment, transistors 3810 and 3818 are lower VT transistors than other transistors on the integrated circuit. These transistors may be native devices having a VT of from about 0.2 volts to about 0.4 volts. Although standard VT transistors may be used, native transistors will improve the efficiency of the pump stage.

In operation, when the clock is pulsing, transistor 3810 acts as a diode, passing charge from input 3813 to output 3815. Charge builds up at output 3815, and the voltage level increases. Transistor 3818 is used to bootstrap the gate of transistor 3810 to the VT plus the voltage level at input 3813 (passed from the previous stage). With multiple stages, charge is passed from stage to stage until the desired voltage level output level is obtained.

Figure 52:
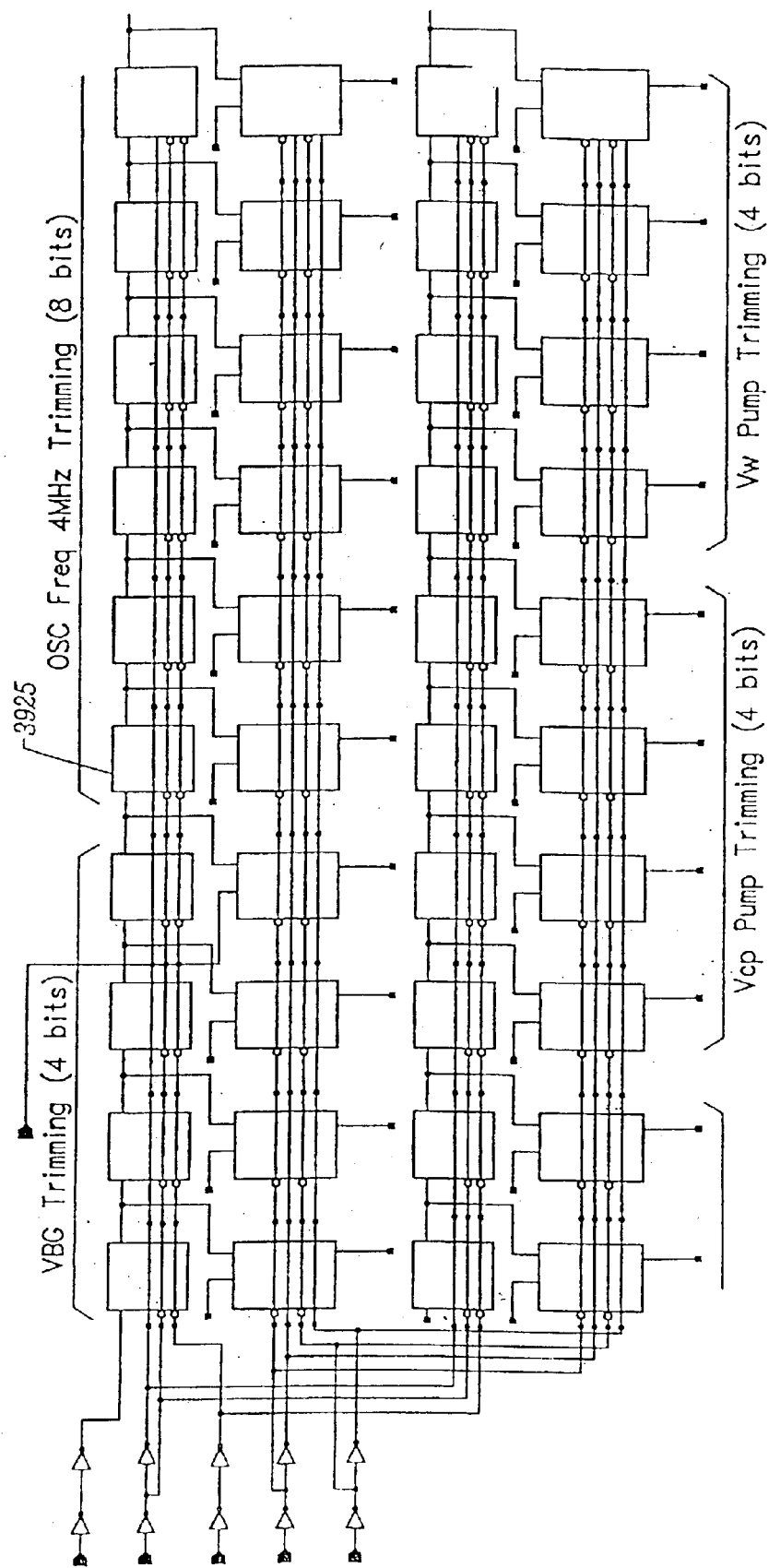
FIG. 52 shows a plurality of trim bits.

FIG. 52 shows a plurality of trim bits 3925 of the present invention. In particular, trim bits are memory bits that are programmed to control the operation of the on-chip circuitry. There are many different ways to implement trim bits including using one-time programmable cells, digital memory cells, analog memory cells, fuses, antifuse, and many others. In a specific embodiment, the trim bits are implemented using one-time programmable cells which are formed within or nearby the analog array area of the integrated circuit. There may be any number of trim bits. For example, there may be four bits for controlling the bandgap voltage generator (VBG), eight bits for controlling the internal oscillator (OSC) clock frequency, four bits for controlling the charge pump generating the VCP voltage, and four bits for controlling the charge pump generating the VW voltage.

Each of the trim bits includes sense amplifier circuitry to sense a state of the trim bit. In a specific embodiment, the trim bit is sensed only once during power-up of the integrated circuit. A sense amplifier generally consumes power while the sense amplifier is actively sensing. Therefore, by turning off the sense amplifier after the state of the trim bit has been determined, this conserves power. The state of the trim bit is not expected to change during the normal operation of the device.

Figure 53:
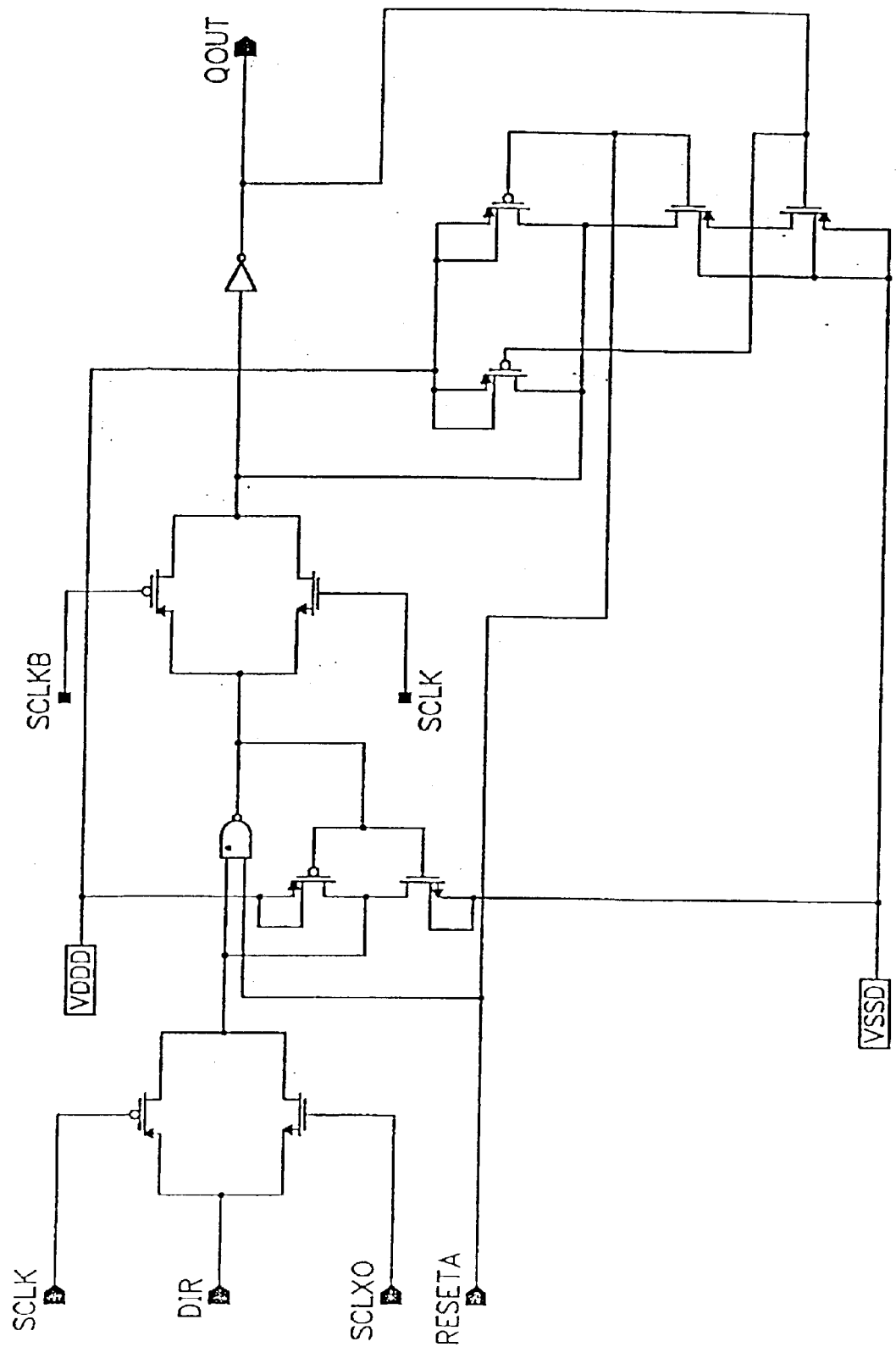
FIG. 53 shows a sensing and latch circuitry for a trim bit.

After sensing, the state of a trim bit is stored in a storage block such as a latch, flip-flop, register, or SRAM cell. FIG. 53 shows an implementation of sensing and latch circuitry for a trim bit. This is one particular implementation, among others, of a latch circuit. The latch circuit holds the state or value of the trim bit after the trim has been sensed.

Figure 54:
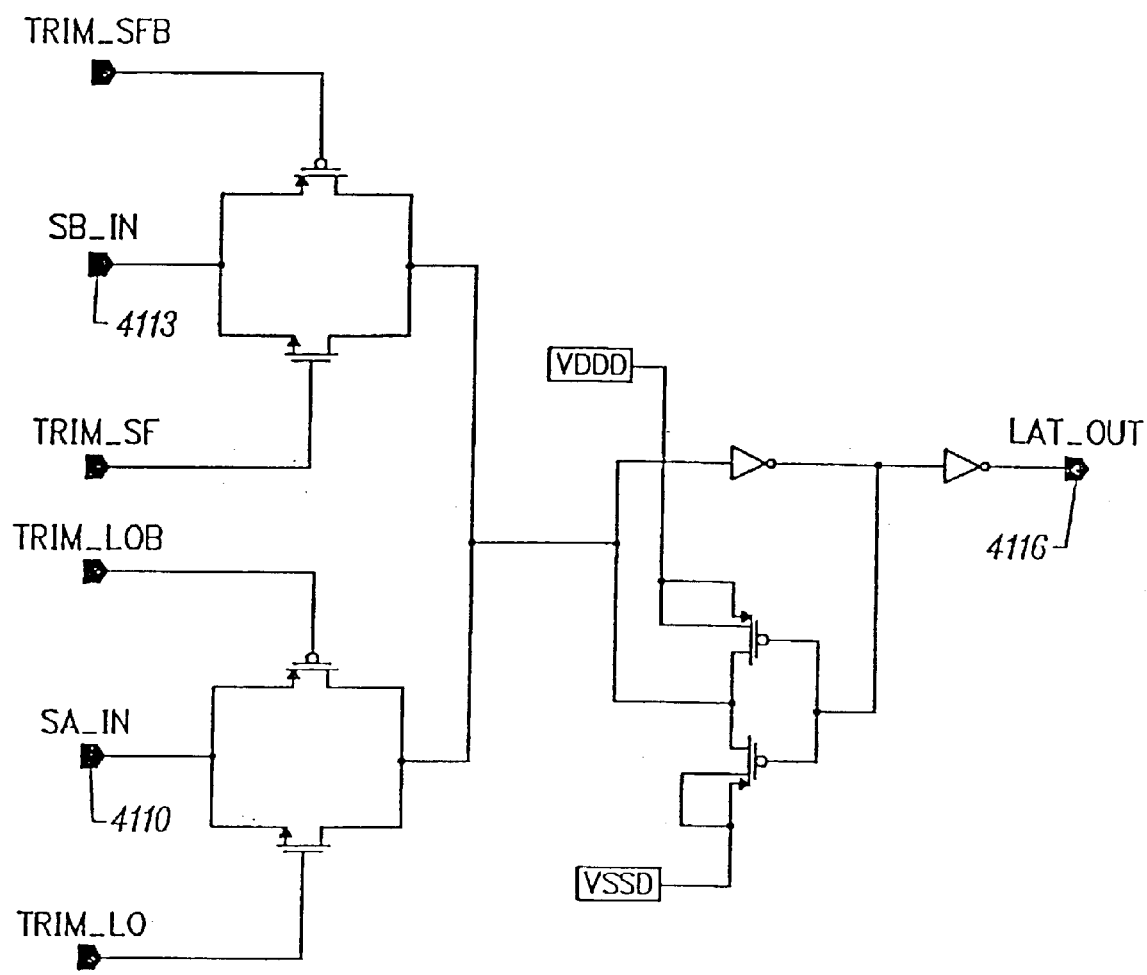
FIG. 54 shows a multiplexer circuit for a trim bit.

FIG. 54 shows multiplexer and latch circuitry for selectively coupling either the trim bit 4110 or user-selected data 4113 to the circuitry to which the trim bit adjusts the operation of via output 4116. The multiplexer circuit allows the circuitry to be adjusted using user-selected data instead of what is stored in the trim bit. Under some cases such as testing, it is desirable to "override" the trim bit with user data. In particular, a user may input user-selected data into a register, shift register, or other storage block. The user data may input in parallel or in serial, such as through the SPI interface. Then, by appropriately configuring the multiplexer, the user-selected data will be used for testing or evaluation of the circuitry on the integrated circuit instead of the trim bit.

This detailed description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This detailed description will enable others skilled in the art to best utilize and practice the invention in various embodiments and with various modifications as are suited to the particular use contemplated. The scope of the invention is defined by the following claims.

What is claimed is:

1. A memory system, comprising:
    a voltage level detect circuit connected to an external voltage input for receiving a voltage external to the memory system and provide an output based on the level of the external voltage;
    a first charge pump circuit connected to the external voltage input and the voltage level detect circuit, comprising a first plurality of stages to generate a first output voltage from the external voltage, wherein the number of stages of the first charge pump enabled to generate the first output voltage is based on said output based on the level of the external voltage;
    a memory comprising a plurality of non-volatile memory cells; and
    selection circuitry whereby said first output voltage may be selectively applied to said memory cells.

2. The memory system of claim 1, wherein said first output voltage is a programming voltage for the writing of data to said memory.

3. The memory system of claim 1, further comprising:
    a second charge pump circuit connected to the external voltage input and the voltage level detect circuit, comprising a second plurality of stages to generate a second output voltage from the external voltage, wherein the number of stages of the second charge pump enabled to generate the second output voltage is based on said output based on the level of the external voltage, and wherein said second output voltage may be selectively applied to said memory cells by the selection circuitry.

4. The memory system of claim 3, wherein said first output voltage is a programming voltage for the writing of data to said memory and wherein said second output voltage is a voltage used for the reading of data from said memory.

5. The memory system of claim 1, wherein said voltage level detect circuit further provides an indication in response to the external voltage being below a specified level.

6. A memory system, comprising:
    a memory comprising a plurality of memory cells;
    voltage supply circuitry connected to an external voltage input for receiving a voltage external to the memory system and derive a first output voltage therefrom, wherein the voltage supply circuitry configures itself in response to the level of the external voltage to supply the first output voltage having a level within a first predetermined voltage range; and
    selection circuitry whereby said output voltage may be selectively applied to said memory cells.

7. The memory system of claim 6, wherein said output voltage is a programming voltage for the writing of data to said memory.

8. The memory system of claim 6, wherein said memory cells are multi-state non-volatile memory cells.

9. The memory system of claim 6, wherein said memory cells are analog memory cells.

10. The memory system of claim 6, wherein said voltage supply circuitry is connected to further derive a second output voltage from the external voltage, wherein the voltage supply circuitry configures itself in response to the level of the external voltage to supply the second output voltage having a level within a second predetermined voltage range.

* * * * *